US008899248B2

(12) United States Patent
Collins et al.

(10) Patent No.: US 8,899,248 B2
(45) Date of Patent: *Dec. 2, 2014

(54) BARRIER STRUCTURE AND NOZZLE DEVICE FOR USE IN TOOLS USED TO PROCESS MICROELECTRONIC WORKPIECES WITH ONE OR MORE TREATMENT FLUIDS

(75) Inventors: Jimmy D. Collins, Allen, TX (US); Samuel A. Cooper, Carrollton, TX (US); James M. Eppes, Allen, TX (US); Alan D. Rose, Wylie, TX (US); Kader Mekias, Sachse, TX (US)

(73) Assignee: Tel FSI, Inc., Chaska, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/219,220

(22) Filed: Aug. 26, 2011
(Under 37 CFR 1.47)

(65) Prior Publication Data
US 2011/0308647 A1 Dec. 22, 2011

Related U.S. Application Data

(60) Continuation of application No. 12/217,883, filed on Jul. 9, 2008, now Pat. No. 8,656,936, which is a division of application No. 11/376,996, filed on Mar. 15, 2006, now Pat. No. 8,544,483.

(60) Provisional application No. 60/667,263, filed on Apr. 1, 2005, provisional application No. 60/667,369, filed on Apr. 1, 2005.

(51) Int. Cl.
*B08B 3/12* (2006.01)
*H01L 21/67* (2006.01)

(52) U.S. Cl.
CPC .... *H01L 21/67017* (2013.01); *H01L 21/67051* (2013.01); *H01L 21/6708* (2013.01); *Y10S 134/902* (2013.01)
USPC .......................................... 134/198; 134/902

(58) Field of Classification Search
USPC .................................. 134/198, 199, 200, 902
See application file for complete search history.

(56) References Cited

U.S. PATENT DOCUMENTS 3,836,329 A 9/1974 Jordan
3,990,462 A 11/1976 Elftmann et al.
(Continued)

FOREIGN PATENT DOCUMENTS

CN 1 723 542 1/2006
EP 1 204 139 5/2002
(Continued)

OTHER PUBLICATIONS

Machine Translation of Hirano, JP 2004-265912A, Sep. 2004.*
(Continued)

*Primary Examiner* — David Cormier
(74) *Attorney, Agent, or Firm* — Kagan Binder, PLLC

(57) ABSTRACT

Apparatuses, and related methods, for processing a workpiece that include a particular barrier structure that can overlie and cover a workpiece. Apparatuses, and related methods, for processing a workpiece that include a particular movable member that can be positioned over and moved relative to a workpiece. Apparatuses, and related methods, for processing a workpiece that include a particular ceiling structure that can overlie a processing chamber. Nozzle devices, and related methods, that include a particular annular body. Nozzle devices, and related methods, that include a particular first, second, and third nozzle structure.

17 Claims, 43 Drawing Sheets

(56) References Cited

U.S. PATENT DOCUMENTS

| | | |
|---|---|---|
| 4,544,446 A | 10/1985 | Cady |
| 4,609,575 A | 9/1986 | Burkman |
| 4,639,270 A | 1/1987 | Ando et al. |
| 4,682,615 A | 7/1987 | Burkman et al. |
| 4,801,335 A | 1/1989 | Burkman et al. |
| 4,903,717 A | 2/1990 | Sumnitsch |
| 5,020,323 A | 6/1991 | Hürlimann |
| 5,246,526 A | 9/1993 | Yamaguchi et al. |
| 5,271,774 A | 12/1993 | Leenaars et al. |
| 5,395,649 A | 3/1995 | Ikeda |
| 5,453,132 A | 9/1995 | Kowalchuk |
| 5,472,502 A | 12/1995 | Batchelder |
| 5,513,668 A | 5/1996 | Sumnitsch |
| 5,571,560 A | 11/1996 | Lin |
| 5,688,322 A | 11/1997 | Motoda et al. |
| 5,765,072 A | 6/1998 | Ohtani et al. |
| 5,783,025 A | 7/1998 | Hwang et al. |
| 5,785,068 A | 7/1998 | Sasaki et al. |
| 5,873,380 A | 2/1999 | Kanno |
| 5,900,059 A | 5/1999 | Shimanuki et al. |
| 5,916,366 A | 6/1999 | Ueyama et al. |
| 5,927,303 A | 7/1999 | Miya et al. |
| 5,976,256 A | 11/1999 | Kawano |
| 6,048,409 A | 4/2000 | Kanno et al. |
| 6,051,371 A | 4/2000 | Mita et al. |
| 6,065,424 A | 5/2000 | Shacham-Diamand et al. |
| 6,090,205 A | 7/2000 | Sakai et al. |
| 6,096,233 A | 8/2000 | Taniyama et al. |
| 6,129,546 A | 10/2000 | Sada |
| 6,139,636 A * | 10/2000 | Huang et al. ............... 118/320 |
| 6,149,759 A | 11/2000 | Guggenberger |
| 6,193,798 B1 | 2/2001 | Sumnitsch |
| 6,221,781 B1 | 4/2001 | Siefering et al. |
| 6,230,722 B1 * | 5/2001 | Mitsumori et al. ........ 134/122 R |
| 6,239,038 B1 | 5/2001 | Wen |
| 6,243,966 B1 | 6/2001 | Lubomirsky et al. |
| 6,247,479 B1 | 6/2001 | Taniyama et al. |
| 6,260,562 B1 | 7/2001 | Morinishi et al. |
| 6,273,104 B1 * | 8/2001 | Shinbara et al. ............ 134/25.4 |
| 6,299,804 B1 | 10/2001 | Domodossola et al. |
| 6,332,470 B1 | 12/2001 | Fishkin et al. |
| 6,385,863 B1 | 5/2002 | Kruwinus |
| 6,398,975 B1 | 6/2002 | Mertens et al. |
| 6,431,184 B1 | 8/2002 | Taniyama |
| 6,435,200 B1 | 8/2002 | Langen |
| 6,473,933 B1 | 11/2002 | Paterson et al. |
| 6,488,040 B1 | 12/2002 | de Larios et al. |
| 6,491,764 B2 | 12/2002 | Mertens et al. |
| 6,494,221 B1 | 12/2002 | Sellmer et al. |
| 6,536,454 B2 | 3/2003 | Lindner |
| 6,589,338 B1 | 7/2003 | Nakamori et al. |
| 6,589,361 B2 | 7/2003 | Luscher et al. |
| 6,594,847 B1 | 7/2003 | Krusell et al. |
| 6,672,318 B1 | 1/2004 | Tsuchiya et al. |
| 6,680,253 B2 | 1/2004 | Wirth et al. |
| 6,688,784 B1 | 2/2004 | Templeton |
| 6,694,224 B2 | 2/2004 | Ramanan |
| 6,705,331 B2 | 3/2004 | Sato et al. |
| 6,737,104 B2 | 5/2004 | Suzuki et al. |
| 6,776,359 B2 | 8/2004 | Cole et al. |
| 6,810,888 B2 | 11/2004 | Tsuchiya et al. |
| 6,826,910 B1 | 12/2004 | Easton |
| 6,834,440 B2 | 12/2004 | Lee |
| 6,863,229 B1 | 3/2005 | Leisi |
| 6,874,516 B2 | 4/2005 | Matsuno et al. |
| 6,896,466 B2 | 5/2005 | Nishimura et al. |
| 6,901,938 B2 | 6/2005 | Sato et al. |
| 6,913,651 B2 | 7/2005 | Ivanov et al. |
| 6,939,807 B2 | 9/2005 | Yun et al. |
| 7,022,193 B2 | 4/2006 | Jeong et al. |
| 7,051,743 B2 | 5/2006 | Kim et al. |
| 7,089,076 B2 | 8/2006 | Geismar et al. |
| 7,171,973 B2 | 2/2007 | Orii et al. |
| 7,275,553 B2 | 10/2007 | Orii et al. |
| 7,306,002 B2 | 12/2007 | Kim et al. |
| 7,309,847 B2 | 12/2007 | Cao |
| 7,323,080 B2 | 1/2008 | Kim et al. |
| 7,332,055 B2 | 2/2008 | Orii et al. |
| 7,364,625 B2 | 4/2008 | Christenson et al. |
| 7,383,843 B2 | 6/2008 | Ravkin et al. |
| 7,387,131 B2 | 6/2008 | Kuroda et al. |
| 7,389,783 B2 | 6/2008 | Woods et al. |
| 7,390,365 B2 | 6/2008 | Itoh et al. |
| 7,404,407 B2 | 7/2008 | Orii et al. |
| 7,422,641 B2 | 9/2008 | Nakajima et al. |
| 7,436,486 B2 | 10/2008 | Hirukawa |
| 7,476,616 B2 | 1/2009 | Christenson |
| 7,531,039 B2 | 5/2009 | Sato et al. |
| 7,543,593 B2 | 6/2009 | Orii et al. |
| 7,584,760 B2 | 9/2009 | Miya et al. |
| 7,639,343 B2 | 12/2009 | Hirukawa |
| 7,681,581 B2 | 3/2010 | Rose et al. |
| 7,712,475 B2 | 5/2010 | Fukuda et al. |
| 7,827,930 B2 | 11/2010 | Lubomirsky et al. |
| 7,913,706 B2 | 3/2011 | DeKraker et al. |
| 2002/0029788 A1 | 3/2002 | Verhaverbeke et al. |
| 2002/0059947 A1 * | 5/2002 | Sato et al. .................. 134/102.1 |
| 2002/0063169 A1 | 5/2002 | Verhaverbeke et al. |
| 2003/0051366 A1 | 3/2003 | Ise et al. |
| 2003/0070695 A1 | 4/2003 | Emami et al. |
| 2003/0084925 A1 | 5/2003 | Nakajima et al. |
| 2003/0155325 A1 | 8/2003 | Mansour et al. |
| 2003/0170988 A1 | 9/2003 | Izumi et al. |
| 2003/0226577 A1 | 12/2003 | Orll et al. |
| 2004/0003778 A1 | 1/2004 | Hayashi |
| 2004/0062874 A1 | 4/2004 | Kim et al. |
| 2004/0123484 A1 | 7/2004 | Yoshikawa et al. |
| 2004/0226655 A1 | 11/2004 | Kajino et al. |
| 2004/0261817 A1 | 12/2004 | Araki et al. |
| 2005/0183750 A1 | 8/2005 | Matsuno et al. |
| 2005/0244579 A1 | 11/2005 | Matsuzawa et al. |
| 2005/0268856 A1 | 12/2005 | Miller et al. |
| 2006/0060136 A1 | 3/2006 | Kisakibaru et al. |
| 2006/0219258 A1 | 10/2006 | Gast |
| 2006/0260647 A1 | 11/2006 | Verhaverbeke et al. |
| 2007/0105380 A1 | 5/2007 | Orii et al. |
| 2007/0227566 A1 | 10/2007 | Miya |
| 2007/0245954 A1 | 10/2007 | Collins et al. |
| 2008/0006303 A1 | 1/2008 | Butterbaugh et al. |
| 2008/0008834 A1 | 1/2008 | Collins et al. |
| 2008/0210278 A1 | 9/2008 | Orii et al. |
| 2008/0213076 A1 | 9/2008 | Hanson et al. |
| 2008/0271763 A1 | 11/2008 | Collins et al. |
| 2008/0283090 A1 | 11/2008 | DeKraker et al. |
| 2009/0015807 A1 | 1/2009 | Hirukawa et al. |
| 2009/0280235 A1 | 11/2009 | Lauerhaas et al. |
| 2012/0272893 A1 | 11/2012 | Lauerhaas et al. |
| 2013/0032172 A1 | 2/2013 | Collins et al. |
| 2013/0032182 A1 | 2/2013 | Collins et al. |
| 2013/0037511 A1 | 2/2013 | Collins et al. |
| 2013/0213485 A1 | 8/2013 | Lauerhaas et al. |

FOREIGN PATENT DOCUMENTS

| | | |
|---|---|---|
| EP | 1 335 412 | 8/2003 |
| EP | 1 708 252 | 10/2006 |
| FR | 2 747 117 | 10/1997 |
| JP | 60 5530 | 1/1985 |
| JP | 61-1699 | 8/1986 |
| JP | 63 73626 | 4/1988 |
| JP | 8 139065 | 5/1996 |
| JP | 2555034 | 11/1996 |
| JP | 09 314019 | 12/1997 |
| JP | 10 163154 | 6/1998 |
| JP | 10-199852 | 7/1998 |
| JP | 11-008213 | 1/1999 |
| JP | 11054472 | 2/1999 |
| JP | 11-087294 | 3/1999 |
| JP | 2000 124181 | 4/2000 |
| JP | 2001 015481 | 1/2001 |
| JP | 2001-189260 | 7/2001 |
| JP | 2001 267278 | 9/2001 |
| JP | 2002 246358 | 8/2002 |
| JP | 2002 343711 | 11/2002 |

(56) References Cited

FOREIGN PATENT DOCUMENTS

| | | |
|---|---|---|
| JP | 2002-359220 | 12/2002 |
| JP | 2003 109935 | 4/2003 |
| JP | 2004 31400 | 1/2004 |
| JP | 2004 153078 | 5/2004 |
| JP | 2004 265911 | 9/2004 |
| JP | 2004-265911 | 9/2004 |
| JP | 2004265912 A * | 9/2004 |
| JP | 2005 039205 | 2/2005 |
| JP | 2005-167089 | 6/2005 |
| JP | 2005 235945 | 9/2005 |
| JP | 2005-311355 | 11/2005 |
| JP | 2005-340381 | 12/2005 |
| JP | 2005-353739 | 12/2005 |
| JP | 2006-5315 | 1/2006 |
| JP | 2006 80403 | 3/2006 |
| JP | 2006-086474 | 3/2006 |
| TW | 406216 | 9/2000 |
| WO | WO 02/04134 | 1/2002 |
| WO | WO 03/030228 | 4/2003 |
| WO | WO 2004/001828 | 12/2003 |
| WO | WO 2004/070807 | 8/2004 |
| WO | WO 2004/093166 | 10/2004 |
| WO | WO 2006/107549 | 10/2006 |
| WO | WO 2006/107550 | 10/2006 |
| WO | WO 2008/029848 | 3/2008 |

OTHER PUBLICATIONS

Lim, Jung-Soo, "The 6th Surface Cleaning Users Group Meeting, Cleaning Technology Symposium," handout, Sep. 19, 2007 (9 pages).

Adjustable Flow Air Amplifiers, http://www.airtxinternational.com/catalog/air_amplifiers.php?gclid=CMHsm_ix551CFQE . . . (3 pages).

Air Amplifier—Nex Flow™, http://www.process-controls.com/techsales/Nex_Flow/air_amplifier.htm (3 pages).

* cited by examiner

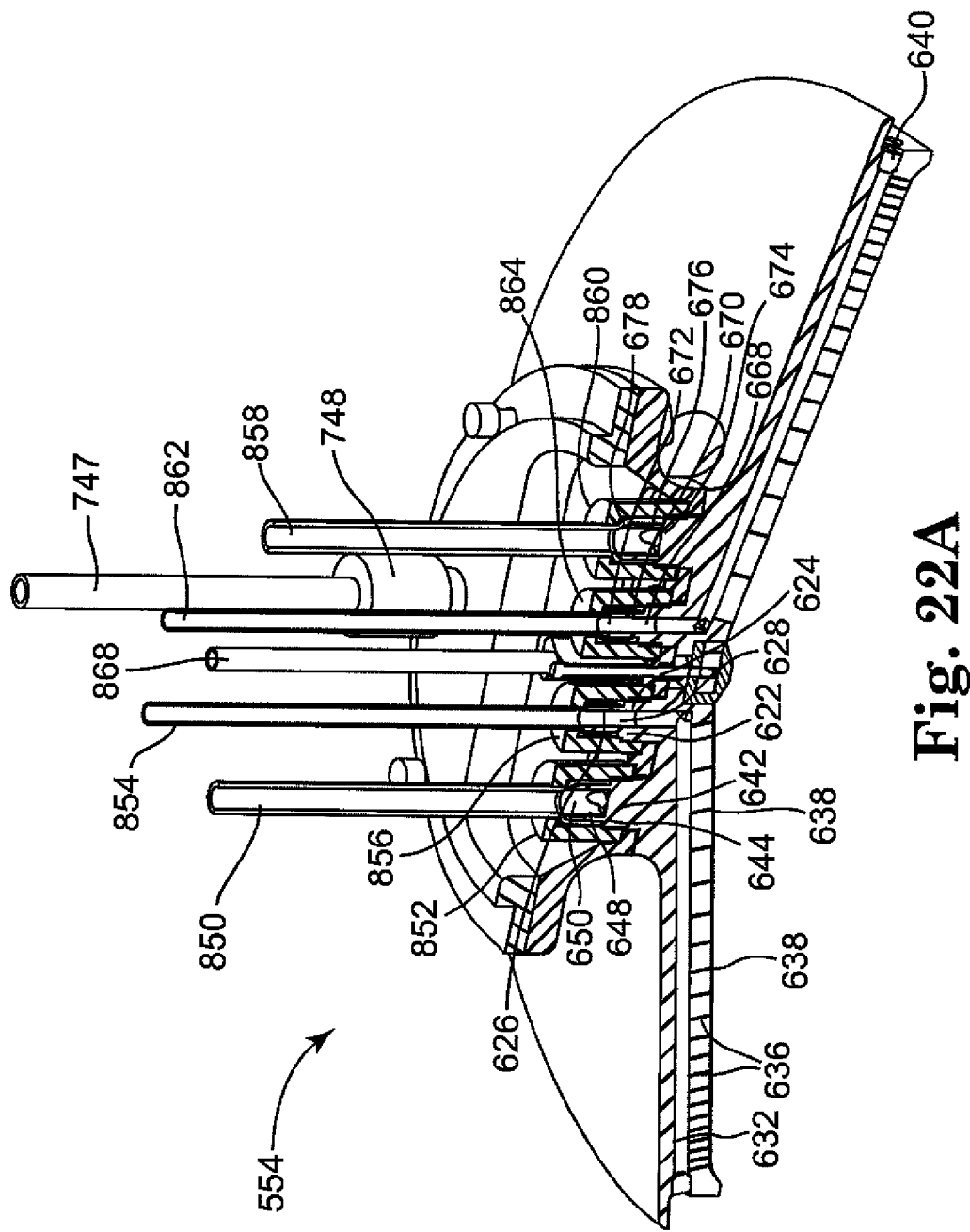

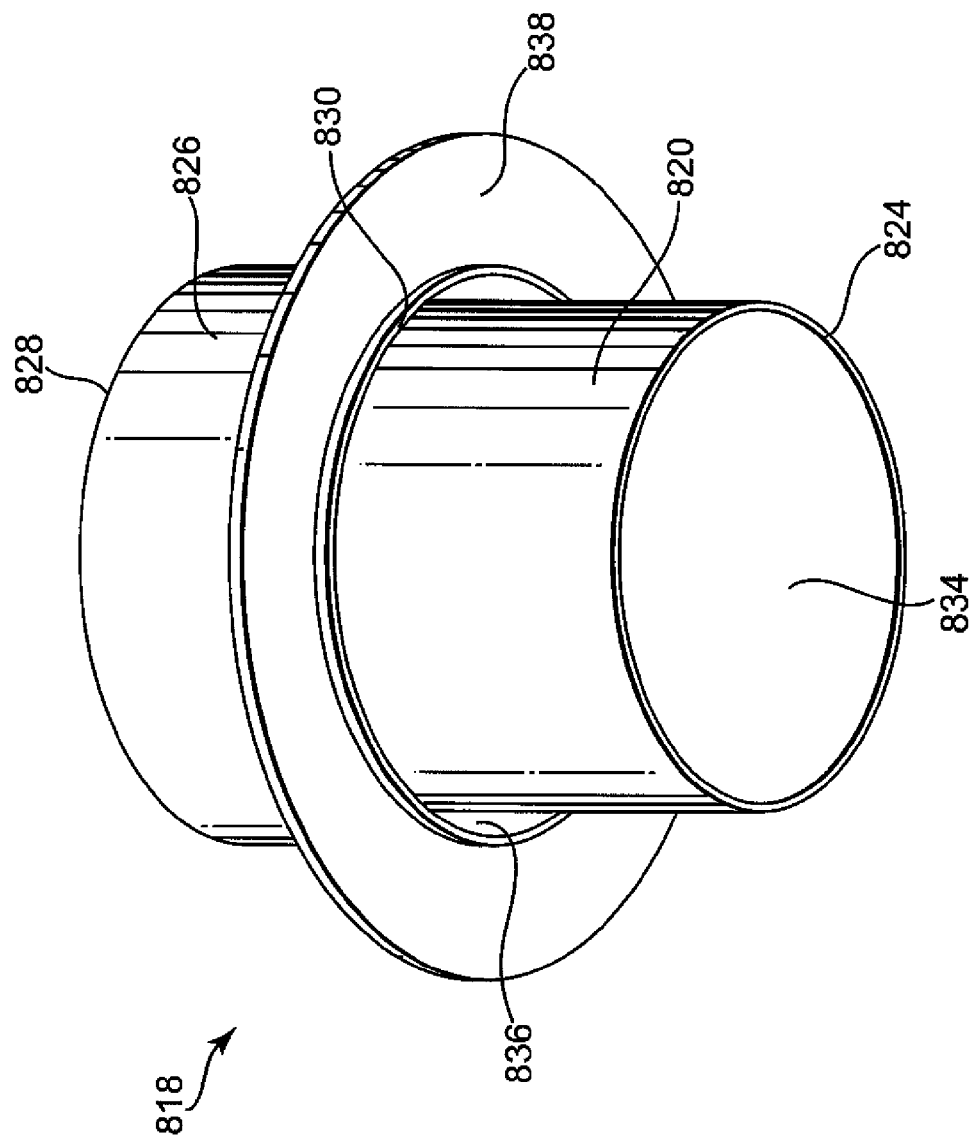

BARRIER STRUCTURE AND NOZZLE DEVICE FOR USE IN TOOLS USED TO PROCESS MICROELECTRONIC WORKPIECES WITH ONE OR MORE TREATMENT FLUIDS

PRIORITY CLAIM

This application is a continuation of patent application Ser. No. 12/217,883, filed Jul. 9, 2008 now U.S. Pat. No. 8,656, 936, now U.S. Publication No. 2008-0271763, and entitled BARRIER STRUCTURE AND NOZZLE DEVICE FOR USE IN TOOLS USED TO PROCESS MICROELECTRONIC WORKPIECES WITH ONE OR MORE TREATMENT FLUIDS, which is a divisional of patent application Ser. No. 11/376,996, filed Mar. 15, 2006 now U.S. Pat. No. 8,544,483, now U.S. publication No. 2007-0245954-A1, and entitled BARRIER STRUCTURE AND NOZZLE DEVICE FOR USE IN TOOLS USED TO PROCESS MICROELECTRONIC WORKPIECES WITH ONE OR MORE TREATMENT FLUIDS, wherein the respective entireties of said nonprovisional applications are incorporated herein by reference and wherein said nonprovisional applications claim priority under 35 USC §119(e) from United States Provisional Patent Applications having Ser. No. 60/667,263, filed on Apr. 1, 2005, by Collins et al. and titled COMPACT DUCT SYSTEM INCORPORATING MOVEABLE AND NESTABLE BAFFLES FOR USE IN TOOLS USED TO PROCESS MICROELECTRONIC WORKPIECES WITH ONE OR MORE TREATMENT FLUIDS and Ser. No. 60/667,369, filed on Apr. 1, 2005, by Rose et al. and titled COMPACT DUCT SYSTEM INCORPORATING MOVEABLE AND NESTABLE BAFFLES FOR USE IN TOOLS USED TO PROCESS MICROELECTRONIC WORKPIECES WITH ONE OR MORE TREATMENT FLUIDS, wherein the respective entireties of said provisional patent applications are incorporated herein by reference.

FIELD OF THE INVENTION

The present invention relates to barrier plates and dispense assemblies for tools used to process microelectronic substrates with one or more treatment fluids, including liquids and gases. More particularly, the present invention relates to such tools that include movable and nestable baffle members that that can be positioned to open and close, and help define the boundaries of, one or more ducts for collecting and recovering the treatment fluids that are used.

BACKGROUND OF THE INVENTION

The microelectronic industry relies on a variety of different processes to manufacture microelectronic devices. Many processes involve a sequence of treatments in which different kinds of treatments fluids are caused to contact the workpiece in accordance with desired recipes. These fluids may be liquids, gases, or combinations thereof. In some treatments, solids may be suspended or dissolved in a liquid or entrained in a gas. It is highly desirable to capture and recover these treatment fluids for a variety of reasons including proper disposal, recycling, fume containment, process monitoring, process control, or other handling.

One capture technique involves using appropriately positioned ducts to capture treatment fluids. For instance, a typical manufacturing tool in the microelectronics industry involves supporting one or more workpieces in a processing chamber on a suitable support, such as a stationary platen, rotating turntable, or rotatable chuck. One or more ducts are positioned at least partially around the outer periphery of the support. As a treatment fluid is introduced into the processing chamber, an exhaust can be used to help pull the treatment fluid into the one or more ducts. With respect to rotating supports, centrifugal force causes fluids on a spinning workpiece and/or support surface to flow radially outward from the spin axis and into the duct(s).

Conventionally, a tool may include a single duct to capture different treatment fluids. However, using a single duct like this is not desirable in all instances. For example, some treatment fluids may be too reactive in the presence of other treatment materials. Other times, it may be desirable to capture different fluids using different capture conditions. Still other times, such as when recycling is desired, it may be desirable to capture a fluid in a dedicated duct to avoid contamination with other fluids.

Accordingly, tools containing multiple, stacked ducts, fixed relative to each other, have been used. Either the workpiece support and/or the stacked ducts themselves are raised and lowered in order to bring the appropriate duct into position. This conventional approach suffers from serious drawbacks. The stacked ducts make high-density tool packaging more difficult. The different ducts may also be subject to cross-contamination because they are always open to the workpiece and/or exhaust levels are not individually controlled. Some conventional duct systems also may not have the capability to separate the liquid and gas constituents of an exhaust stream. In some tools in which the duct structures themselves are moveable, drain and exhaust connections to external plumbing must also move, thereby adding undue complexity to tool design, manufacture, use, and service.

There is a continuing need, therefore, in the microelectronics industry to provide compact tools that nonetheless incorporate multiple ducts for capturing different kinds of treatment fluids.

SUMMARY OF THE INVENTION

The present invention provides a novel duct system for use in tools in which microelectronic workpieces are treated with treatment fluids, including liquids, gases, fluidized solids, dispersions, combinations of these and the like. The ducts are used to capture the various treatment fluids for recycling, discarding, or other handling. Different treatment fluids can be recovered in different, independent ducts to minimize cross-contamination and/or to use unique capture protocols for different fluids.

The duct system of the present invention is extremely compact. The duct system is defined at least in part by moveable and nestable duct structures in which portions of duct pathways may exist between these structures and/or between these and other structures in the tool. For example, when the structures are moved apart relatively, a duct pathway opens and is enlarged between the structures. When the structures are moved together relatively, the duct between the structures is choked and is reduced in size. In preferred embodiments, multiple ducts can exist in the same volume of space depending upon how the moveable duct structures are positioned. Thus, multiple ducts can occupy a volume minimally larger than the volume occupied by only a single duct.

The moveable duct structures are preferably fluidly coupled to fixed duct structures so that drain and exhaust connections between the tool and external plumbing are fixed and need not move.

In one aspect, the present invention relates to an apparatus for processing a microelectronic workpiece. The apparatus includes a support on which the workpiece is positioned during a process. The apparatus also includes a plurality of moveable and nestable baffle members defining at least portions of a plurality of duct pathways having respective duct inlets proximal to an outer periphery of the workpiece.

In another aspect, the present invention relates to an apparatus for processing a microelectronics workpiece. The apparatus includes a rotatable support on which the workpiece is positioned during a process. The apparatus also includes a plurality of moveable baffle members defining at least a first duct pathway between the baffle members and having an inlet proximal to an outer periphery of the rotatable workpiece. Displacement of the baffle members relative to each other opens and chokes at least the first duct pathway.

In another aspect, the present invention relates to an apparatus for processing a microelectronic workpiece. The apparatus includes a housing and a rotatable support positioned in the housing and onto which the workpiece is positioned for processing. The apparatus includes a plurality of duct pathways having respective inlets proximal to an outer periphery of the rotatable workpiece. Each duct pathway is defined at least in part by structures comprising a plurality of fixed duct structures that are relatively distal from the rotatable workpiece and a plurality of independently moveable baffle members that are relatively proximal to the rotatable workpiece and that define duct pathway portions that are fluidly coupled to respective fixed duct structures.

In another aspect, the present invention relates to an apparatus for processing a microelectronic workpiece. The apparatus includes a processing chamber in which the workpiece is positioned during a process. A barrier structure overlies and covers the workpiece in a manner effective to help provide a tapering flow channel proximal to a major surface of the workpiece.

In another aspect, the present invention relates to a method of processing a microelectronic workpiece. The workpiece is positioned in a processing chamber. A barrier structure overlies and covers the workpiece in a manner effective to help provide a tapering flow channel proximal to a major surface of the workpiece that tapers in a radially outward direction relative to said surface. While the workpiece is positioned in the processing chamber and covered by the barrier structure, at least one processing material is caused to flowingly contact said major surface of the workpiece.

In another aspect, the present invention relates to an apparatus, comprising a processing chamber in which the workpiece is positioned during a process. A barrier structure overlies and covers the workpiece in a manner effective to help provide a tapering flow channel proximal to a major surface of the workpiece that tapers in a radially outward direction relative to said surface. The barrier structure is controllably moveable through a range of motion including a first position in which the processing chamber is sufficiently open to allow workpiece transfer to and from the processing chamber and a second position in which the barrier structure helps to guide at least one material flowing over said major surface.

In another aspect, the present invention relates to a nozzle device comprising an annular body having a lower surface that is angled so as to help define a tapering flow channel over a workpiece surface when the body is positioned over the workpiece surface. At least one nozzle is integrated with the annular body in a manner effective to dispense one or more processing materials downward onto the workpiece surface. The annular body includes one or more processing material supply conduits through which one or more processing materials are supplied to the at least one nozzle.

In another aspect, the present invention relates to a nozzle device comprising an annular body having a lower surface that is angled so as to help define a tapering flow channel over a workpiece surface when the annular body is positioned over the workpiece surface. The annular body comprises an inner periphery defining a central pathway that provides egress between a volume above the annular body and a volume below the annular body. An arm structure is coupled to the annular body and extends generally across the central pathway in a manner effective to help define first and second pathway portions. At least a first, independent array of nozzles is integrated with the annular body in a manner such that the first array extends at least partially along the arm structure and a first radius of the annular body in a manner effective to dispense one or more processing materials downward onto the workpiece surface. At least one independent nozzle is integrated into the central arm in a manner effective to dispense one or more processing materials downward onto a central portion of the workpiece. At least one independent nozzle is positioned to dispense one or more processing materials onto the workpiece from a flow path that extends through at least one of the central flow pathway portions.

In another aspect, the present invention relates to a nozzle device comprising a first nozzle structure through which one or more processing materials independently are atomizingly dispensed onto a workpiece surface across at least a portion of a radius of the workpiece surface; a second nozzle structure is provided through which one or more processing materials independently are dispensed onto a central portion of the workpiece surface; and a third nozzle structure through which one or more processing materials are independently introduced into a headspace above the workpiece surface. The first, second and third nozzle structures are moveable relative to the workpiece surface.

In another aspect, the present invention relates to an apparatus for processing a microelectronic workpiece. The apparatus includes a processing chamber in which the workpiece is positioned during a process and a moveable member comprising a tube portion having a through bore. The moveable member is positioned over the workpiece and is moveable relative to a major surface of the workpiece. At least one independent nozzle structure is physically coupled to the moveable member such that movement of the moveable member allows the relative spacing between the major surface of the workpiece and the nozzle structure to be controllably adjusted. At least a portion of at least one fluid supply pathway in the through bore of the tube portion is fluidly coupled to the at least one independent nozzle structure and workpiece.

In another aspect, the present invention relates to an apparatus for processing a microelectronic workpiece. The apparatus includes a processing chamber in which the workpiece is positioned during a process and a ceiling structure overlying the processing chamber in a manner effective to provide a first zone relatively distal from the processing chamber and a second zone relatively proximal to the processing chamber. The ceiling structure comprises a walled conduit providing egress between the first and second zones. A moveable member is housed in the walled conduit. The member comprises at least a tube portion having a first port to provide egress into the through bore from the first zone. The moveable member is moveable relative to the walled conduit and with respect to the workpiece. A nozzle structure is coupled to the moveable member in a manner such that the nozzle structure is positionable to dispense one or more processing materials into the processing chamber.

BRIEF DESCRIPTION OF THE DRAWINGS

FIG. 14.B is a close-up, cross-sectional view of a portion of the tool of FIG. 1 taken along line B-B that generally identifies the area around the inner baffle member.

FIG. 14.C is a close-up, cross-sectional view of a portion of the tool of FIG. 1 taken along line B-B that generally identifies the area around the middle baffle member.

FIG. 14.D is a close-up, cross-sectional view of a portion of the tool of FIG. 1 taken along line B-B that generally identifies the area around the outer baffle member.

FIG. 14.E is a close-up, cross-sectional view of a portion of the tool of FIG. 1 taken along line B-B that generally identifies exhaust plenums and drain basins.

FIG. 22.B is a cross-sectional, isometric view of the dispense assembly of FIG. 21 taken along line G-G that is similar to FIG. 22.A except for identifying additional reference characters.

FIG. 38 is an isometric view of the shutter used in the tool of FIG. 1.

DETAILED DESCRIPTION OF PRESENTLY PREFERRED EMBODIMENTS

Figure 1:
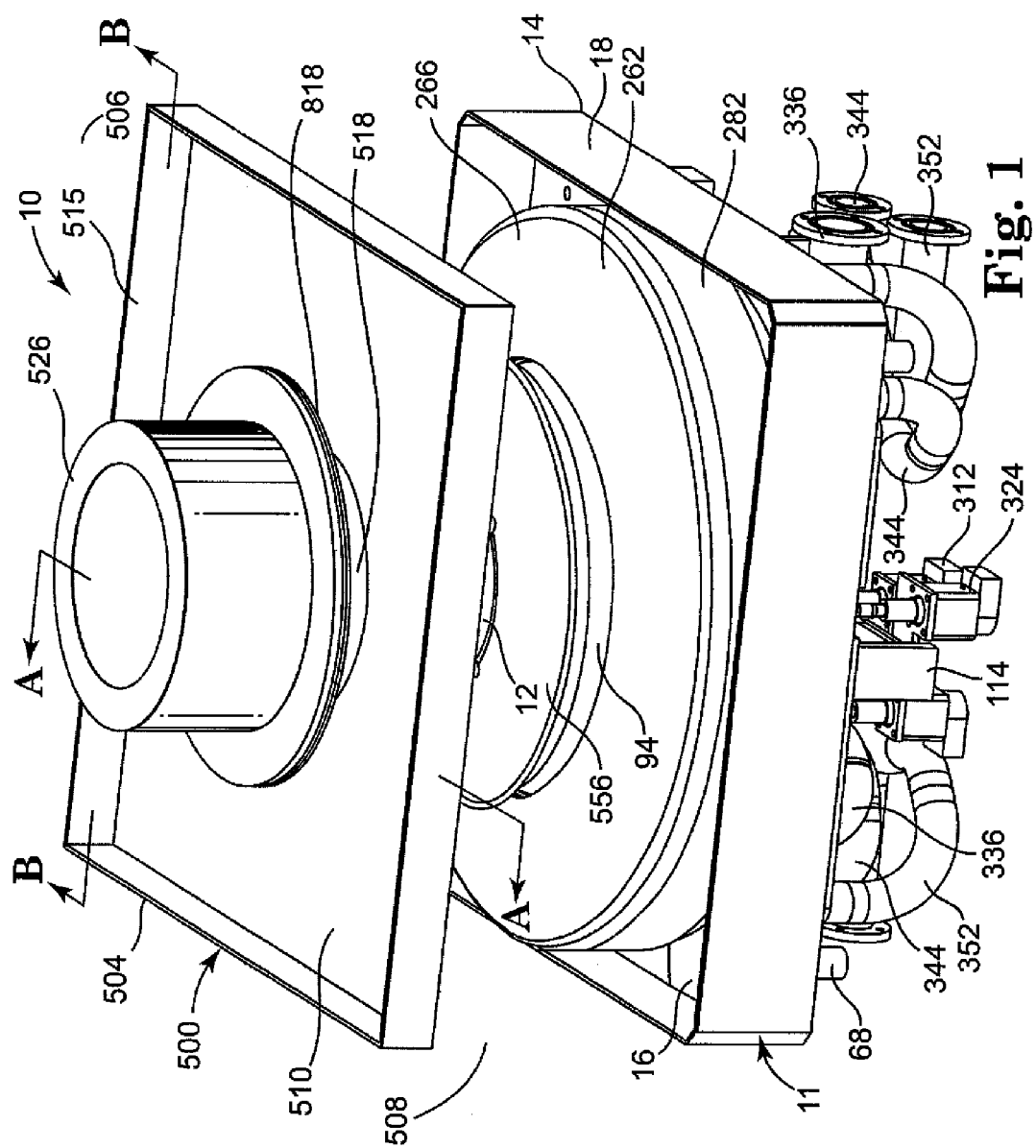
FIG. 1 shows an isometric view of a preferred tool embodiment of the present invention.

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention. While the present invention will be described in the specific context of fluid based microelectronic substrate cleaning systems, the principles of the invention are applicable to other microelectronic processing systems as well.

FIGS. 1 through 38 show an illustrative tool 10 that incorporates principles of the present invention. For purposes of illustration, tool 10 is of the type in which a single workpiece 12 is housed in the tool 10 at any one time and subjected to one or more treatments in which liquid(s) and/or gas(es) are caused to contact the workpiece 12. In the microelectronics industry, for instance, tool 10 may be referred to as a single wafer processing tool. Workpiece 12 is typically a semiconductor wafer or other microelectronic substrate.

Tool 10 generally includes as main assemblies processing section 11 and barrier dispense section 500. In actual use, the dispense section 500 and processing section 11 would be mounted to a framework (not shown) and enclosed within a housing (not shown) of tool 10. This mounting can occur in any manner such as via screws, bolts, rivets, adhesives, welds, clamps, brackets, combinations of these, or the like. Desirably, though, the sections 11 and 500 and/or components thereof are independent and removably mounted to facilitate service, maintenance, upgrade, and/or replacement.

Processing section 11 generally includes a base 14 formed at least in part by base pan 16 and peripheral sidewall 18. Base pan 16 and sidewalls 18 may be formed from parts that are screwed, bolted, glued, welded, or otherwise attached to each other. Alternatively, base pan 16 and sidewalls 18 may be integrally formed as one part as is shown.

In this particular preferred embodiment, three pairs of annular, generally concentric walls 22 and 23, 24 and 25, and 26 and 27 project upward from base pan 16. These walls help to define exhaust plenums 29, 30, and 31 and drain basins 52, 53, 54 and 55. The exhaust plenums 29, 30, and 31 and the drain basins 52, 53, and 54 form portions of three independent, nested exhaust duct pathways 330, 338, and 346 to be discussed further below. Of course, other representative embodiments of the invention may include a lesser or greater number of such ducts as desired in which case a lesser or greater number of exhaust plenums and drain basins would be provided, as appropriate.

Also in the embodiment of tool 10 as shown, the ducts 330, 338, and 346 preferably are independent and discrete from each other in that each such duct has its own exhaust plenum(s) and drain basin(s). Advantageously, this allows individual exhaust streams to be separately handled at the exhaust and/or other stage(s) of processing. This may be desirable for a variety of reasons. For instance, it may be desirable to recover liquid constituents of an exhaust stream for recycling. Use of a dedicated exhaust duct for such liquid constituents avoids cross-contamination with other streams. In other instances, it may be desirable to exhaust different streams under different conditions. The use of independent and discrete exhaust duct pathways thus is preferred in many instances. However, in other embodiments, especially where an even more compact design is desired, two or more exhaust ducts may share a drain basin and/or an exhaust plenum.

The top rims 33 and 34 of walls 22 and 23 define a generally annular exhaust inlet 35 by which an exhaust stream enters inner exhaust plenum 29. The bottom of exhaust plenum 29 includes one or more exhaust outlet ports 48 through which an exhaust stream exits inner exhaust plenum 29. In similar fashion, the top rims 38 and 39 of walls 24 and 25 define an annular exhaust inlet 40 by which an exhaust stream enters middle exhaust plenum 30. The floor of plenum 30 includes one or more exhaust outlet ports 49 through which an exhaust stream exits middle exhaust plenum 30. Also in similar fashion, the top rims 43 and 44 of walls 26 and 27 define an annular exhaust inlet 45 by which an exhaust stream enters outer exhaust plenum 31. The floor of plenum 31 includes one or more exhaust outlet ports 50 through which an exhaust stream exits outer exhaust plenum 31.

Each drain basin 52, 53, 54, and 55 respectively includes a floor 56, 57, 58, and 59. Each of floors 56, 57, 58, and 59 respectively includes one or more drain outlets such as outlets 63 and 67 through which collected liquid exits the corresponding drain basin. The floor 56 of inner drain basin 52 is appropriately sloped to direct collected liquid to drain outlet(s) 63. Floors 57, 58, and 59 may be sloped in a similar manner. The various drain outlets are fitted with drain couplings 62 or 68 to facilitate connection to suitable drain plumbing (not shown).

In the preferred embodiment as shown, a plurality of actuator shaft housings 69 including shaft bores 70 are positioned in inner exhaust plenum 29. These essentially subdivide inner exhaust plenum 29 into three sub-plenums. To facilitate uniform exhaust flow through the entirety of exhaust plenum, it is therefore desirable to provide one or more exhaust ports in each of such sub-plenums. Shaft housings 69 and bores 70 provide access for actuator shafts 314 to be coupled to and thereby control movement of inner baffle member 174 that operationally engages inner exhaust plenum 29. In similar fashion, actuator shaft housings 73 including shaft bores 72 are positioned in middle exhaust plenum 30 and provide access for actuator shafts (not shown) to be coupled to and thereby control movement of middle baffle member 218 that operationally engages middle exhaust plenum 30. Also in similar fashion, actuator shaft housings 75 including shaft bores 76 are positioned in outer exhaust plenum 31 and provide access for actuator shafts 326 to be coupled to and thereby control movement of outer baffle member 262 that operationally engages outer exhaust plenum 31.

The central area of base pan 16 includes central through bore 78. Central through bore 78 preferably is generally circular in cross-section as shown but could also be provided with other geometries as desired. Cylindrical inner flange 80 projects upward from base pan 16 and helps to define cylindrical inner sidewall 82 and outer sidewall 84. Outer sidewall 84 includes shoulder 90 at its top rim, and inner sidewall 82 includes a shoulder 92 at its lower rim.

Inside processing chamber 503, workpiece 12 is supported and held by chuck 94. Chuck 94 is generally cylindrical in shape and includes an upper face 96, lower face 98, annular base 100, central through bore 102, sidewall 104 at the outer periphery, and annular splash shield 108. Chuck 94 may be stationary or it may be rotatable about a central axis 106. For purposes of illustration, the figures illustrate an embodiment of tool 10 in which chuck 94 is rotatably driven by motor 110 so that workpiece 12 may be spun about axis 106 during a treatment. In those embodiments in which workpiece 12 is spun by a rotating chuck 94, the spinning helps to spread dispensed treatment materials uniformly over the workpiece 12. Motor 110 may be of the hollow shaft type having central bore 112 and is mounted to tool 10 by any convenient approach such as by mounting structures 114.

Annular splash shield 108 extends downward from lower face 98 of chuck 94. Lower end 109 of shield 108 is nested in shoulder 90 of inner flange 80 and helps to prevent liquids from splashing over inner flange 80 and then into central through bore 78. In embodiments in which chuck 94 is rotatable, there is a gap between shield 108 and the walls of shoulder 90 to avoid having the shield 108 and shoulder walls rub against each other, which could generate undesirable debris as the chuck 94 rotates.

Chuck 94 may secure workpiece 12 in any of a variety of different ways in accordance with conventional practices now or hereafter developed. Preferably, chuck 94 includes edge gripping structures (not shown) that securely hold workpiece 12 above upper face 96 of chuck 94 such that there is a gap between workpiece 12 and the upper face 96. Thus, treatment chemicals, including rinse water, may be dispensed onto either upper face 128 or lower face 130 of workpiece 12.

Optionally, tool 10 may include dispense structure(s) for treating the lower face 130 of workpiece 12. An illustrative backside dispense mechanism is shown as a generally circular dispense head 136 in which one or more treatment chemicals may be dispensed toward lower face 130 of workpiece 12 through a plurality of nozzle orifices (not shown). Treatment chemicals are supplied to backside dispense head 136 via shaft 138 that passes through central bore 102 of chuck 94 and central bore 112 of motor 110. In embodiments in which chuck 94 rotates, there are gaps in between shaft 138, and central bores 102 and 112 so that the parts do not rub as the chuck 94 rotates. The backside dispense head 136 may be coupled to one or more supplies (not shown) of treatment materials to be dispensed as supplied or blended on demand.

Annular drip ring 156 is fitted to base pan 16 proximal to inner flange 80. Drip ring 156 generally includes floor 158, inner wall 160, middle wall 162, curved top rim 164, and outer wall 166. Floor 158 cants downward to generally match the slope of and fit against floor 56 in drain basin 52. Inner wall 160 of drip ring 156 is fitted against lower sidewall portion 86 of inner flange 80. Middle wall 162 jogs outward so that there is a gap between middle wall 162 and the sidewall 104 of chuck 94. Curved top rim 164 provides a smooth transition between middle wall 162 and outer wall 166. This helps promote a smooth flow when an exhaust stream flows over drip ring 156 and into one or more open ducts to be described further below. Curved top rim 164 in this embodiment projects slightly above the upper face 96 of chuck 94. In this way, some liquid spun outward from chuck 94 and/or workpiece 12 is caught in catch basin 170 formed by drip ring 156. Drain ports 172 are provided in the lower portion of drip ring 156 formed by floor 158 and middle wall 162 to allow liquid collected in catch basin 170 to drain into drain basin 52.

Tool 10 further includes a plurality of moveable and nestable baffle members 174, 218, and 262 generally corresponding to the number of exhaust plenums 29, 30, and 31 in this particular preferred embodiment. The baffle members 174, 218, and 262 advantageously can be moved independently relative to each other to selectively and controllably open and/or choke one or more exhaust ducts into which exhaust streams may flow radially outward from workpiece 12 and/or chuck 94. The baffle members 174, 218, and 262 further define at least a portion of the boundaries of such one or more exhaust ducts and thus help guide exhaust streams flowing through the duct(s). The ability of the baffle members 174, 218, and 262 to both move and nest together as desired allows tool 10 to be more compact in that the portions of multiple ducts whose boundaries are at least in part defined by these baffle members can occupy very nearly the same volume in space as only a single duct. Compactness is important for a variety of reasons, including lower required stack height, easier packaging, lesser tool dimensions, and the like.

Inner baffle member 174 generally includes annular baffle plate 176 and annular baffle hood 194. Although plate 176 and hood 194 can be formed as a single, unitary part, it is preferred that these be separate parts that are fastened or otherwise secured together to ease assembly, maintenance, and service of tool 10. Annular baffle plate 176 has upper surface 178, lower surface 180, inner rim 182 proximal to the outer periphery of chuck 94, outer sidewall flange 186, and inner sidewall flange 190. The surfaces among the components of annular baffle plate 176 are connected by smooth transitions to promote smooth exhaust flows over and/or under inner baffle member 174. The double wall structure provided by outer sidewall flange 186 and inner sidewall flange 190 provides multiple functions. As one function, these flanges 186 and 190 provide a secure, rigid way to secure annular baffle plate 176 to corresponding annular baffle hood 194. For any of the baffle members 174, 218, or 262, the respective baffle plate may be attached to the corresponding hood in any desired manner. Preferred approaches are non-permanent so that the parts can be easily separated and replaced after service and maintenance. Using both flanges 186 and 190 also makes it easier to define smooth flow pathways both above and below inner baffle member 174, as desired.

Annular baffle hood 194 fits over and enshrouds exhaust inlet 35 of exhaust plenum 29. Inner baffle member 174 is translatable up and down so that corresponding movement of hood 194 up and down opens and chokes, to the desired degree, the exhaust inlet 35. Additionally, hood 194 includes structure that helps provide drain trap functionality in drain basin 52. This helps to separate liquid and gas constituents of exhaust streams that flow through drain basin 52. Such separated constituents may be independently recovered for disposal, recycling, further reaction, or other handling as desired. As an additional function, hood 194 helps to fluidly couple exhaust plenum 29 with a portion of the duct pathway whose boundaries are further defined at, least in part by the lower surface 180 of annular baffle plate 176.

In more detail, annular baffle hood 194 includes cap plate 196, inner flange 198, outer flange 206, lower end 202, and inner surface 204. Cap plate 196 is generally positioned over exhaust inlet 35 and helps to define a headspace 208 over exhaust inlet 35. As inner baffle member 174 is lowered, the volume of headspace 208 is reduced as cap plate approaches and thereby chokes flow entering exhaust inlet 35. Inner baffle member 174 desirably can be lowered far enough so that cap plate 196 seats against and closes exhaust inlet 35. As inner baffle member 174 is raised, the volume of headspace 208 over exhaust inlet 35 is increased as cap plate 196 moves away from and thereby increases flow access to exhaust inlet 35.

Inner flange 198 is spaced apart from annular wall 22 to provide a flow channel 200 fluidly coupling drain basin 52 to headspace 208. The lower end of inner flange 198 extends below rims 33 and 34 that help define exhaust inlet 35 to exhaust plenum 29. In this way, inner flange 198 forms a barrier that blocks exhaust streams that enter the drain basin 52 from flowing directly into exhaust plenum 29. Instead, such a stream must flow downward toward floor 56, around the lower end of inner flange 198, and then upward through the flow channel 200 before gaining access to exhaust inlet 35 via headspace 208. Thus, the positioning and configuration of inner flange 198 helps provide trap functionality within drain basin 52. Liquid constituents in an exhaust stream flowing through drain basin 52 will have a relatively greater tendency to collect within drain basin 52, while gaseous constituents will have a relatively greater tendency to flow through drain basin 52 and into exhaust plenum 29.

To help promote this trap functionality, the inner surface of inner flange 198 is provided with surface features that help promote condensation or other collection of liquid upon the inner surface. The liquid collected in this way then drips or otherwise flows downward to floor 56, where the liquid can be recovered via drain port(s) 63 for further handling. Preferred surface features as shown include an array of triangular protuberances 210. Each triangular protuberance 210 is oriented so that its apex 212 is upward (facing the incoming exhaust flow) while the base 214 is downward (away from the incoming flow). The relatively sharp apex 212 confronting the incoming exhaust flow is believed to enhance liquid collection. Generally, using a greater number of these protuberances 210 is desired to facilitate liquid trapping. However, the density of these features on the inner flange 198 is such that the bases 214 of the triangular protuberances 210 are spaced apart sufficiently so that liquid collected on the sides of the protuberances can readily drip or flow downward to floor 56.

Outer flange 206 extends downward and is sufficiently close to annular wall 23 to substantially prevent exhaust from flowing between outer flange 206 and annular wall 23. To minimize the risk of generating debris due to rubbing contact, there preferably is a small gap between annular wall 23 and outer flange 206. When an exhaust is being pulled through exhaust plenum 29, this close gap spacing provides a sufficiently high resistance to flow such that substantially all the exhaust will be pulled through plenum 29.

Middle baffle member 218 is similar to inner baffle member 174 and includes annular baffle plate 220 and annular baffle hood 238. Annular baffle plate 220 includes upper surface 222, lower surface 224, inner rim 226, outer surface 230, and inner flange 234. Annular baffle hood 238 includes cap plate 240 helping to define headspace 252, inner flange 242 helping to define a flow path through flow channel 244 and having lower end 246 and inner surface 248, outer flange 250, and triangular protuberances 254 having apexes 256 and bases 258. Hood 238 of middle baffle member 218 operationally enshrouds middle exhaust plenum 30 and helps to provide trap functionality within middle drain basin 53. Additionally, inner baffle member 174 and/or middle baffle member 218 are moveable so that inner baffle member 174 may nest within middle baffle member 218 and thereby variably choke, shut off, or otherwise restrict the flow of a material between the two. Alternatively, the two baffle members 174 and 218 can be separated to variably open a flow path between the two.

Outer baffle member 262 is similar to inner baffle member 174 and middle baffle member 218 and includes annular baffle plate 264 and annular baffle hood 282. Annular baffle plate 264 includes upper surface 266, lower surface 268, inner rim 270, outer flange 274, and inner flange 278. Annular baffle hood 282 includes cap plate 284 helping to define headspace 296, inner flange 286 helping to define a flow channel 288 and having lower end 290 and inner surface 292, outer flange 294, and triangular protuberances 298 having apexes 300 and bases 302. Hood 282 of outer baffle member 262 operationally enshrouds outer exhaust plenum 31 and helps to provide trap functionality within outer drain basin 54. Additionally, outer baffle member 262 is moveable relative to inner baffle member 174 and/or middle baffle member 218 so that middle baffle member 218 may nest within outer baffle member 262 and thereby variably choke, shut off, or otherwise restrict the flow of a material between the two. Alternatively, the two baffle members 218 and 262 can be separated to variably open a flow path between the two.

Tool 10 includes actuating mechanism(s) that independently actuate one or more of baffle members 174, 218, and/or 262 to allow these barriers to be controllably and variably moved and nested relative to each other. Preferred actuating mechanisms for moving baffle members 174 and 262 are shown in the Figures. The actuating mechanisms for middle baffle member 218 would be similar. With respect to inner baffle member 174, inner baffle actuating motors 312 (motors 318 are used for middle baffle member 218) are coupled to corresponding shafts 314 at one end and inner baffle member 174 at the other. The shafts 314 are housed and move up and down within bores 70 of housings 69. Seals 316 help prevent leaking at these egress areas. Thus, inner baffle member 174 may be moved independently relative to the middle baffle member 218 and outer baffle member 262.

In similar fashion, outer baffle actuating motors 324 are coupled to corresponding shafts 326 at one end and baffle member 262 at the other. The shafts 326 are housed and move up and down within bores 76 of housings 75. Seals 328 help prevent leaking at these egress areas. Thus, outer baffle member 262 may be moved independently relative to the inner baffle member 174 and middle baffle member 218.

The baffle members 174, 218, and 262 are features of a compact and controllable multi-duct system that can be used to collect and exhaust treatment fluids from processing chamber 503. One or more of the ducts of the system can be variably opened and/or choked at any one time. In the preferred embodiment depicted in the Figures, each exhaust duct is independent of and discrete from the others. This allows different exhaust protocols to be used with streams exhausted through the different ducts. Also, different treatment materials can be collected in different ducts to facilitate recycling without undue cross-contamination that might otherwise occur if a recycled treatment material were to be recovered from a duct used with other materials. In a typical treatment, one or more kinds of treatment fluids are dispensed onto one or both surfaces of workpiece 12. When chuck 94, and hence workpiece 12 rotate, the treatment chemicals tend to flow radially outward and into the appropriate, open exhaust duct(s). Desirably, an exhaust can be pulled through the open duct(s) to help pull materials into the duct(s). Pulling such an exhaust also helps control particles and fumes. A minimal amount of exhaust may be applied to the closed ducts to help prevent cross-contamination. In those embodiments in which the chuck 94, and hence workpiece 12, are stationary, pulling an exhaust helps to draw the treatment materials radially outward and into the appropriate exhaust duct(s).

Figure 2:
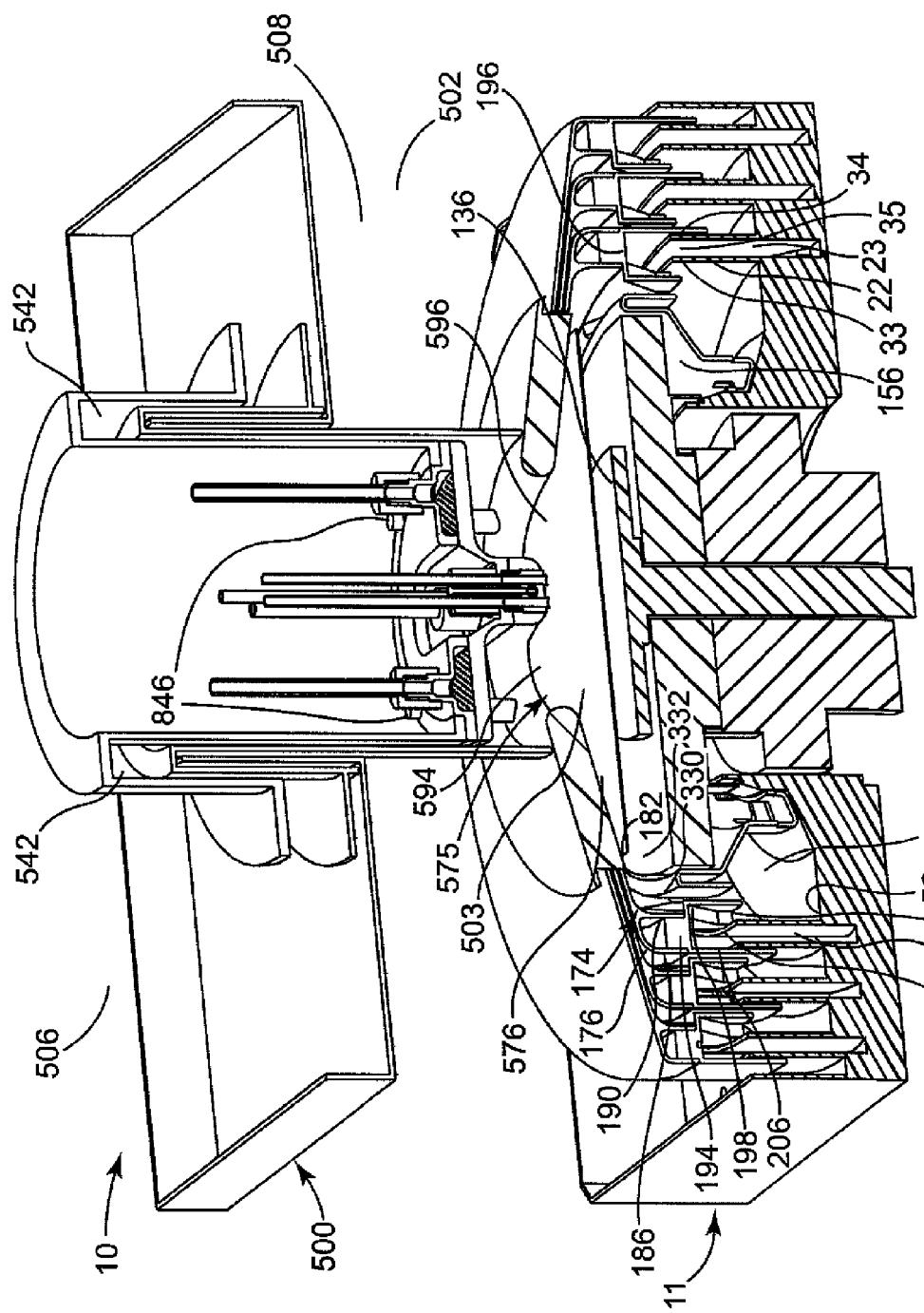
FIG. 2 shows an isometric, cross-sectional view of a portion of the tool of FIG. 1 taken along line A-A in which the tool is in a configuration in which an inner duct pathway is open and the shutter is lowered/closed.
Figure 3:
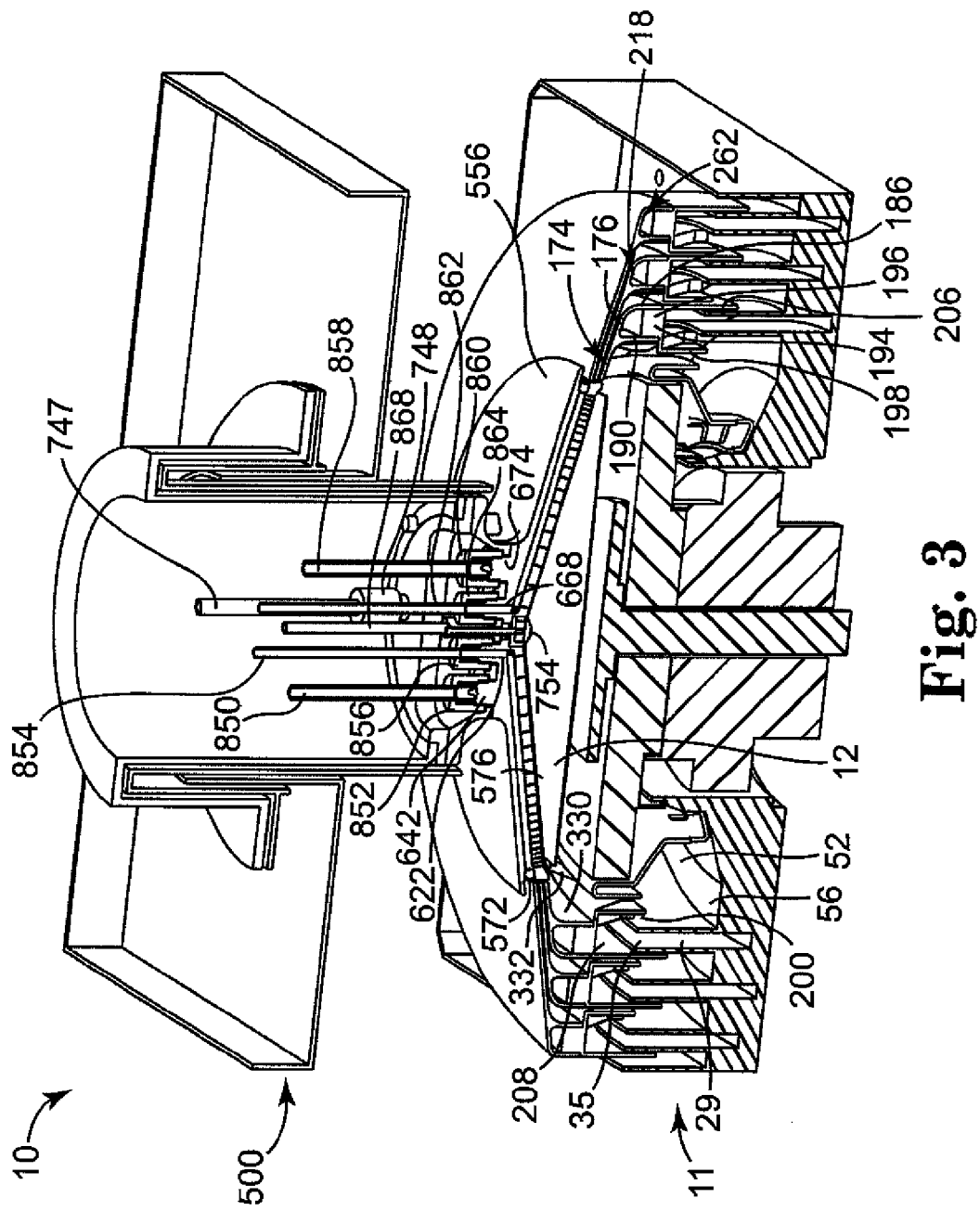
FIG. 3 shows an isometric, cross-sectional view of a portion of the tool of FIG. 1 taken along line B-B in which the tool is in a configuration in which an inner duct pathway is open and the shutter is raised/open.

It can be appreciated, therefore, that tool 10 has many possible exhaust configurations. For purposes of illustration, FIGS. 2 through 7 show four representative exhaust configurations that show the versatility of tool 10. FIGS. 2 and 3 show tool 10 in an exhaust configuration in which an inner duct pathway 330 is open. In this configuration, all three of baffle members 174, 218, and 262 are raised and nested together. This chokes flow between the members but opens annular duct inlet 332 to duct pathway 330 below inner baffle member 174. The baffle plates 176, 220, and 264 may be physically touching to choke off flow between the plates, but this can create an undue risk that particles could be generated. Accordingly, it is preferred that the plates 176, 220, and 264 do not physically touch, but nonetheless are sufficiently close enough to create enough flow resistance that substantially the entirety of the exhaust stream flows into the open duct pathway 330.

The annular duct inlet 332 surrounds the outer peripheries of workpiece 12 and chuck 94. The duct pathway 330 extends radially outward from duct inlet 332 a short distance. Duct pathway 330 then transitions downward to include a more axially oriented flow channel between inner baffle member 174 and outer wall 166 of drip ring 156. This extends duct pathway 330 into drain basin 52. The duct pathway 330 continues under hood 194 through flow channel 200, into headspace 208, into exhaust plenum 29 via exhaust inlet 35, and then out through outlet port 36 into suitable plumbing such as inner exhaust manifold 336.

Figure 4:
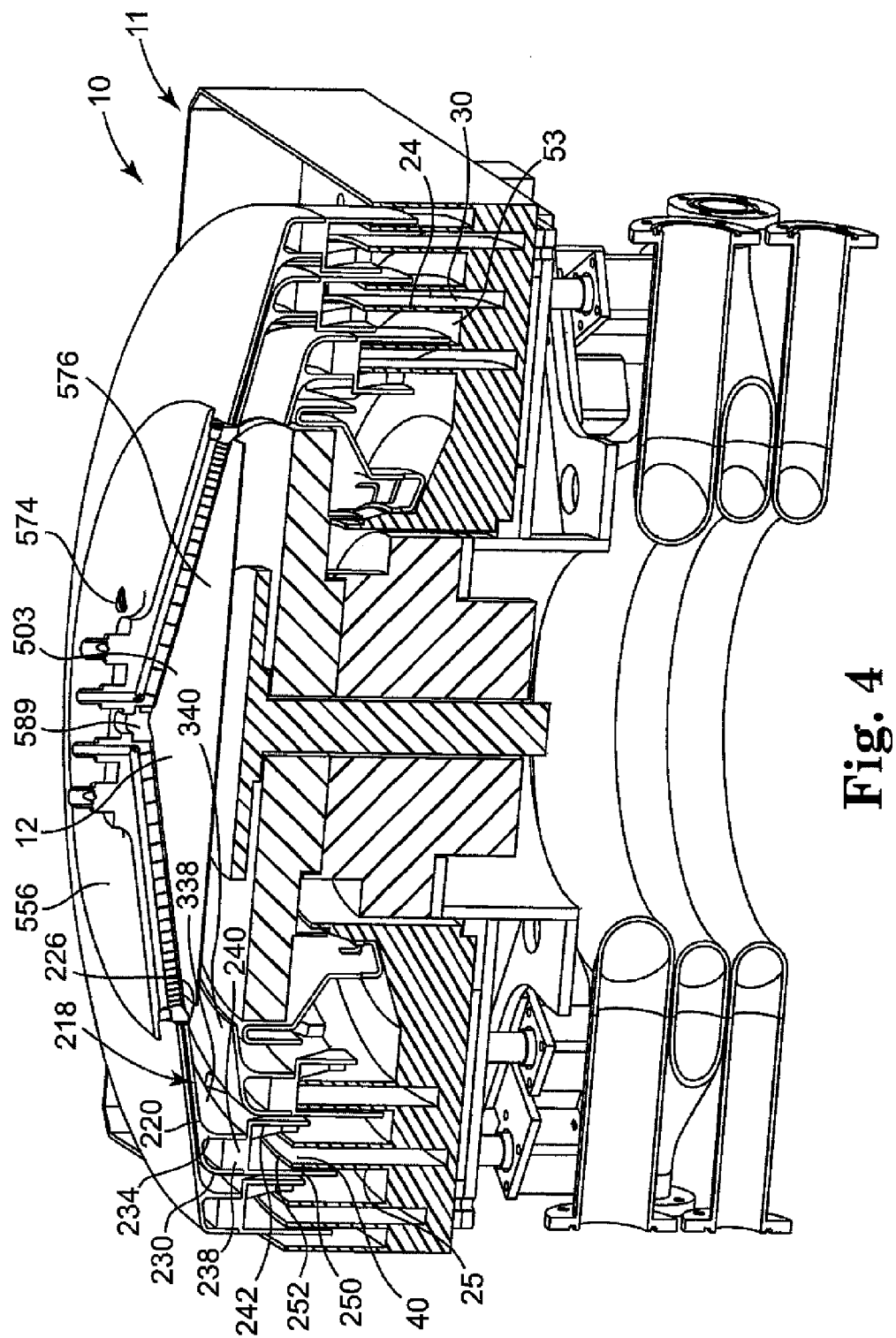
FIG. 4 shows an isometric, cross-sectional view of a portion of the tool of FIG. 1 taken along line B-B in which the tool is in a configuration in which a middle duct pathway is open.

FIG. 4 shows an alternative exhaust configuration of tool 10 in which a middle duct pathway 338 is open. In this configuration, inner baffle member 174 is lowered sufficiently so that flow into the inner duct pathway 330 is choked off. Inner baffle member 174 may physically contact curved top rim 164 of annular drip ring 156, but it is more preferred that these parts do not touch but are close enough together to choke the flow. At the same time, cap plate 196 seats against and chokes exhaust inlet 35 into inner exhaust plenum 29. In the meantime, both middle baffle member 218 and outer baffle member 262 are raised with middle baffle member 218 being nested within outer baffle member 262. This chokes flow between the members but opens annular duct inlet 340 to middle duct pathway 338 above inner baffle member 174 but below middle baffle member 218.

The annular duct inlet 340 surrounds the outer peripheries of workpiece 12 and chuck 94. The duct pathway 338 extends radially outward from duct inlet 340 a short distance. Duct pathway 338 then transitions downward to include a more axially oriented flow channel between middle baffle member 218 and inner baffle member 174. This extends duct pathway 338 into drain basin 53. The duct pathway 338 continues under hood 238 through flow channel 244, into headspace 252, into exhaust plenum 30 via exhaust inlet 40, and then out through outlet port (not shown) into suitable plumbing such as middle exhaust manifold 344.

Figure 5:
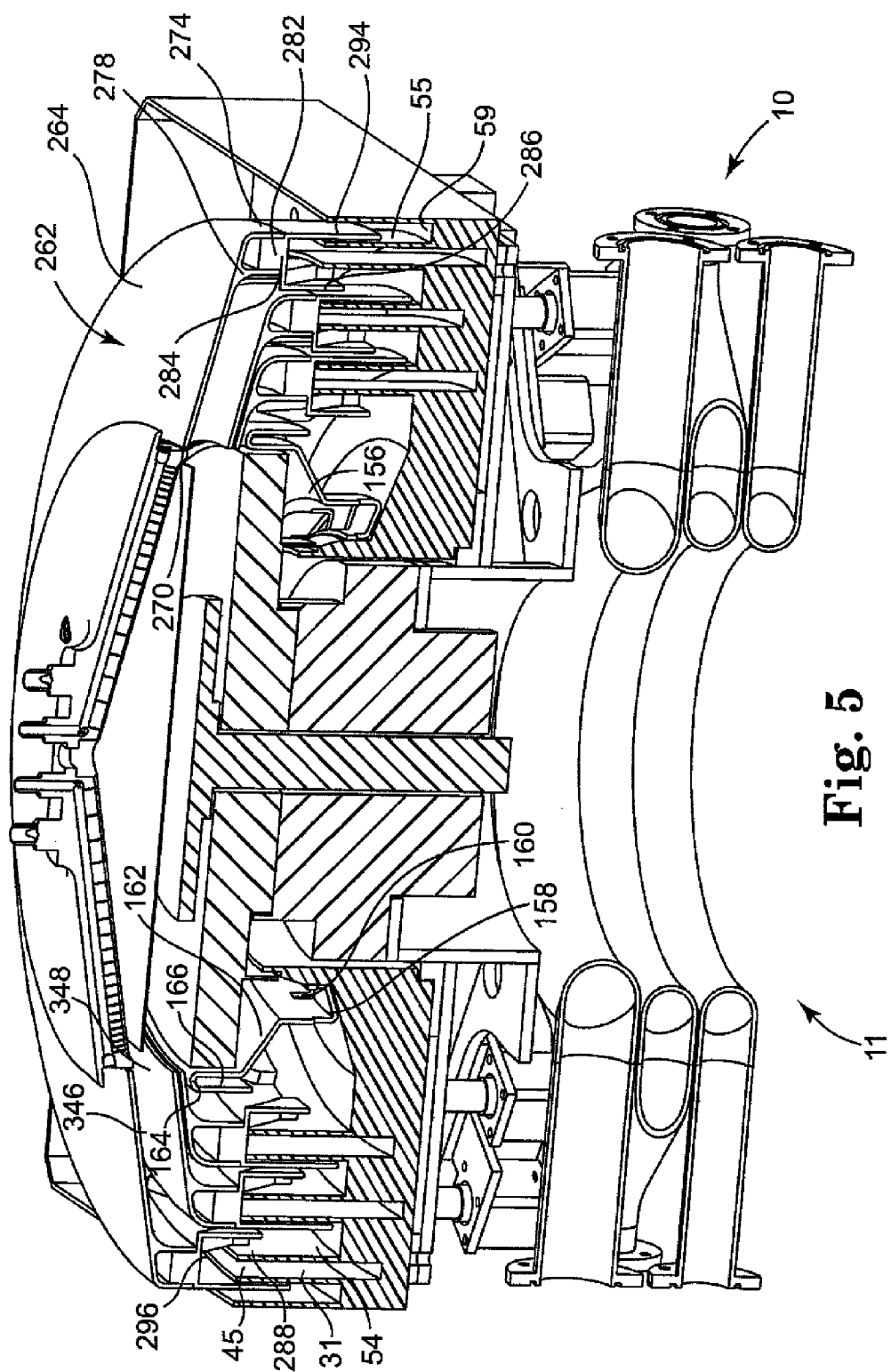
FIG. 5 shows an isometric, cross-sectional view of a portion of the tool of FIG. 1 taken along line B-B in which the tool is in a configuration in which an outer duct pathway is open.

FIG. 5 shows an alternative exhaust configuration of tool 10 in which an outer duct pathway 346 is open. In this configuration, inner baffle member 174 and middle baffle member 218 are lowered and nested so that plates 176 and 220 are close enough to choke off flow into the inner and middle duct pathways 330 and 338. At the same time, cap plate 196 seats against and closes exhaust inlet 35 into inner exhaust plenum 29, and cap plate 240 seats against and closes exhaust inlet 40 into middle exhaust plenum 30. In the meantime, outer baffle member 262 is raised to thereby open annular duct inlet 348 to outer duct pathway 346 above middle baffle member 218 but below outer baffle member 262.

The annular duct inlet 348 surrounds the outer peripheries of workpiece 12 and chuck 94. The duct pathway 346 extends radially outward from duct inlet 348 a short distance. Duct pathway 346 then transitions downward to include a more axially oriented flow channel between outer baffle member 262 and middle baffle member 218. This extends duct pathway 346 into drain basin 54. The duct pathway 346 continues under hood 282 through flow channel 288, into headspace 296, into exhaust plenum 31 via exhaust inlet 45, and then out through outlet port 46 into suitable plumbing such as outer exhaust manifold 352.

Figure 6:
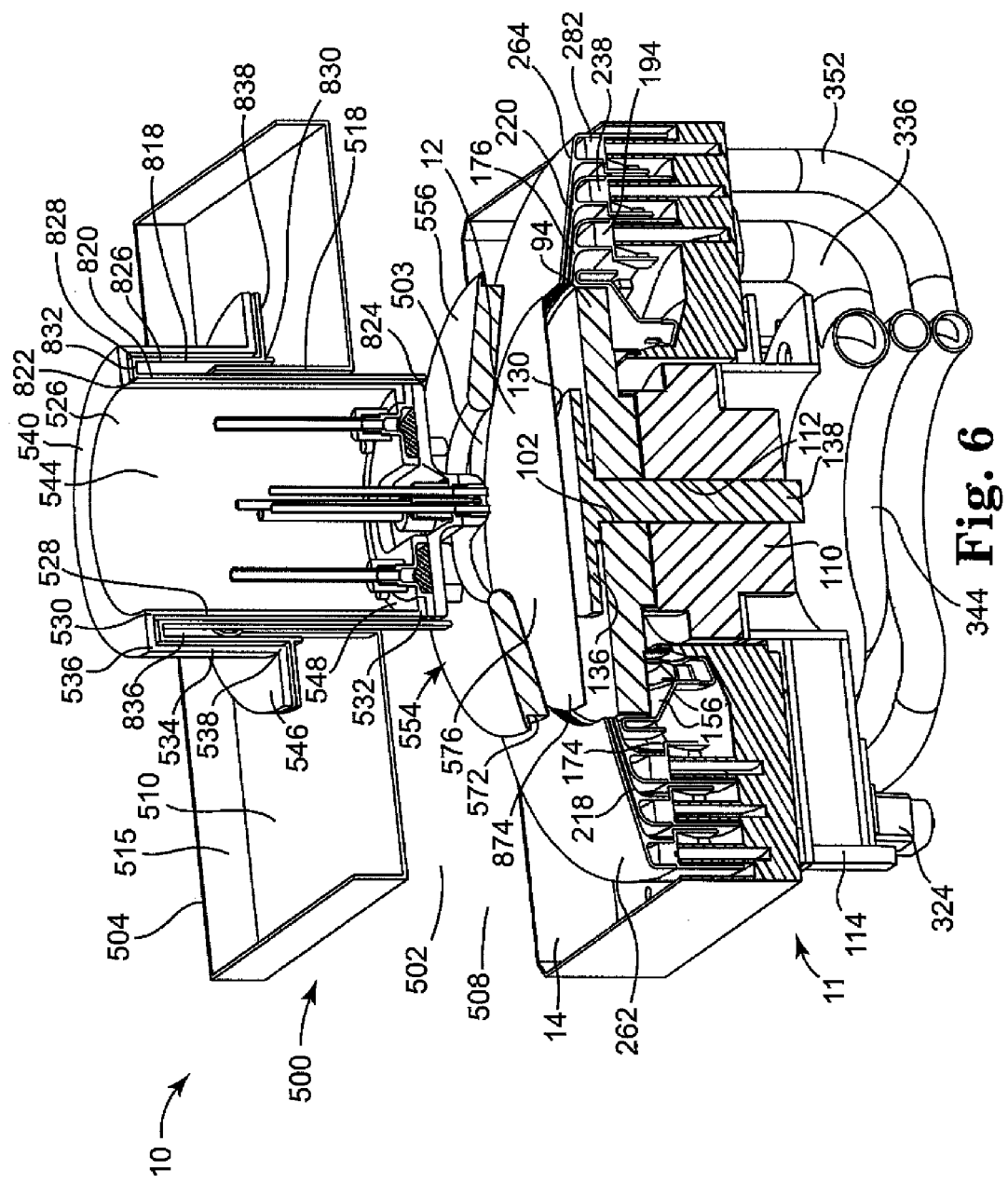
FIG. 6 shows an isometric cross-sectional view of the tool of FIG. 1 taken along line A-A in which the tool is in a workpiece transfer configuration.
Figure 7:
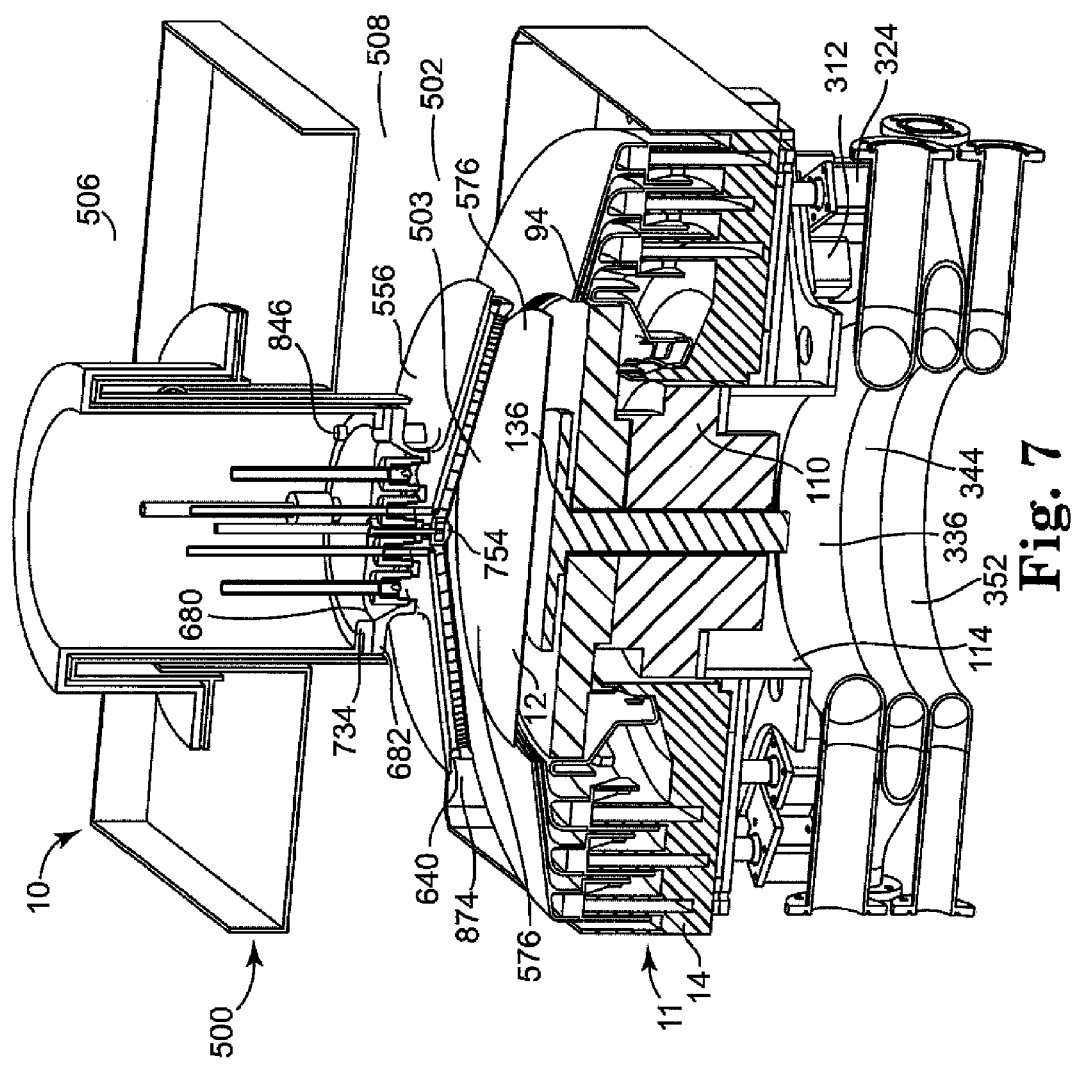
FIG. 7 shows an isometric cross-sectional view of the tool of FIG. 1 taken along line B-B in which the tool is in a workpiece transfer configuration.
Figure 8:
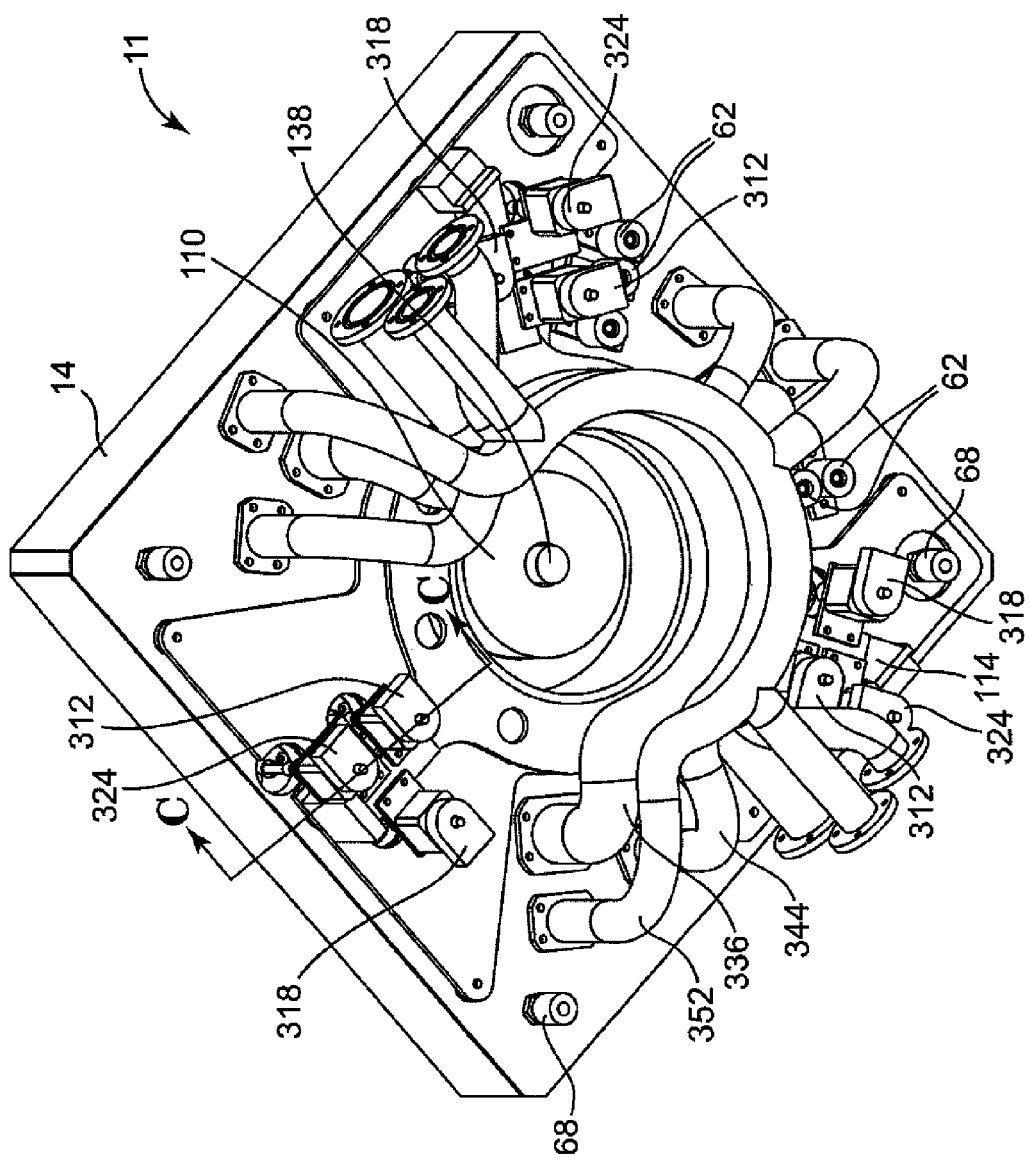
FIG. 8 is an isometric view of the bottom of the tool of FIG. 1.
Figure 9:
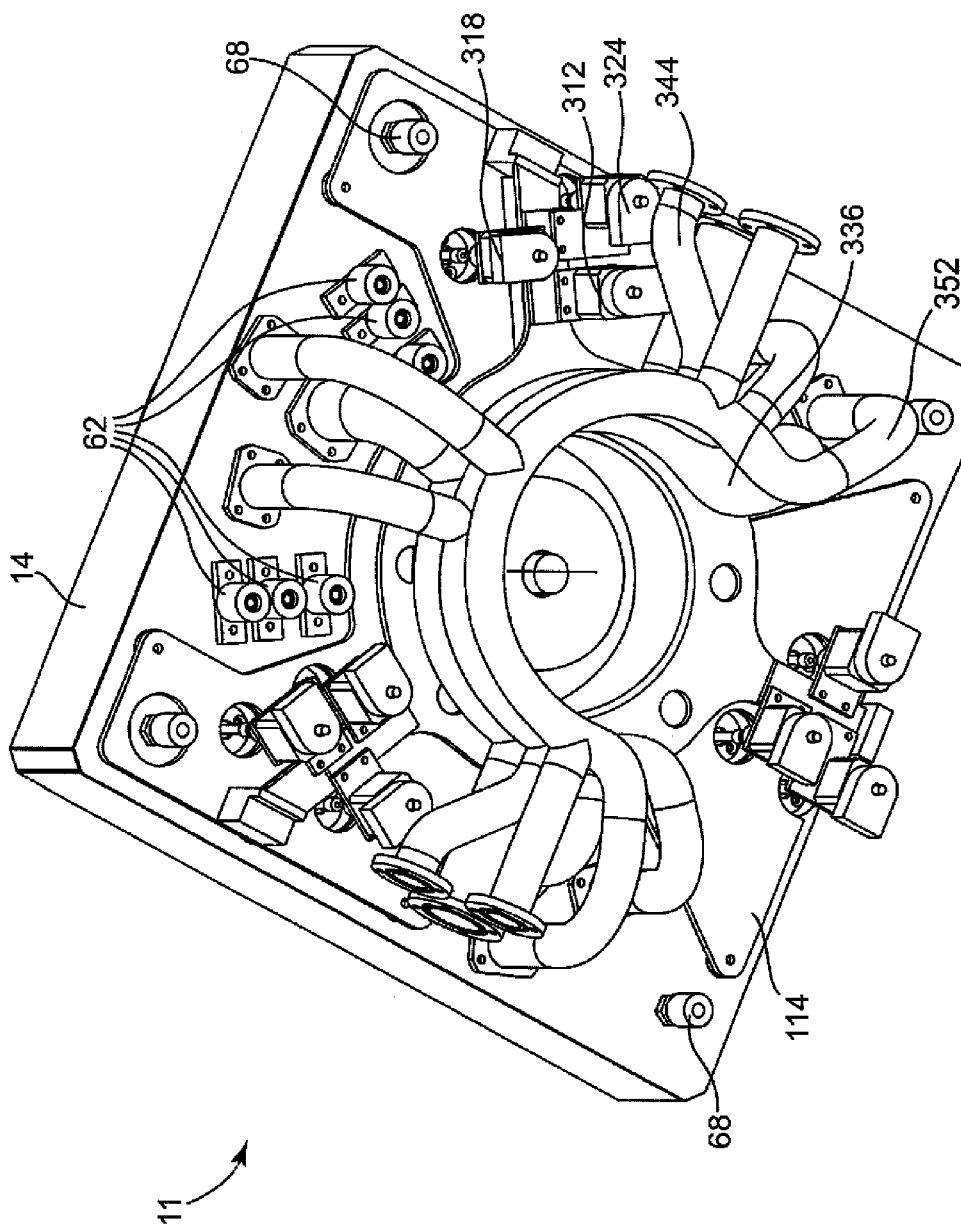
FIG. 9 is an alternative isometric view of the bottom of the tool of FIG. 1.
Figure 10:
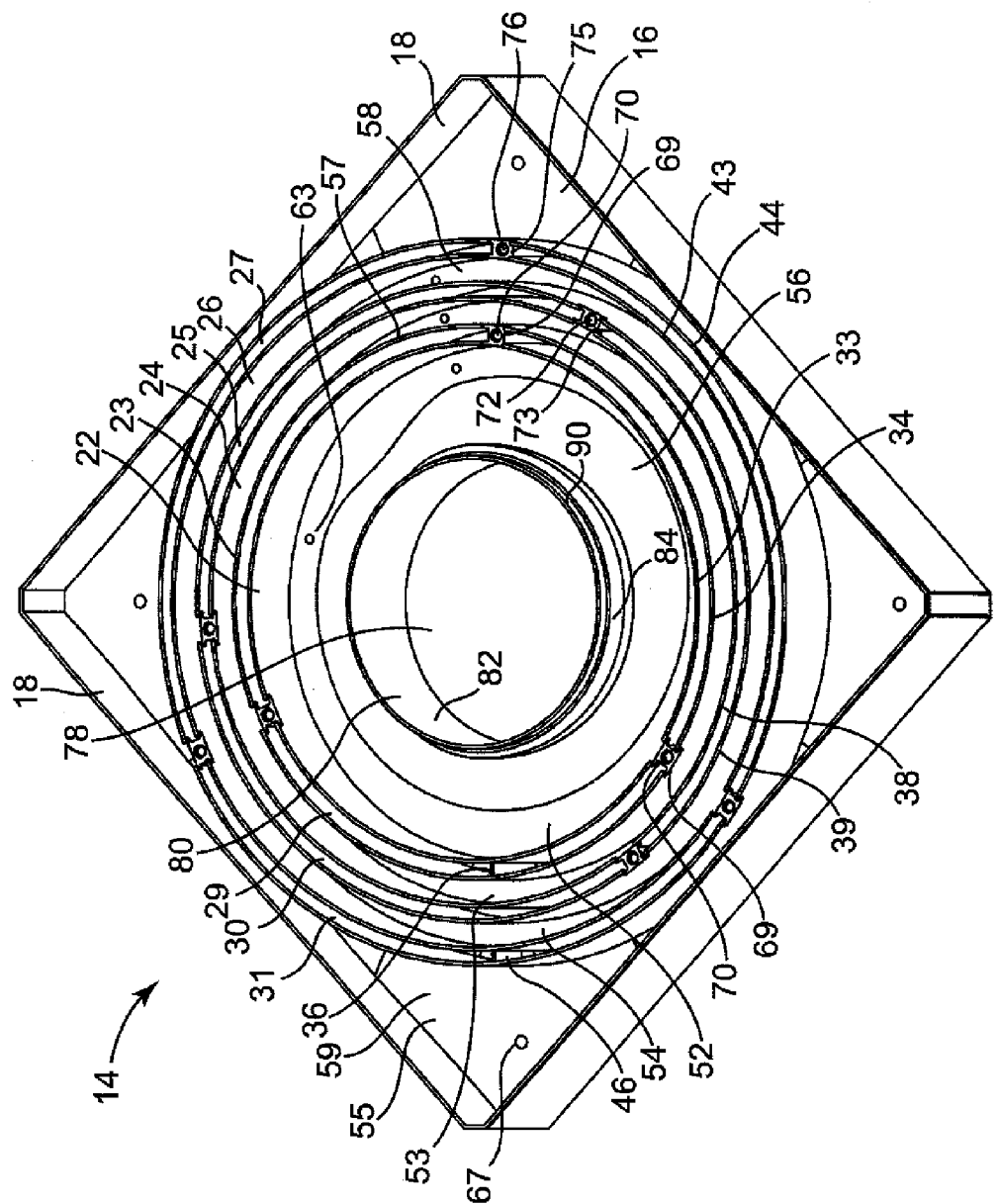
FIG. 10 is an isometric view of the base pan of the tool of FIG. 1 with components removed to show a series of annular, concentric walls rising upward from the bottom of the base pan to define a plurality of exhaust plenums and drain basins.
Figure 11:
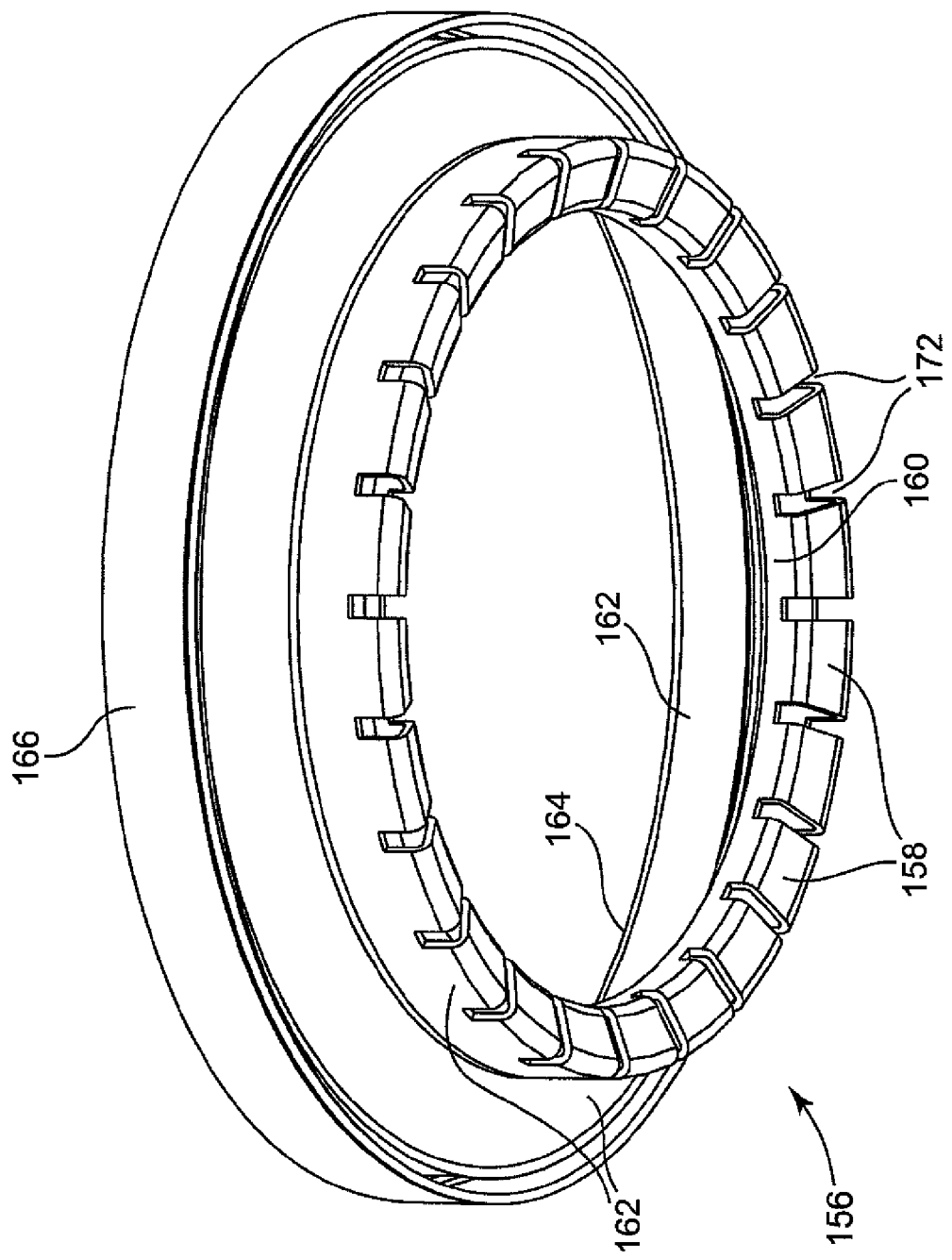
FIG. 11 is an isometric view of the drip ring used in the tool of FIG. 1.
Figure 12:
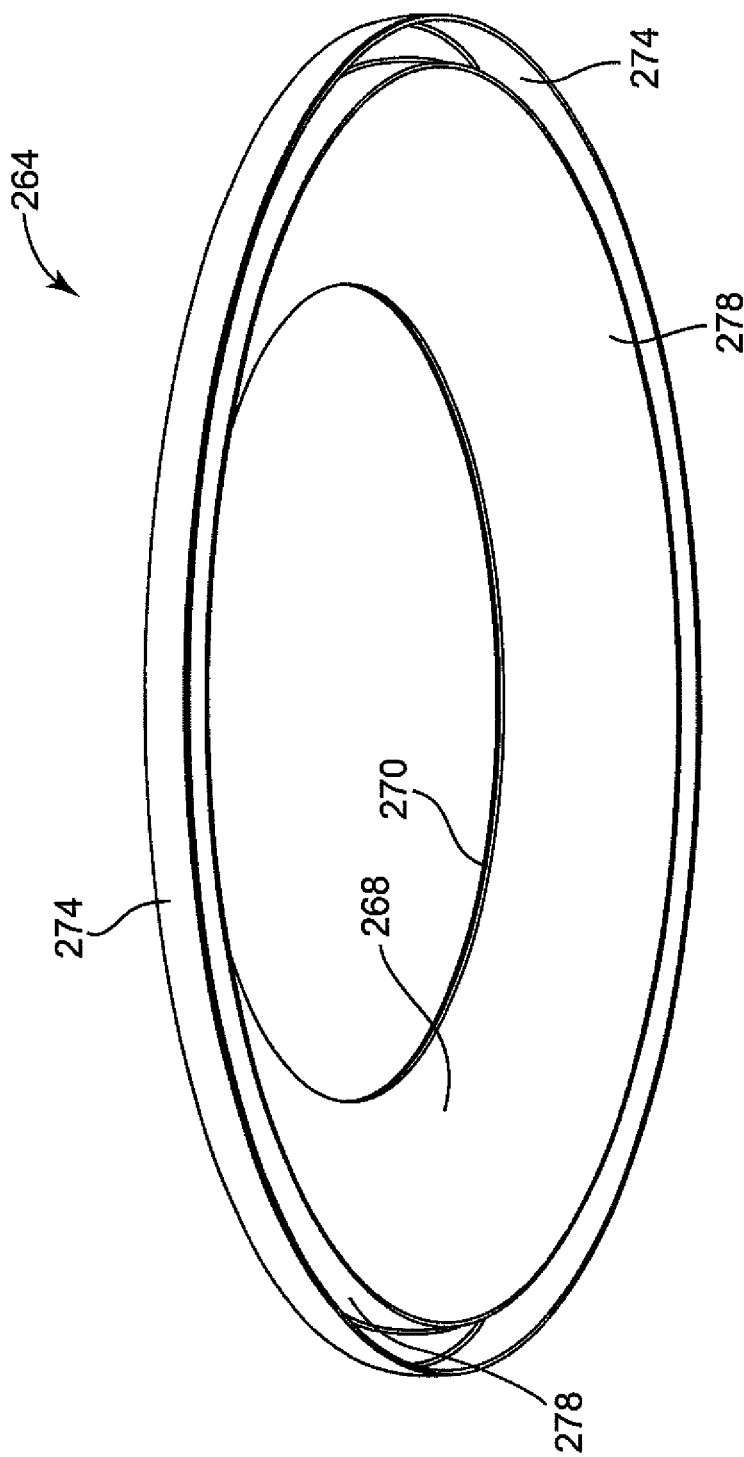
FIG. 12 is an isometric view of the outer, annular baffle plate used in the tool of FIG. 1 (The middle and inner baffle plates are not shown but are similar except for being sized to nest inside each other as shown in other Figures and described further herein.).
Figure 13:
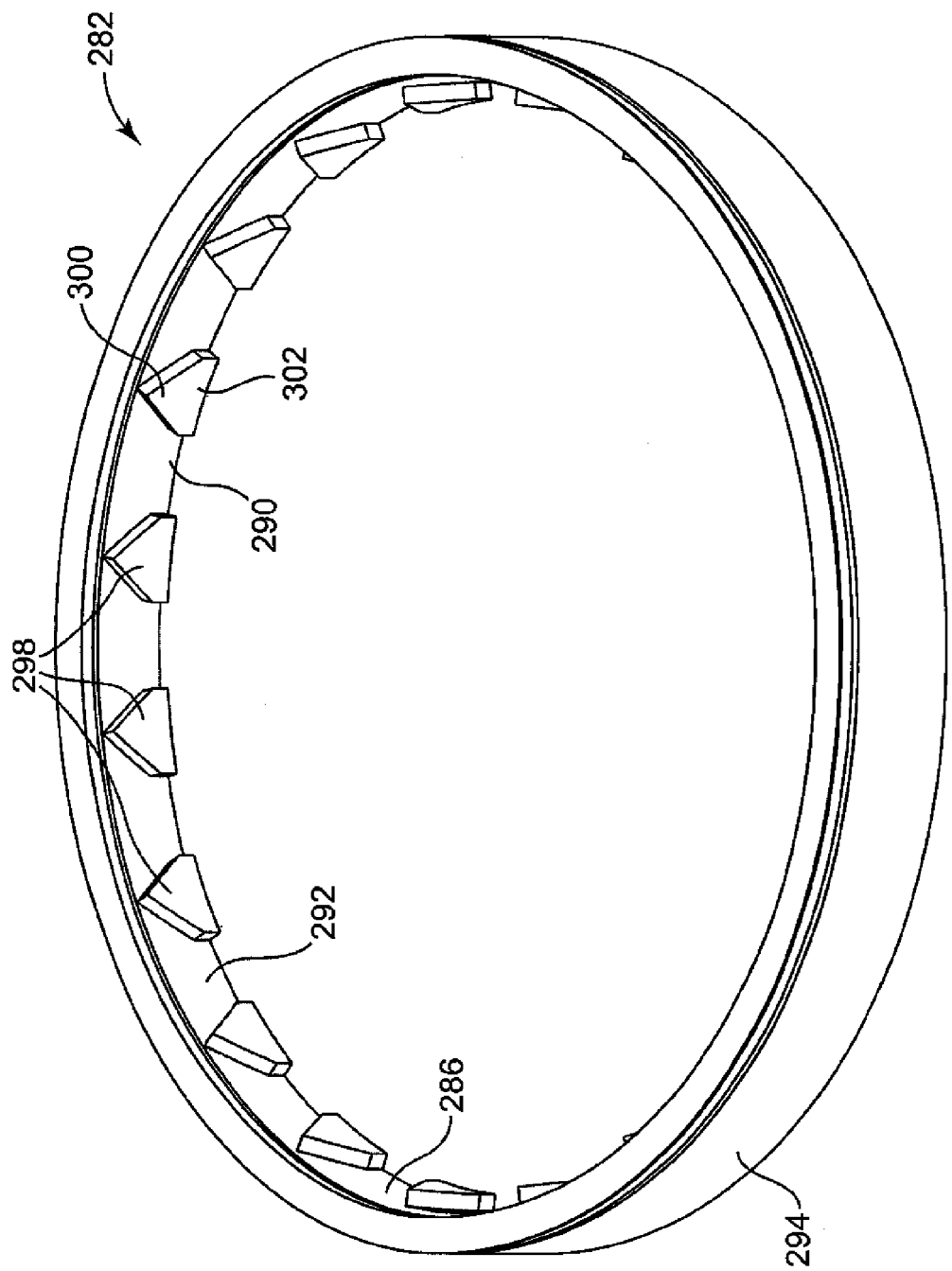
FIG. 13 is an isometric view of the outer baffle hood used in the tool of FIG. 1 (The middle and inner baffle hoods are not shown but are similar except for being sized to nest inside each other as shown in other Figures and described further herein.).
Figure 14A:
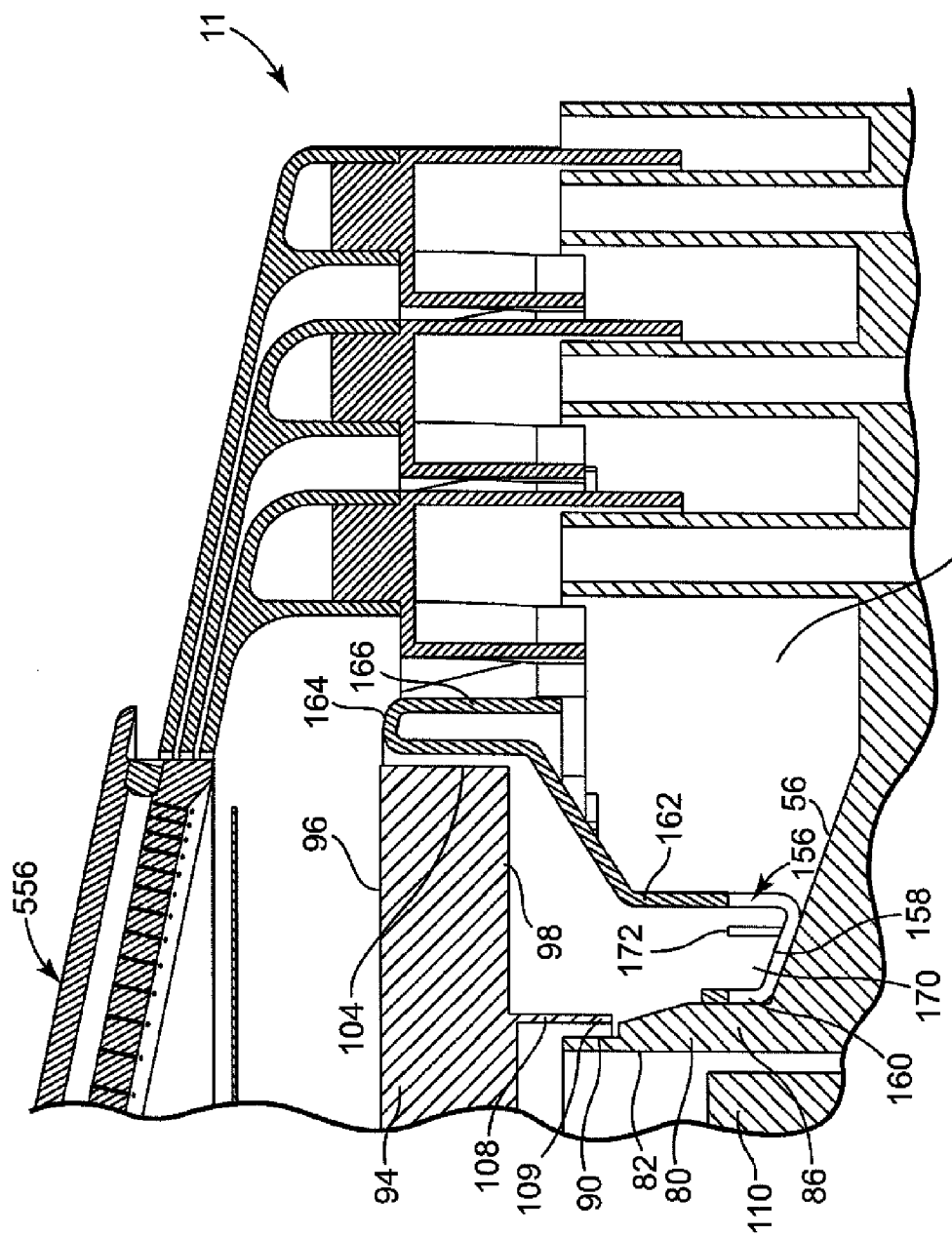
FIG. 14.A is a close-up, cross-sectional view of a portion of the tool of FIG. 1 taken along line B-B that generally identifies the area around the annular drip ring.
Figure 14B:
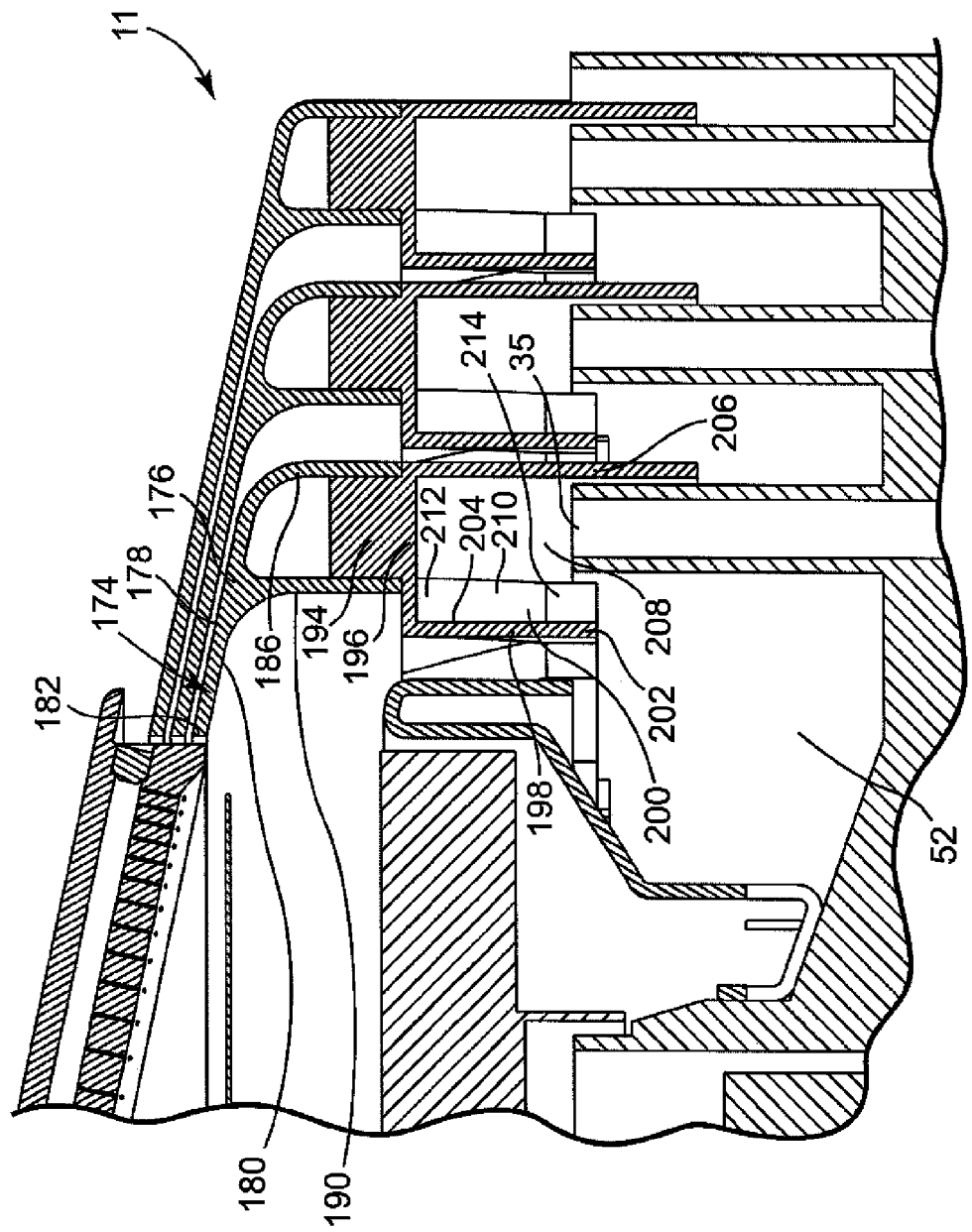
Figure 14C:
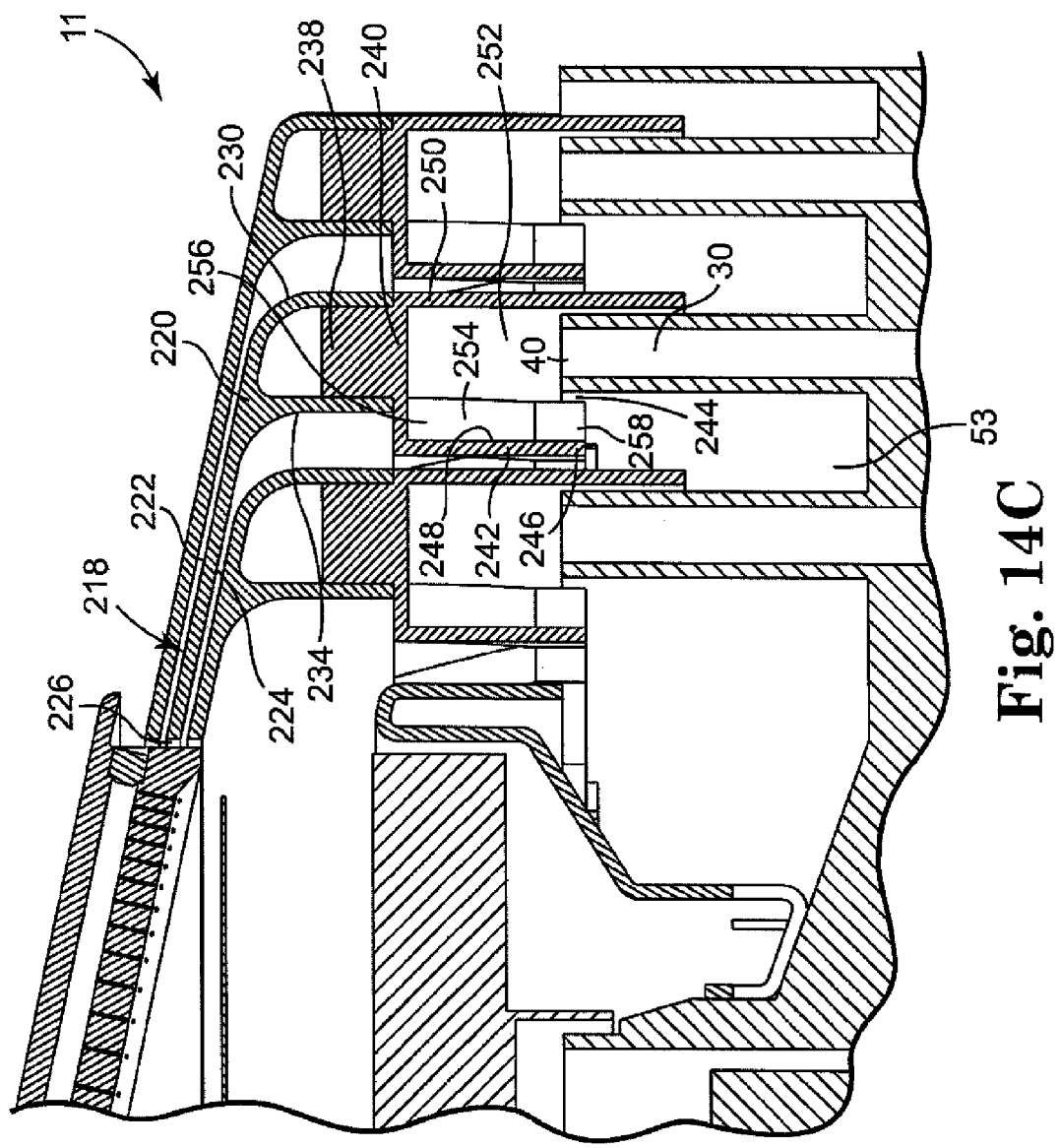
Figure 14D:
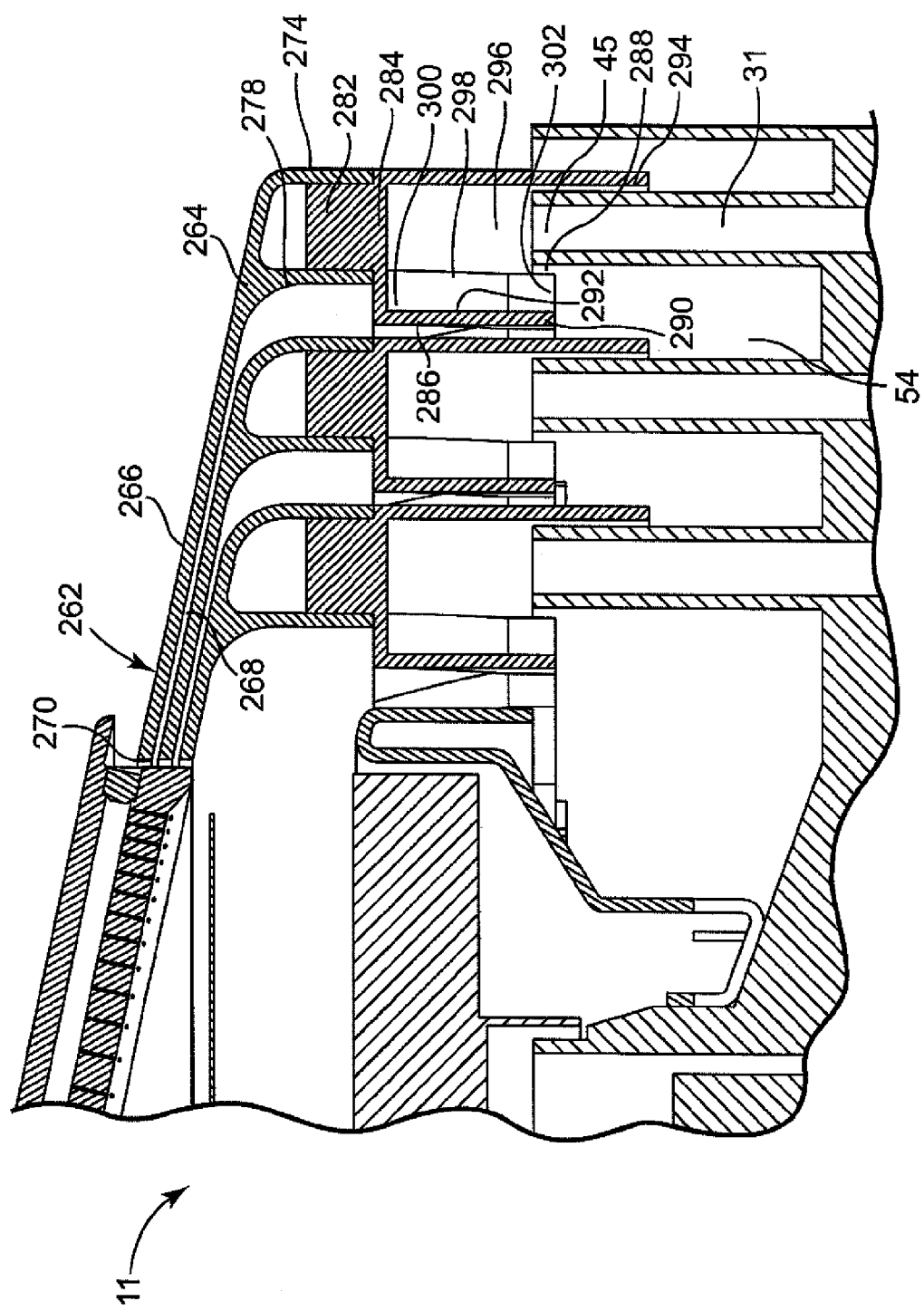
Figure 14E:
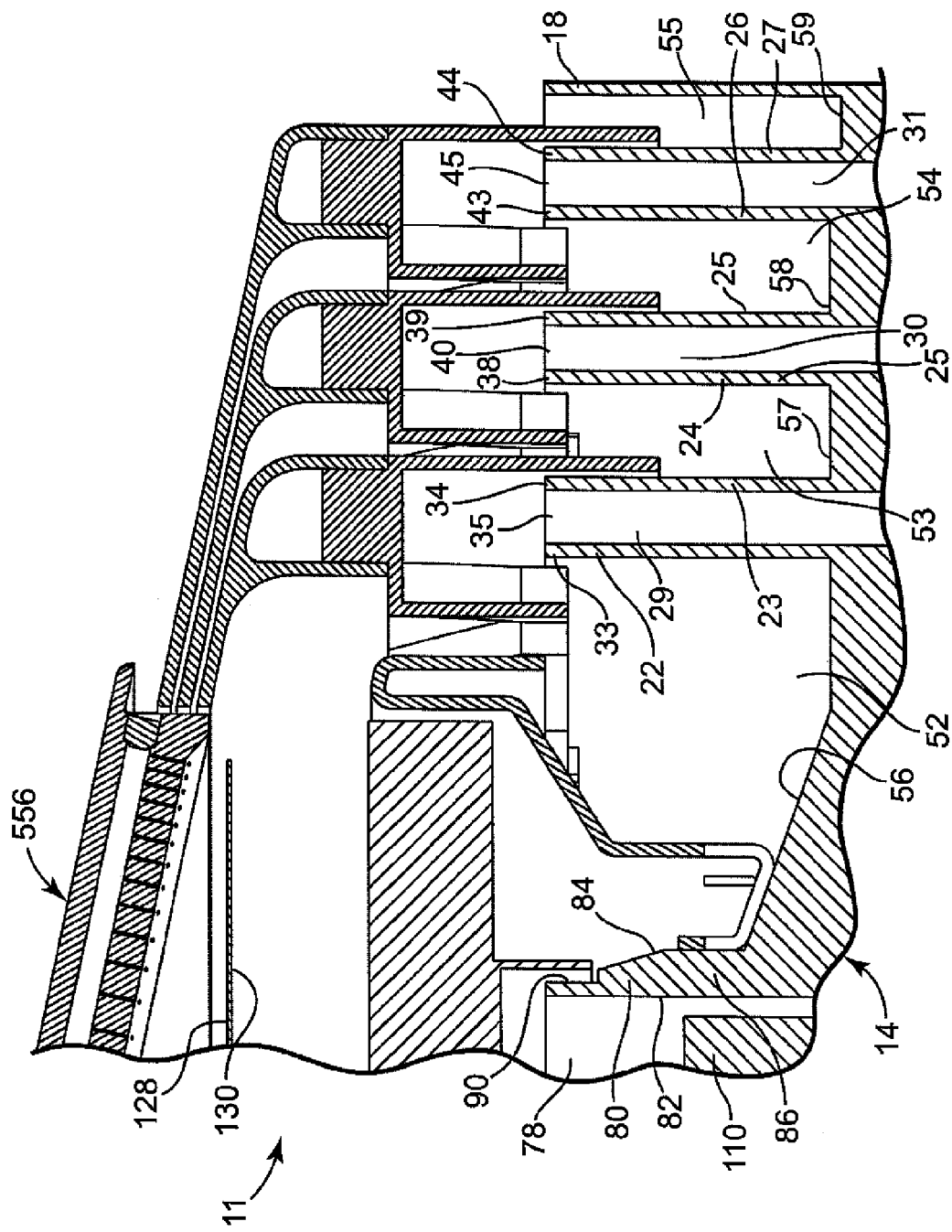
Figure 15:
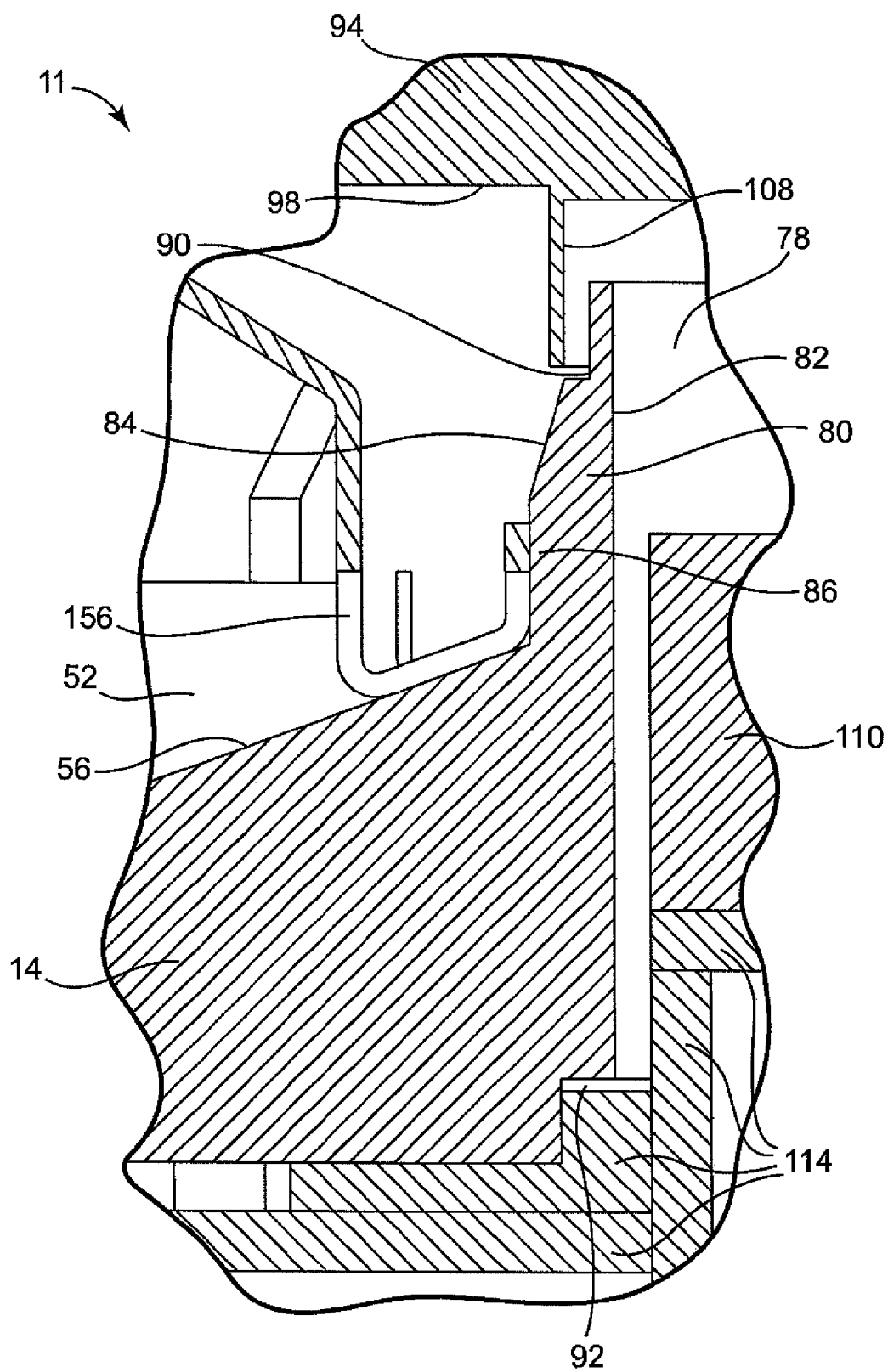
FIG. 15 is another close-up, cross-sectional view of a portion of the tool of FIG. 1 taken along line B-B.
Figure 16:
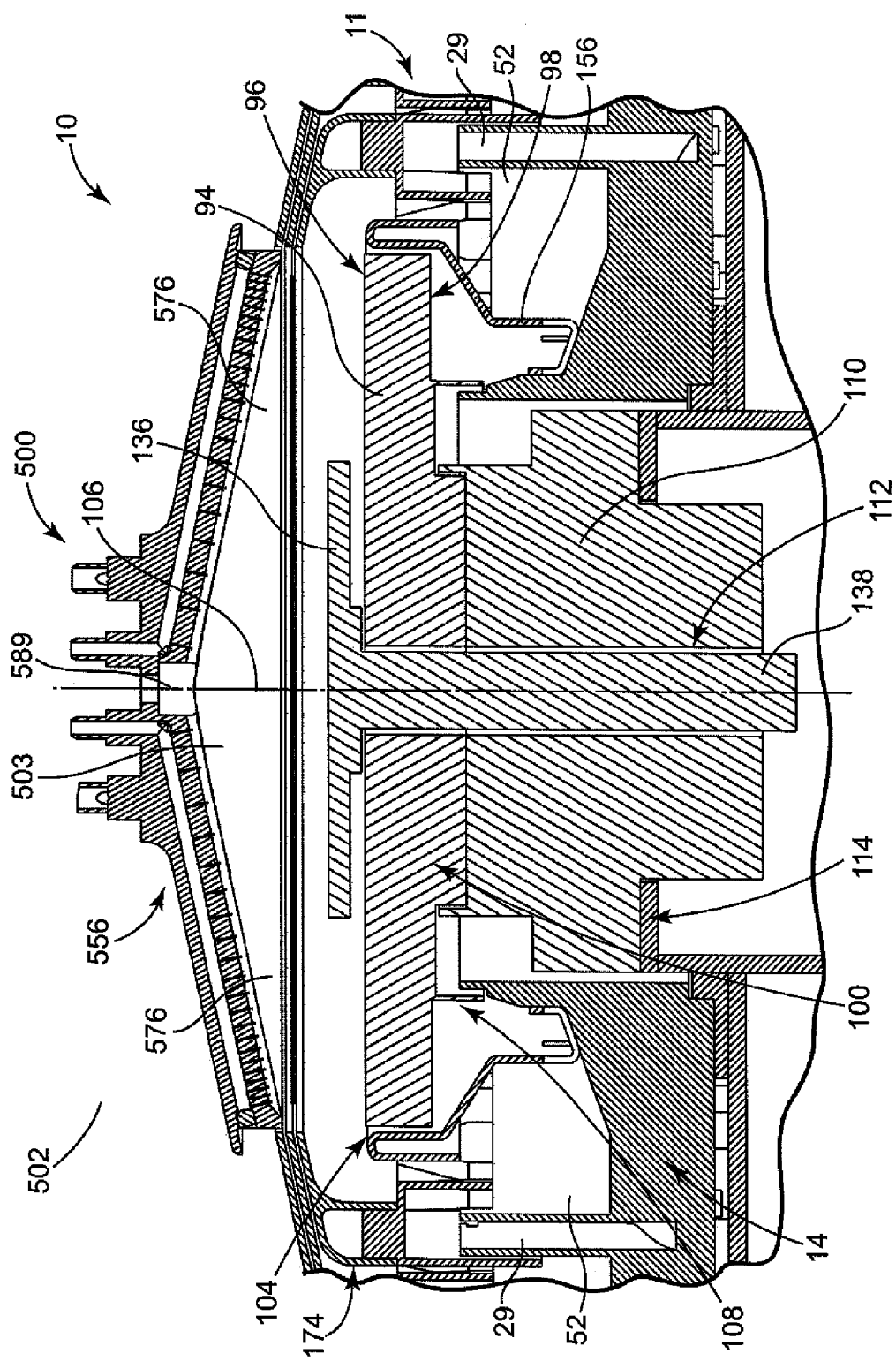
FIG. 16 is a cross-sectional view of a portion of the tool of FIG. 1 taken along line B-B.
Figure 17:
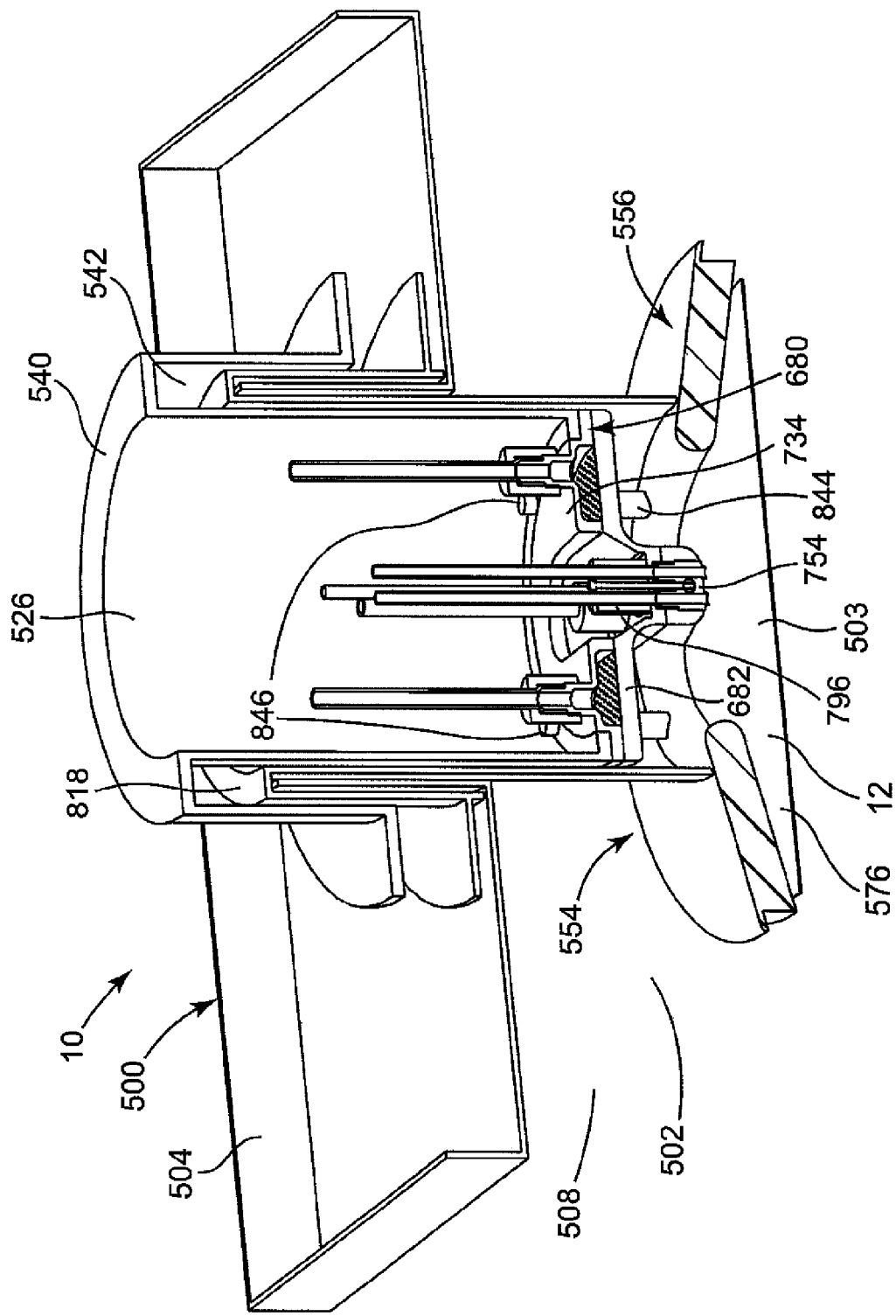
FIG. 17 shows an isometric, cross-sectional view of a portion of the tool of FIG. 1 taken along line A-A in which the tool is in a configuration in which the dispense assembly is lowered to carry out a treatment and the shutter is lowered/closed.
Figure 18:
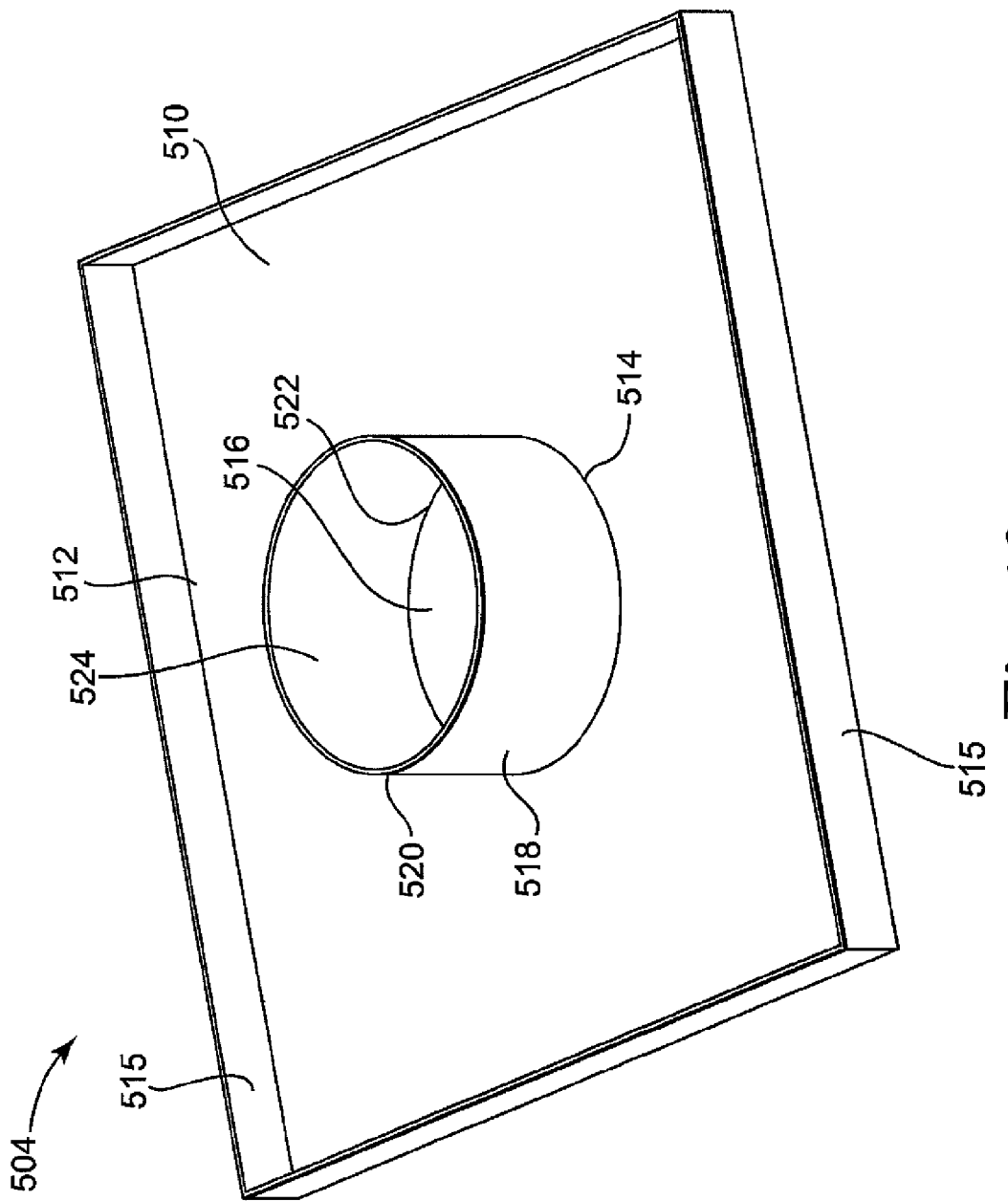
FIG. 18 shows an isometric view of the ceiling plate used in the tool of FIG. 1.
Figure 19:
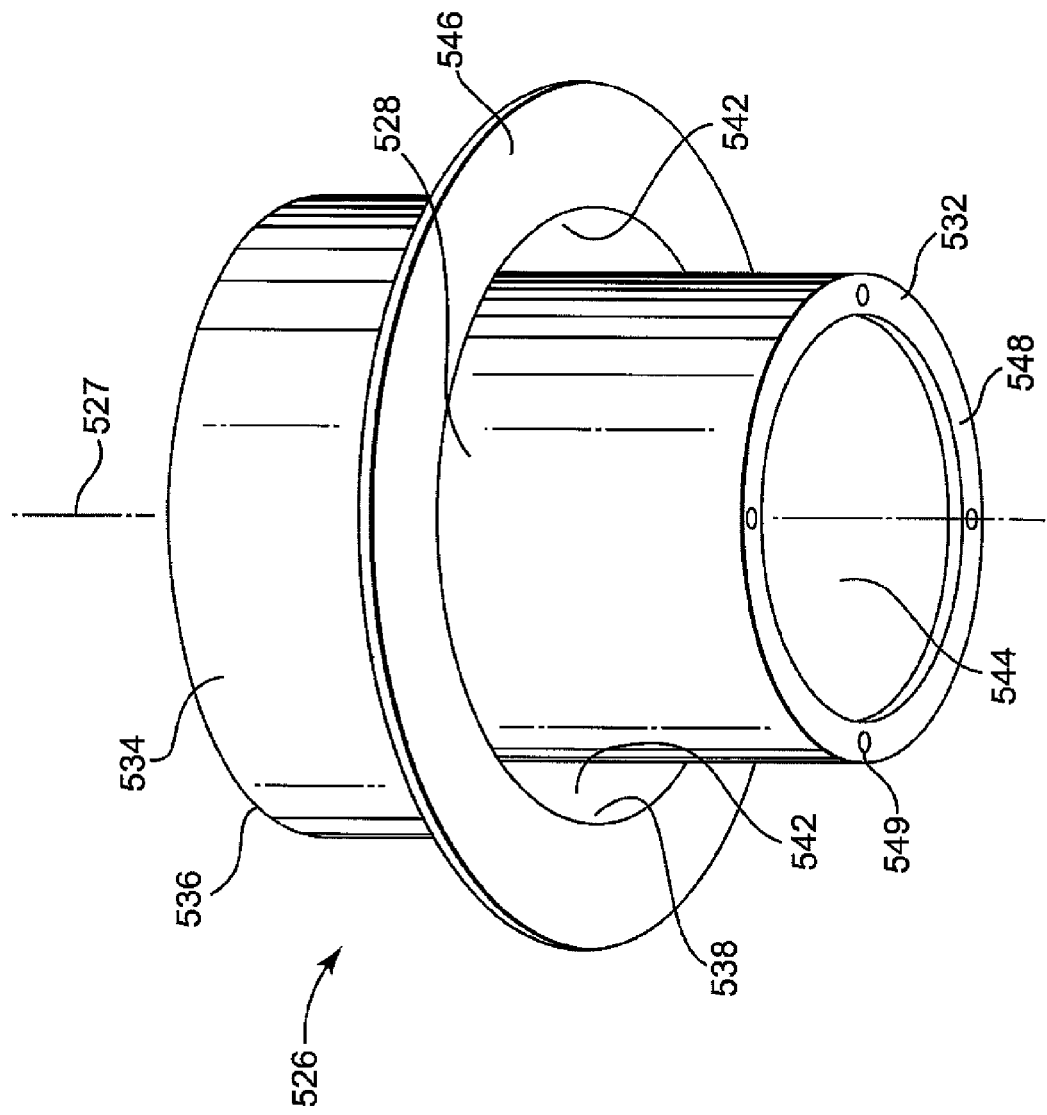
FIG. 19 shows an isometric view of the moveable support member used in the tool of FIG. 1.
Figure 20:
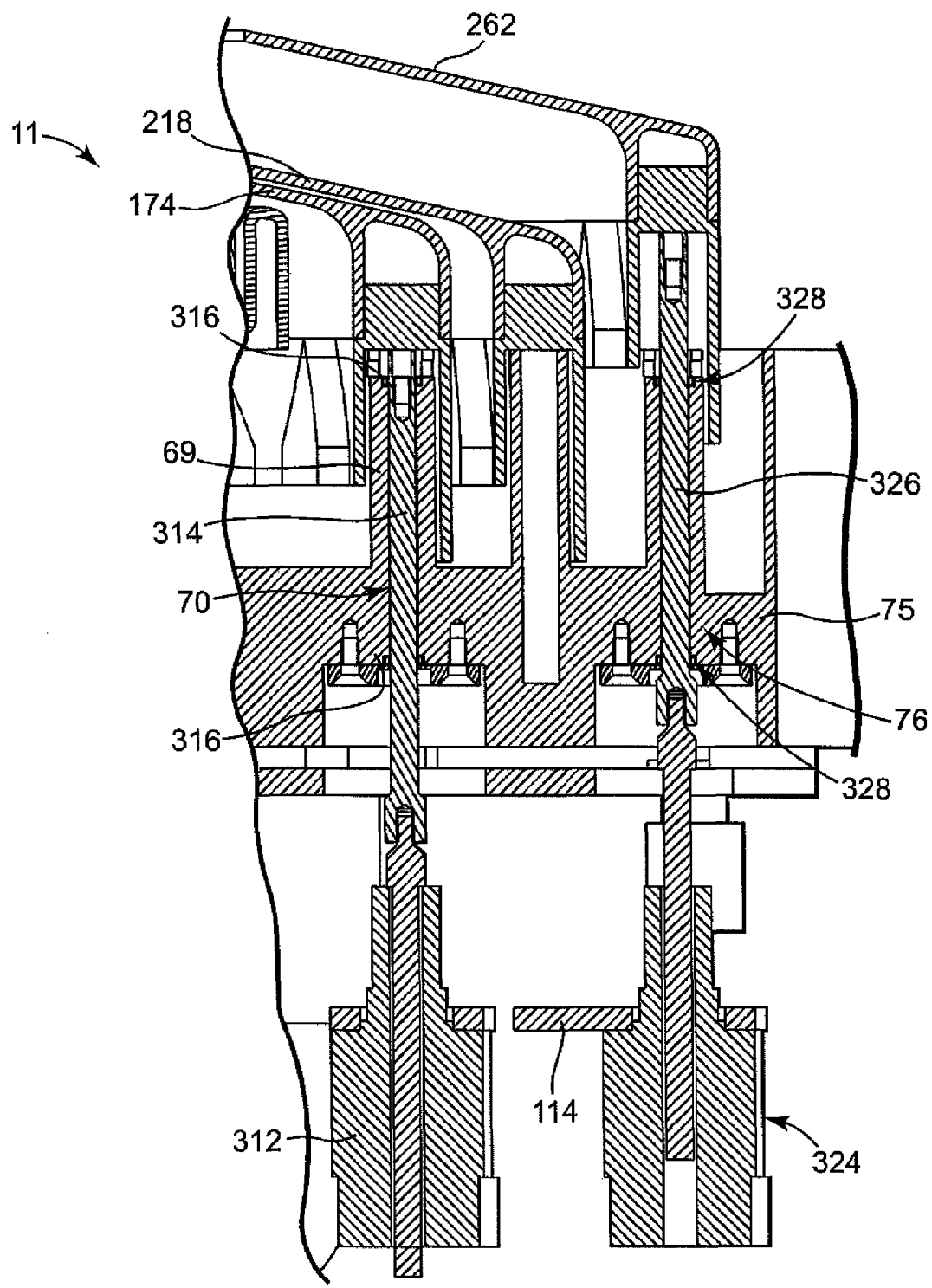
FIG. 20 is a cross-sectional view of a portion of the tool of FIG. 1 taken along line C-C of FIG. 8 showing actuator parts for the outer and inner baffle members.
Figure 21:
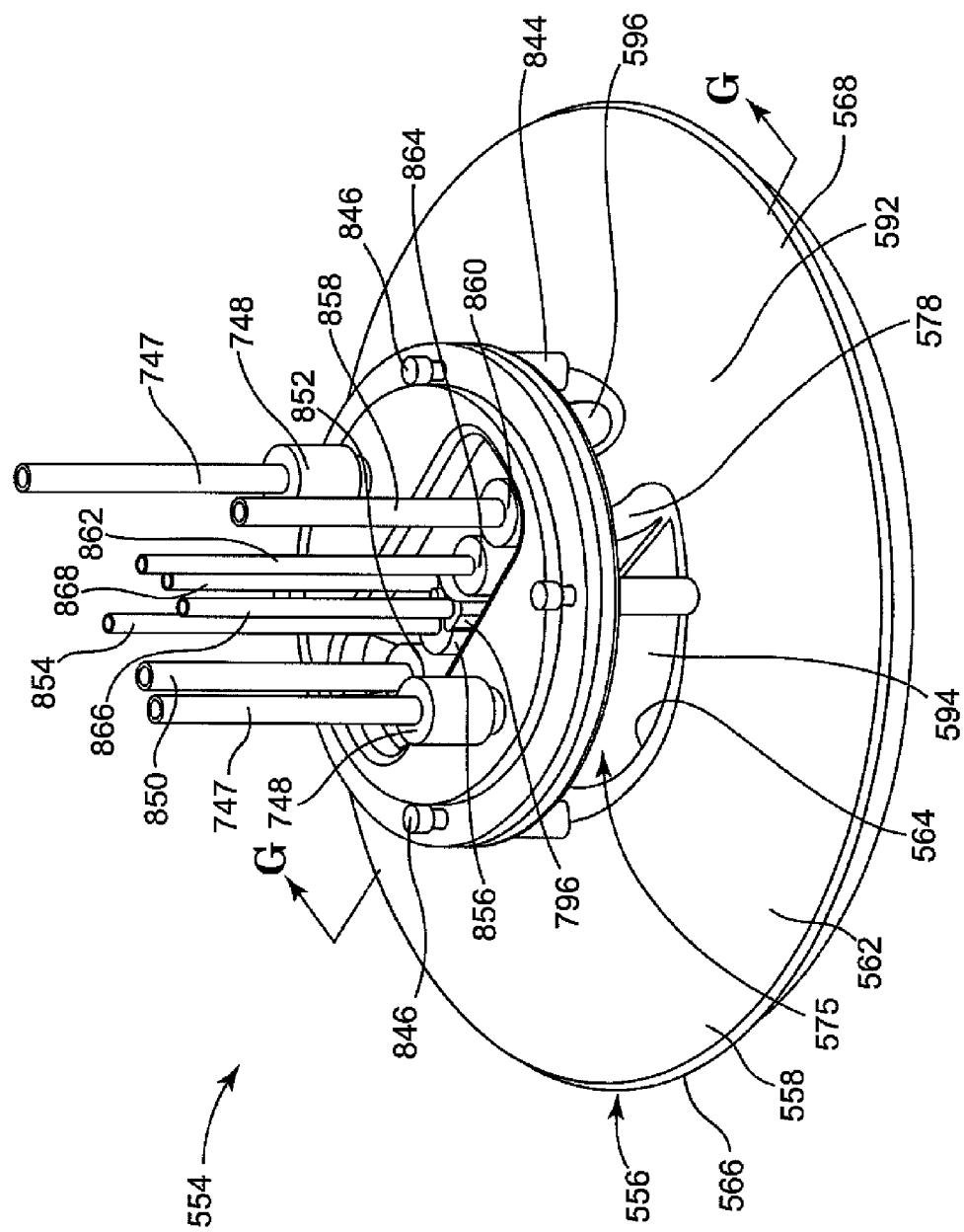
FIG. 21 is an isometric view of the dispense assembly used in the tool of FIG. 1.
Figure 22B:
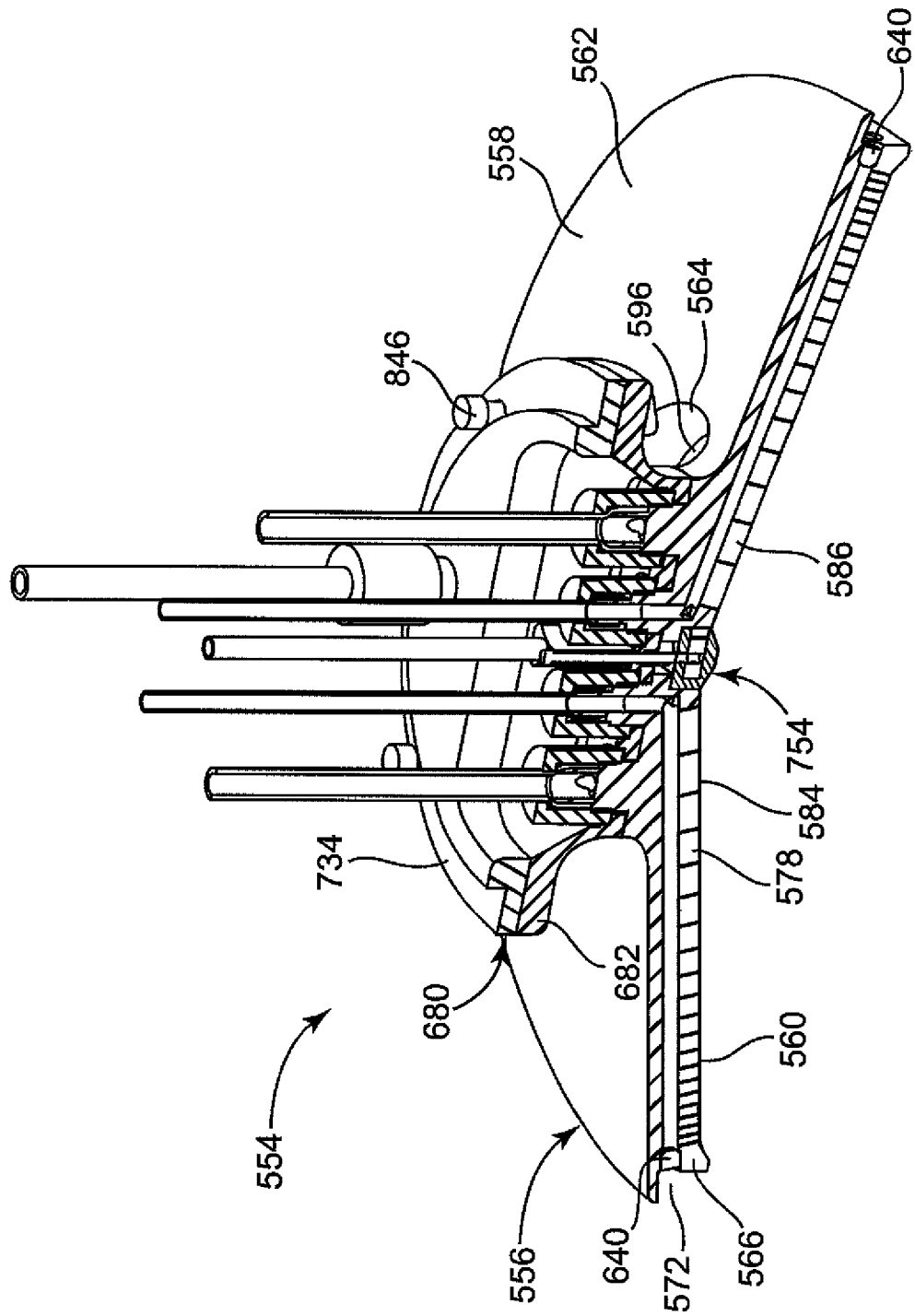
FIG. 22.A is a cross-sectional, isometric view of the dispense assembly of FIG. 21 taken along line G-G.
Figure 23:
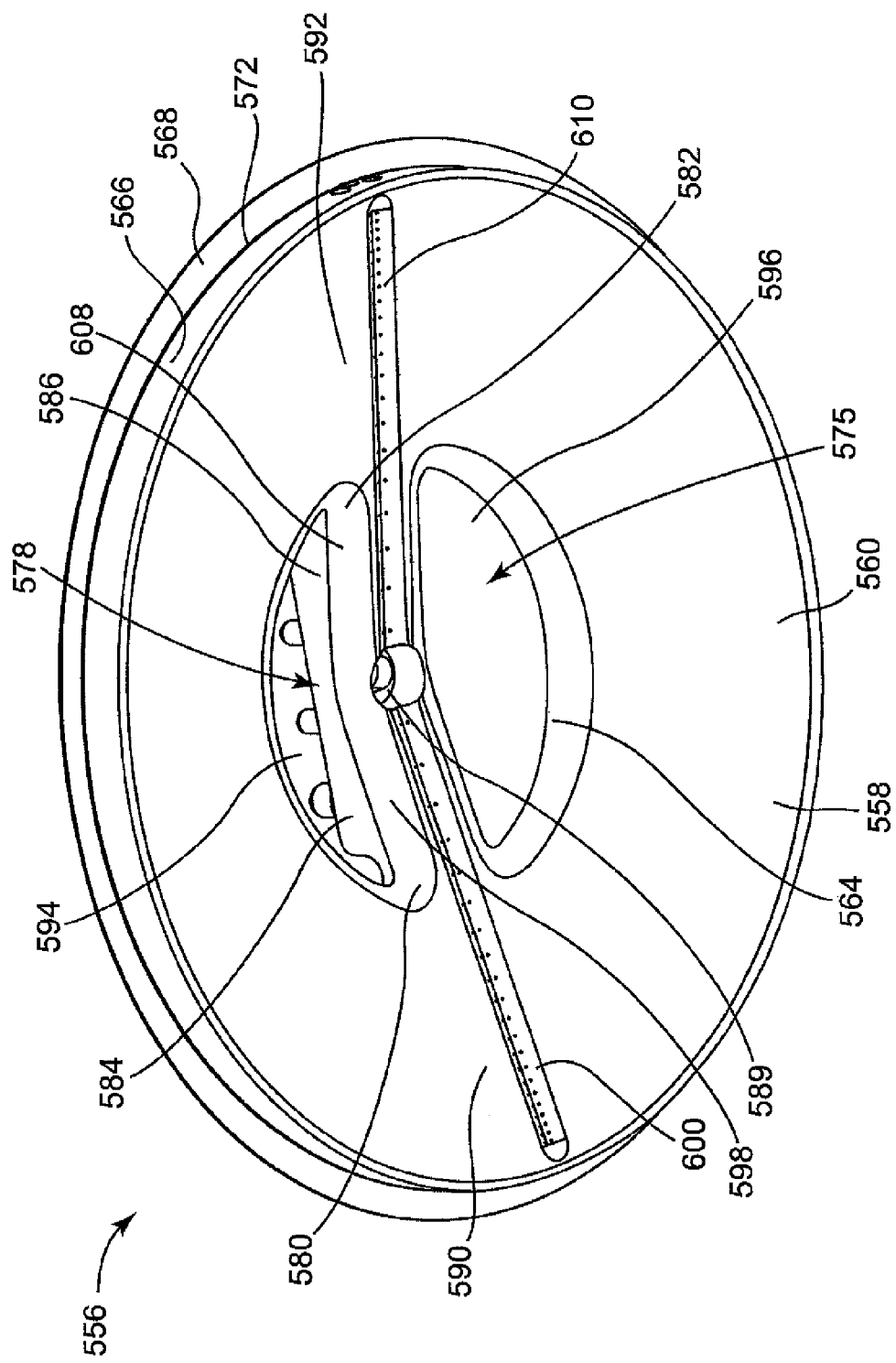
FIG. 23 is an isometric view of the spray nozzle/barrier structure used in the dispense assembly of FIG. 22 looking generally at the underside of the structure.
Figure 24:
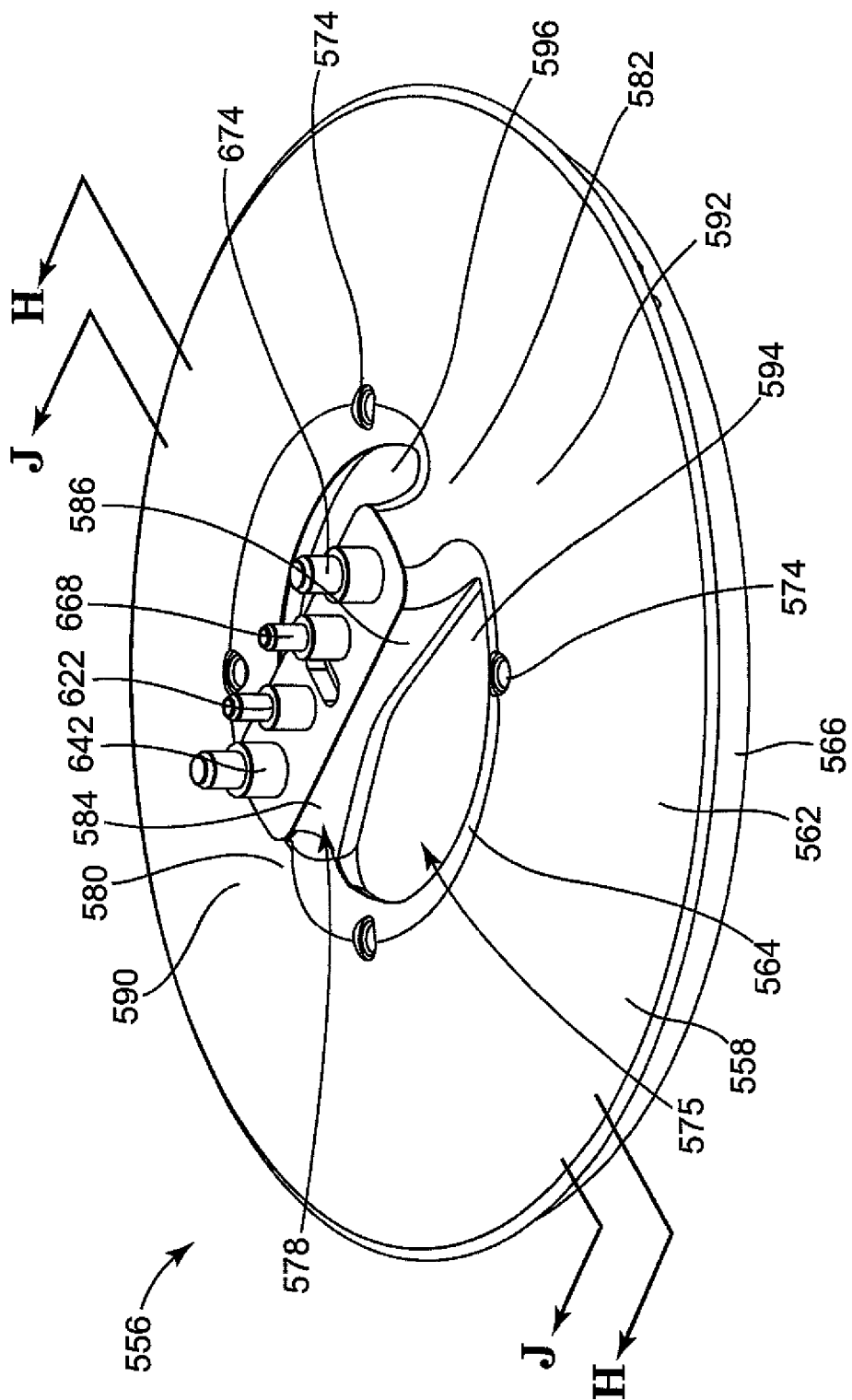
FIG. 24 is an isometric view of the spray nozzle/barrier structure used in the dispense assembly of FIG. 22 looking generally at the top side of the structure.
Figure 25:
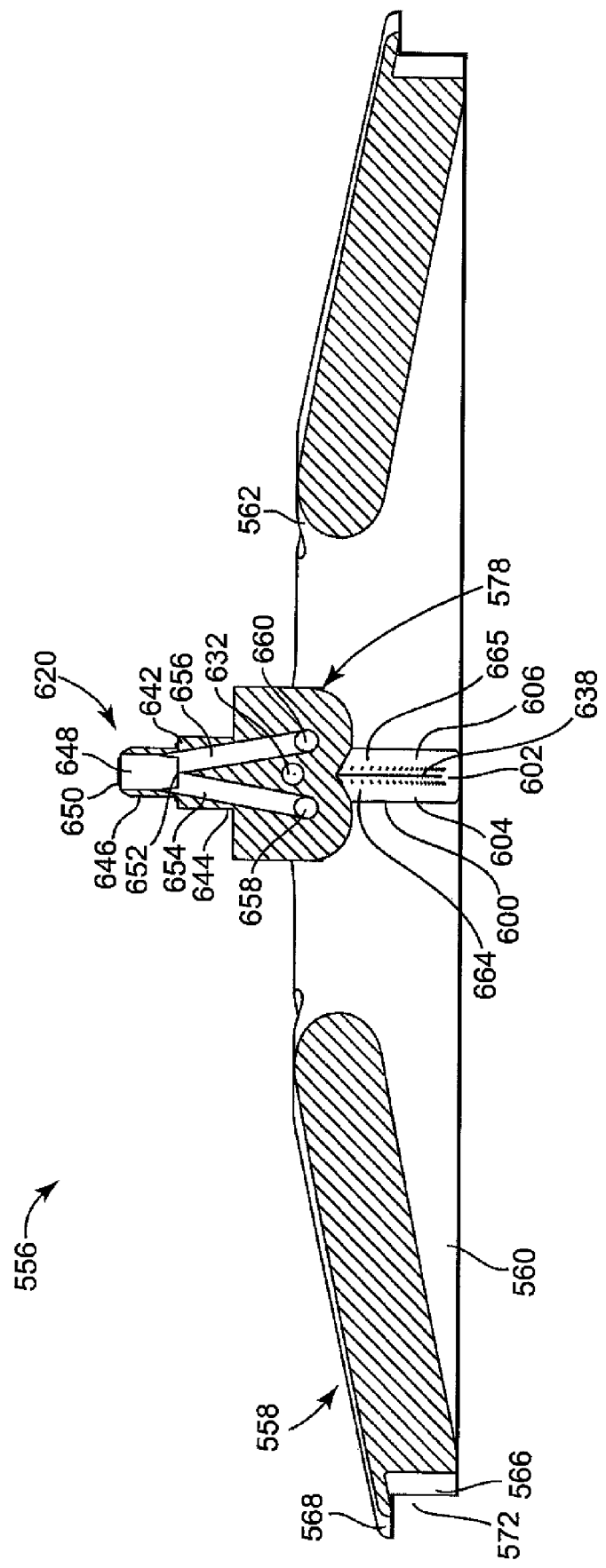
FIG. 25 is a cross-sectional view of the spray nozzle barrier structure of FIG. 24 taken along line H-H.
Figure 26:
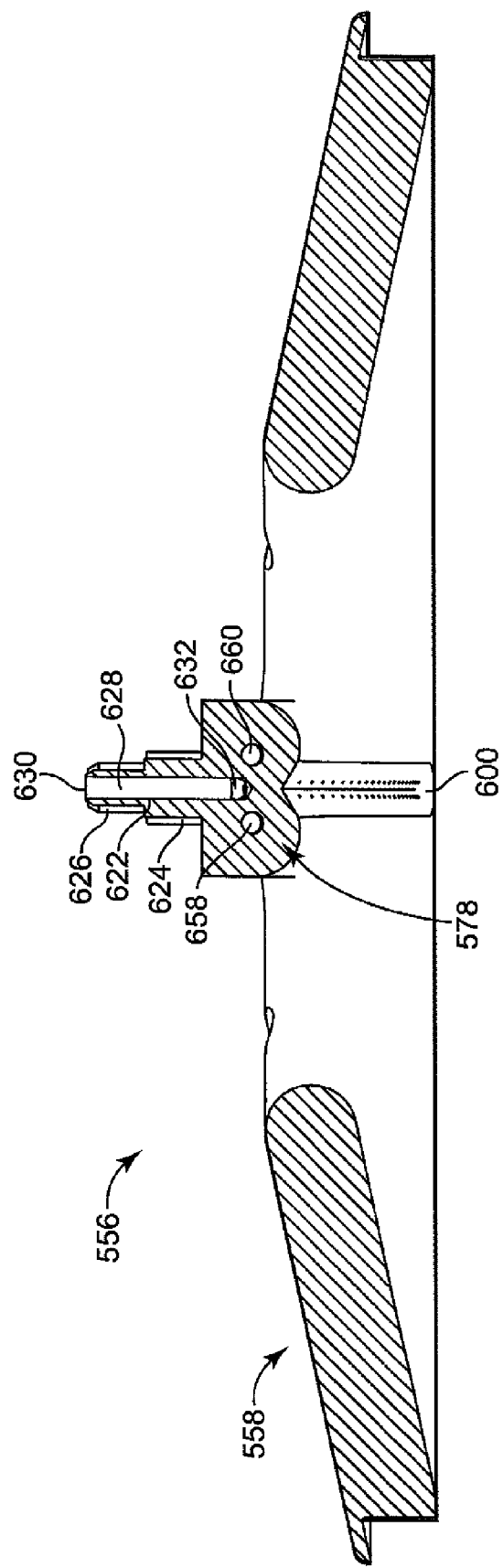
FIG. 26 is a cross-sectional view of the spray nozzle barrier structure of FIG. 24 taken along line J-J.
Figure 27:
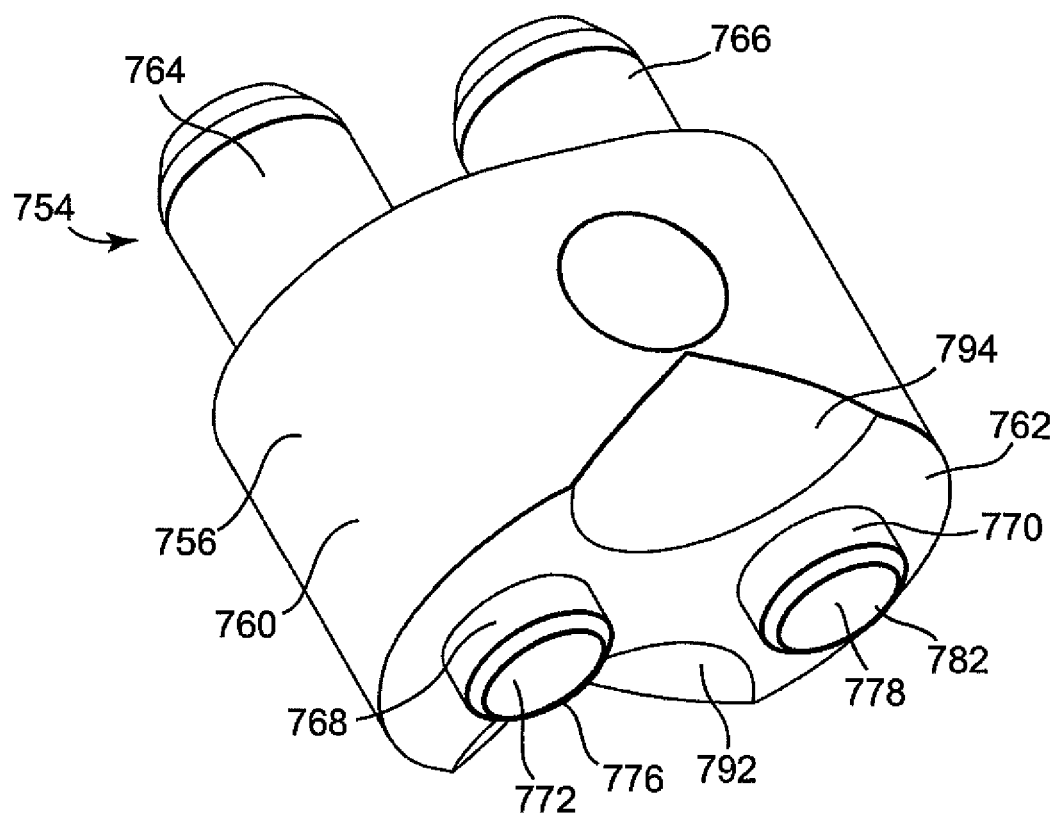
FIG. 27 is an isometric view of the central dispense nozzle member used in the dispense assembly of FIG. 22.
Figure 28:
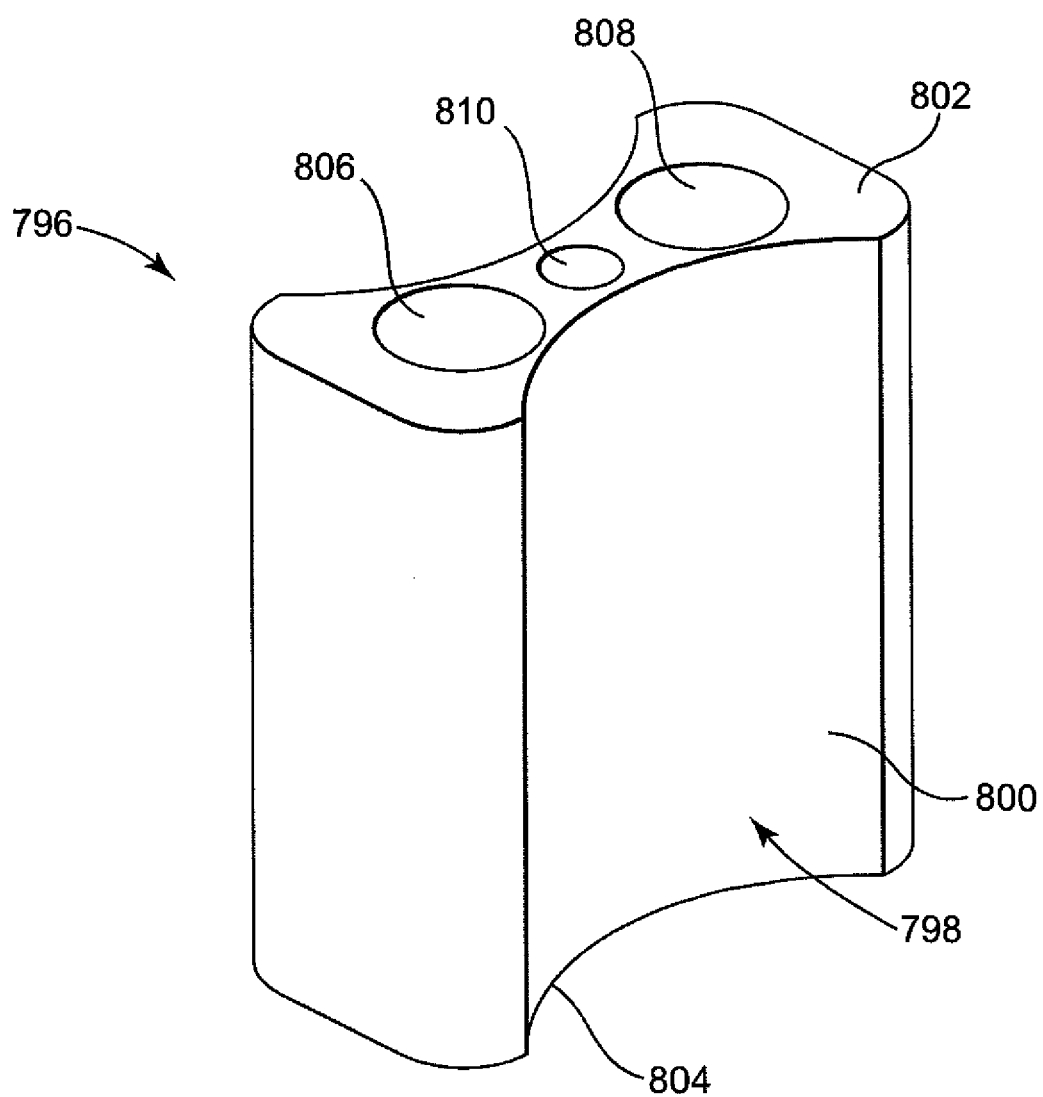
FIG. 28 is an isometric view of the retainer/spacer clamp used in the dispense assembly of FIG. 22.
Figure 29:
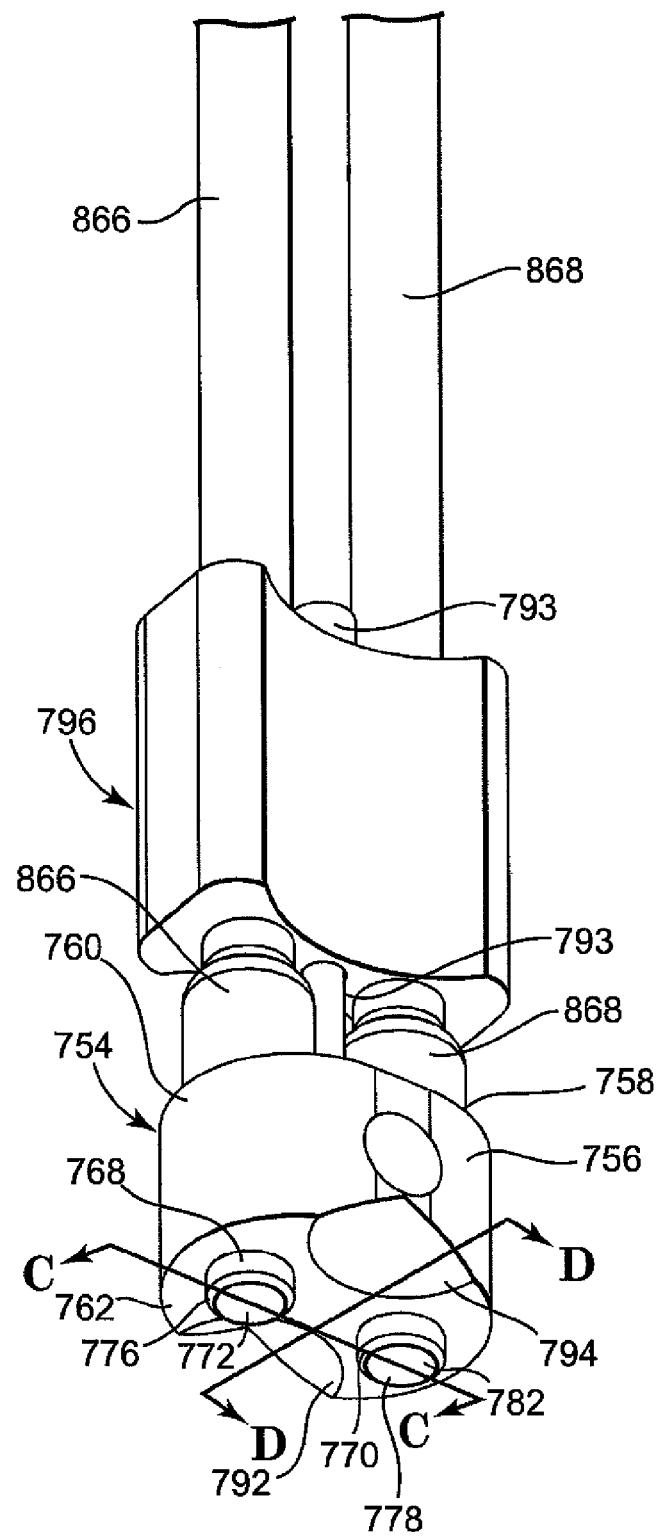
FIG. 29 is an isometric view of a portion of the dispense assembly of FIG. 22 including the central dispense nozzle and retainer/spacer clamp subassembly.
Figure 30:
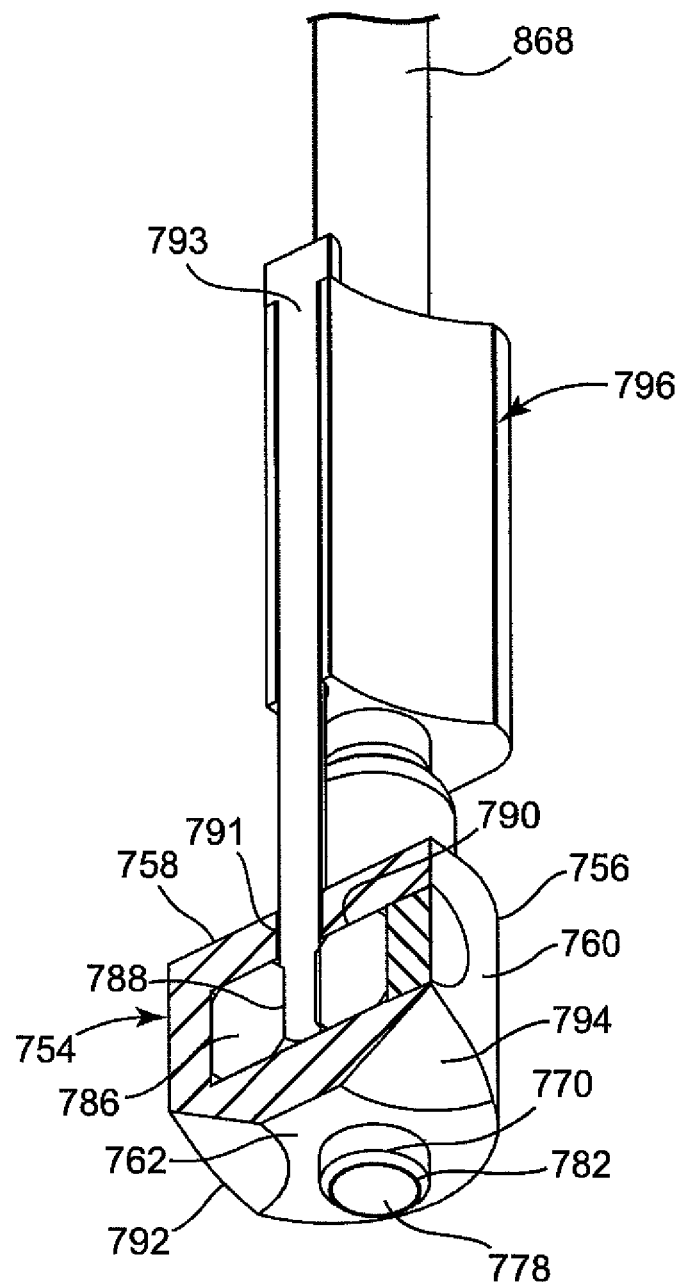
FIG. 30 is a cross-sectional, isometric view of the subassembly of FIG. 29 taken along line D-D.
Figure 31:
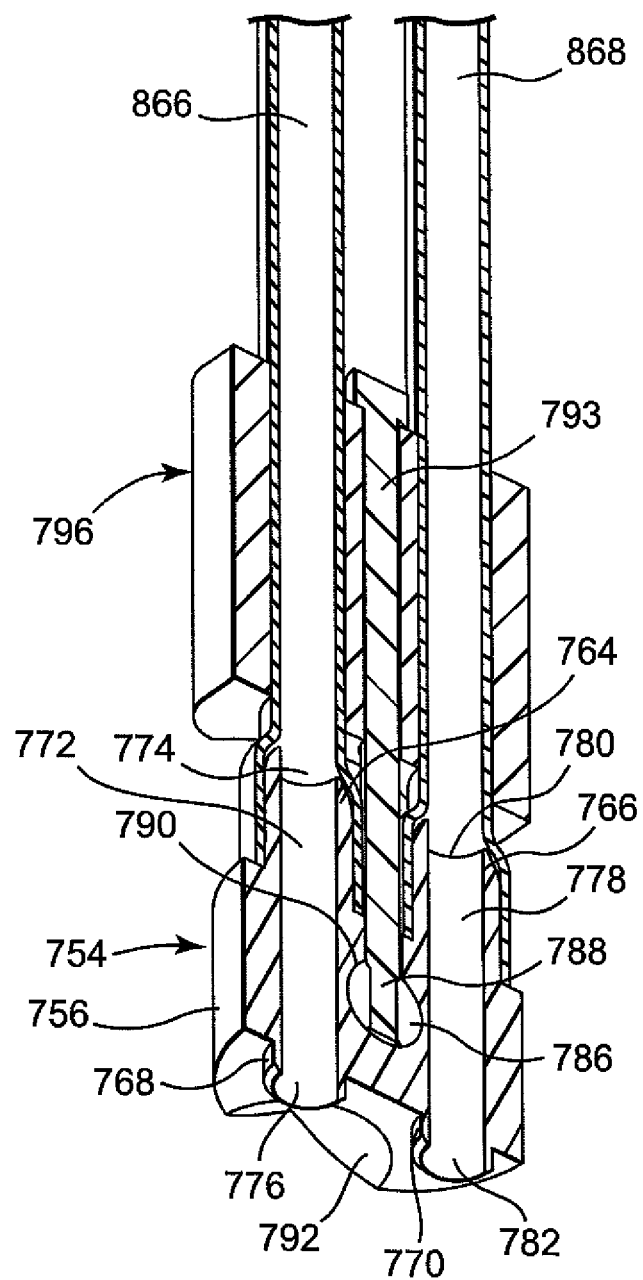
FIG. 31 is a cross-sectional, isometric view of the subassembly of FIG. 29 taken along line C-C.
Figure 32:
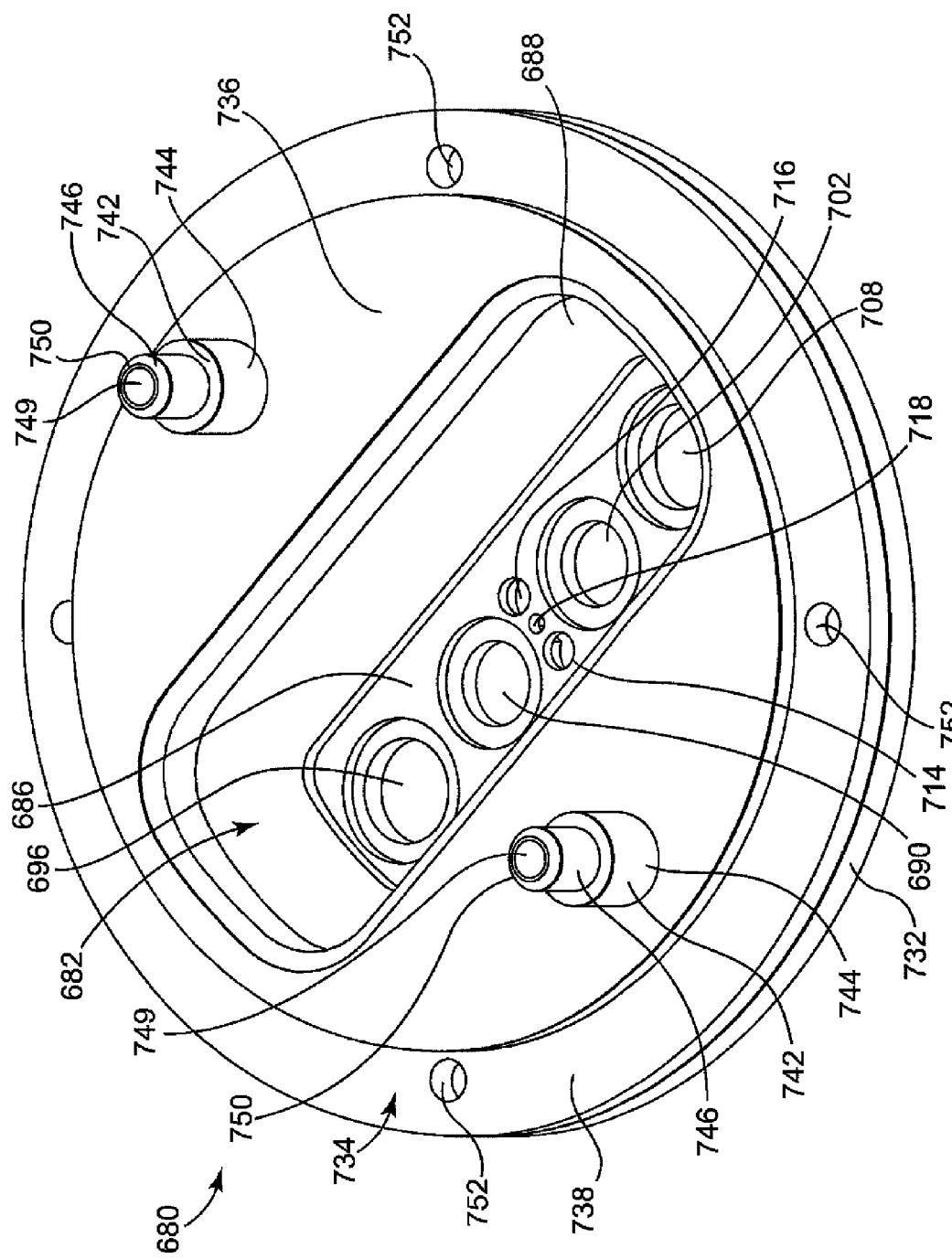
FIG. 32 is an isometric view of the showerhead dispense assembly used in the dispense assembly of FIG. 22, looking generally at the top side of the assembly.
Figure 33:
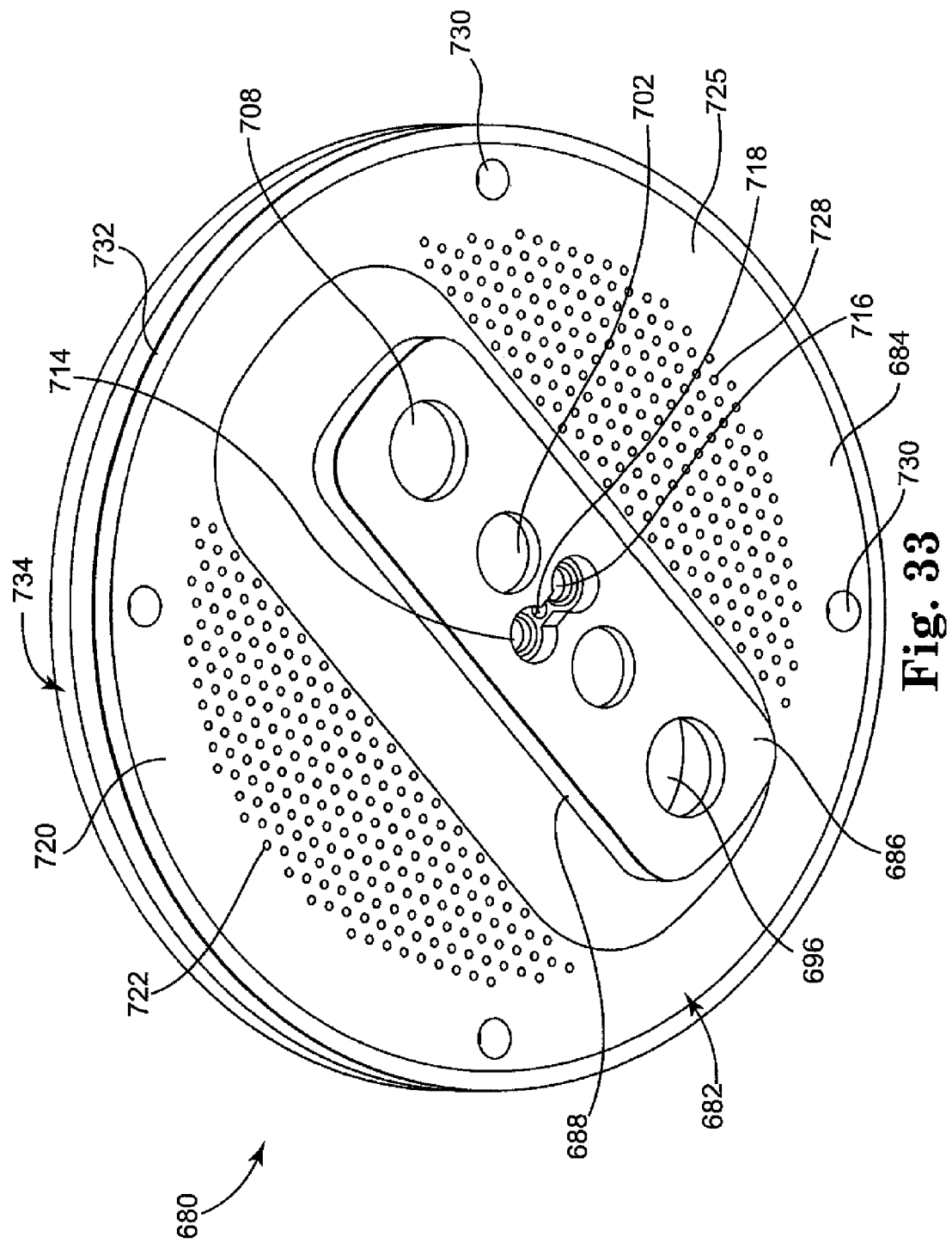
FIG. 33 is an isometric view of the showerhead dispense assembly of FIG. 22 looking generally at the bottom side of the assembly.
Figure 34:
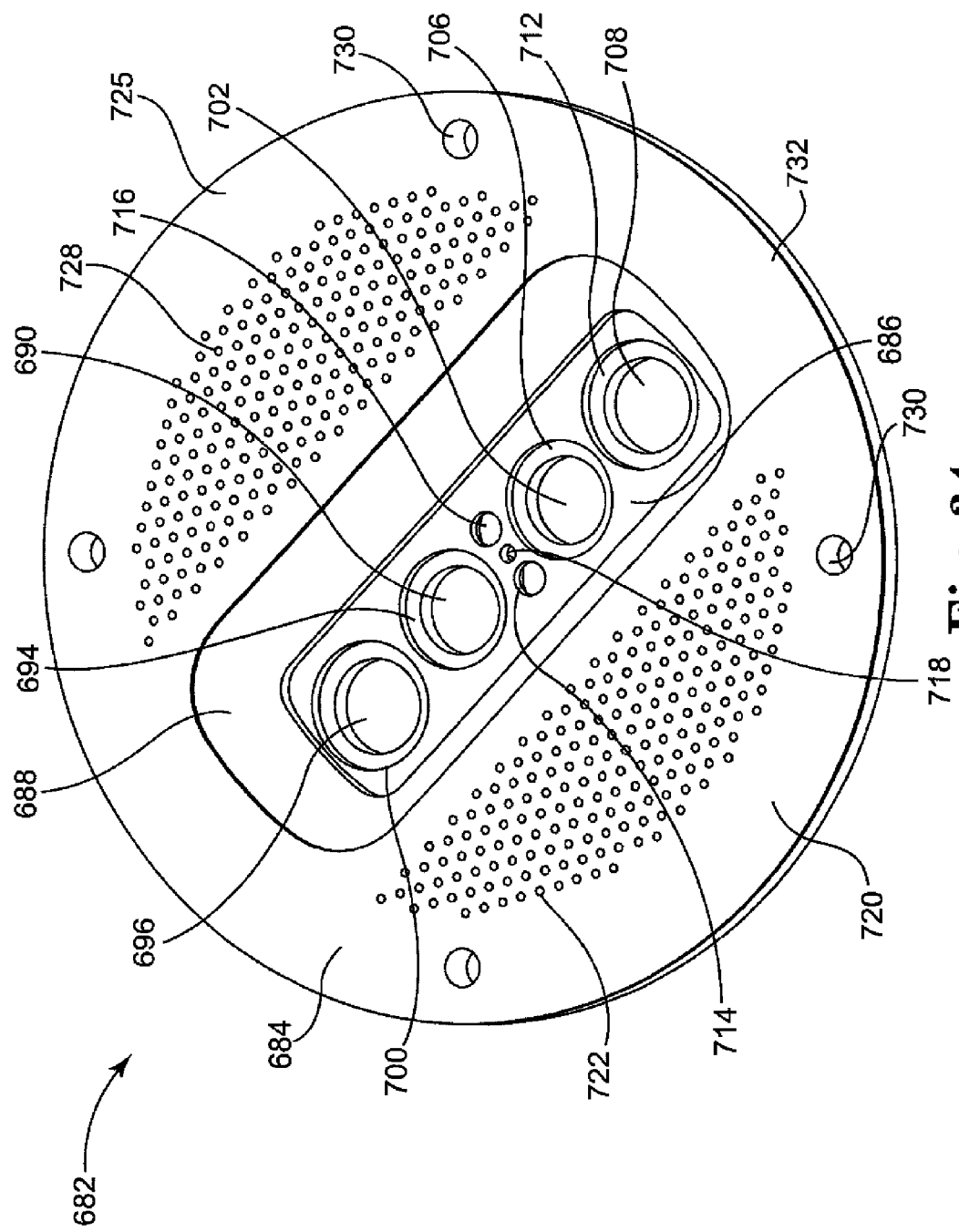
FIG. 34 is an isometric view of the base used in the showerhead dispense assembly of FIG. 32.
Figure 35:
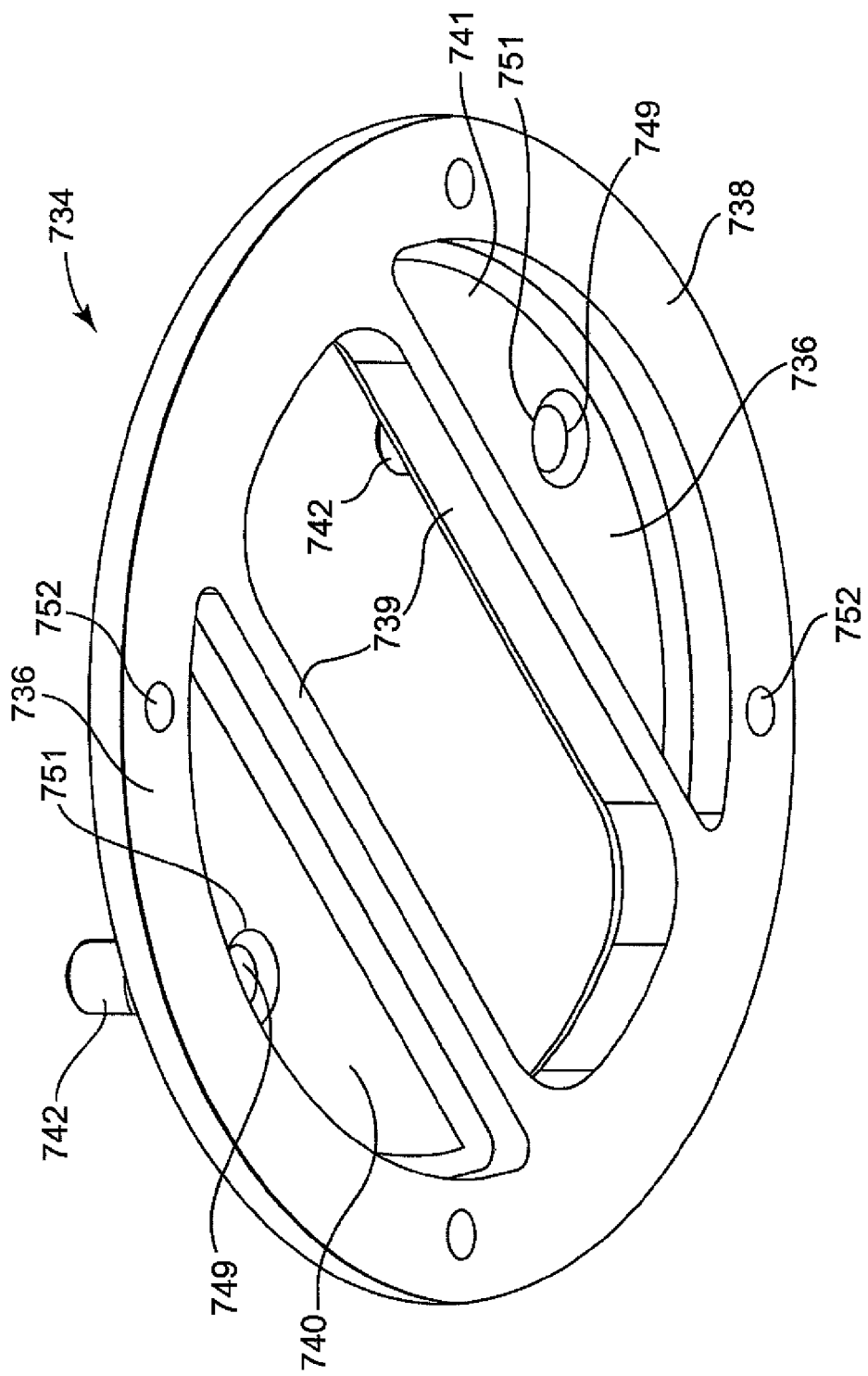
FIG. 35 is an isometric view of the cover used in the showerhead dispense assembly of FIG. 32.
Figure 36:
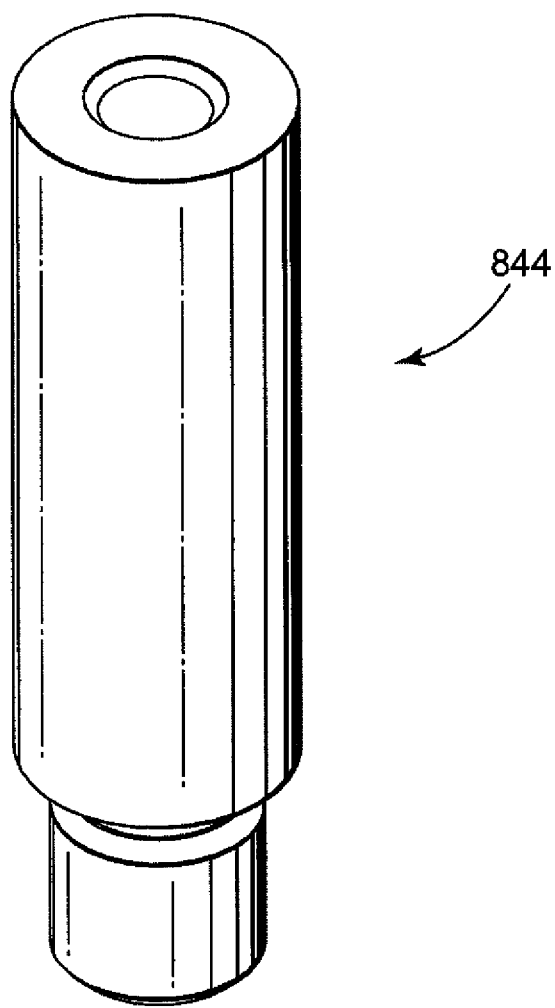
FIG. 36 is an isometric view of a mounting standoff used in the dispense assembly of FIG. 22.
Figure 37:
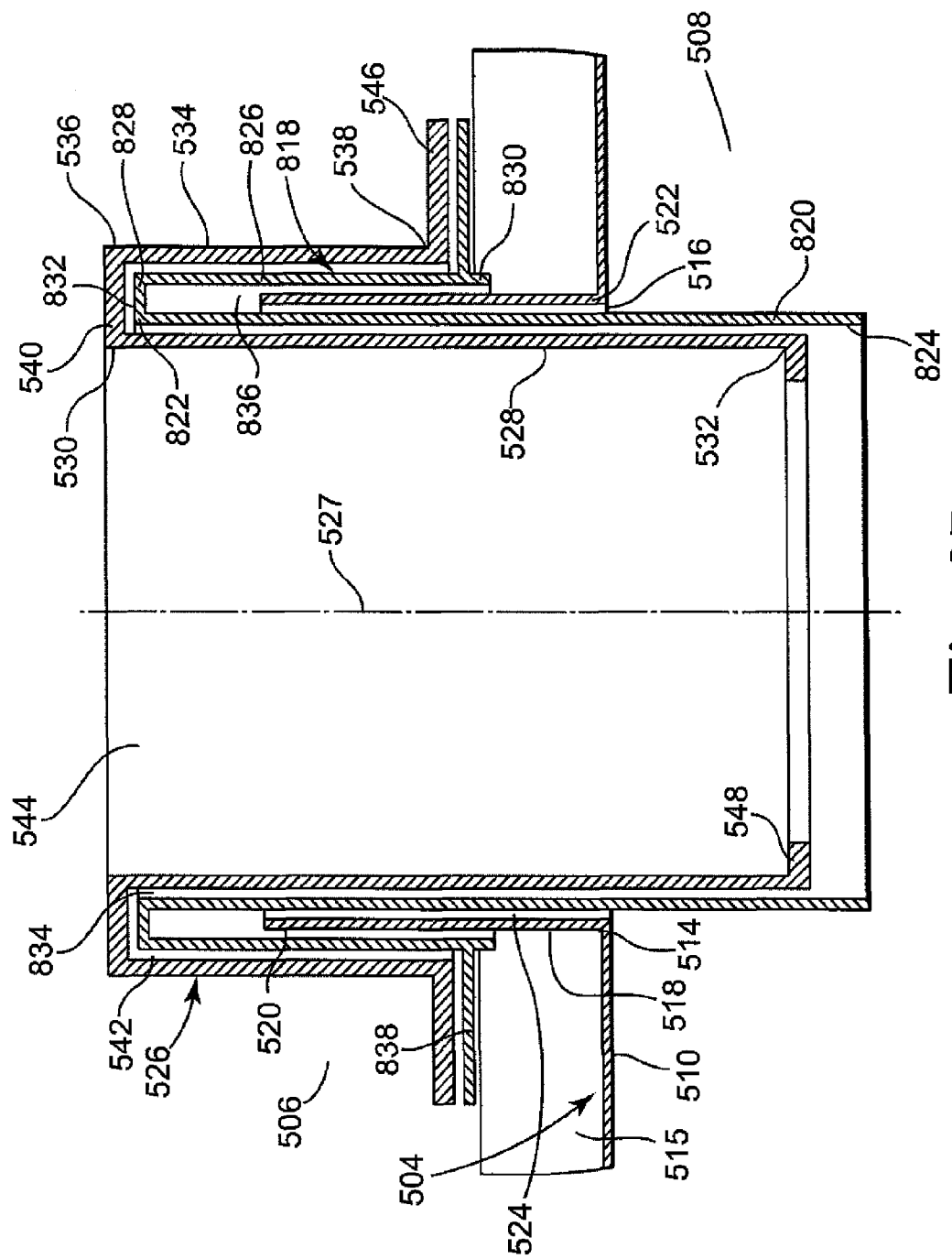
FIG. 37 is a cross-sectional view of a portion of the tool of FIG. 1 taken along line A-A showing the nesting relationship among the moveable support member, the shutter, and the ceiling plate.

FIGS. 6 and 7 show an alternative exhaust configuration of tool 10 in which duct pathways 330, 338, and 346 are all closed and workpiece 12 may be loaded into and/or taken from processing chamber 503. In this configuration, inner baffle member 174, middle baffle member 218, and outer baffle member 262 are lowered and nested so that plates 176, 220, and 264 are close enough to choke off flow into the inner, middle, and outer duct pathways 330, 338, and 346. At the same time, cap plate 196 seats against and closes exhaust inlet 35 into inner exhaust plenum 29, cap plate 240 seats against and closes exhaust inlet 40 into middle exhaust plenum 30, and cap plate 284 seats against and closes exhaust inlet 45 into outer exhaust plenum 31. Optionally, barrier plate 556 may be raised to ease access to and from processing chamber 503.

The figures show an illustrative embodiment of one kind of preferred barrier/dispense section 500 useful in dispensing one or more processing materials in the course of processing one or more microelectronic workpieces. The dispense mechanism may be coupled to one or more supplies (not shown) of treatment materials provided via supply lines (not shown). These materials can be dispensed as supplied or blended on demand. A wide variety of treatment materials may be used, as tool 10 is quite flexible in the types of treatments that may be carried out. Just a small sampling of representative treatment materials include gases and liquids such as nitrogen, carbon dioxide, clean dry air, argon, HF gas, aqueous HF, aqueous isopropyl alcohol, deionized water, aqueous ammonia, aqueous sulfuric acid, aqueous nitric acid, hydrogen peroxide, ozone gas, aqueous ozone, organic acids and solvents, combinations of these and the like. Additional representative examples of processes and chemistries suitably practiced in tool 10 include those described in application Ser. No. 11/096,935 entitled APPARATUS AND METHOD FOR SPIN DRYING A MICROELECTRONIC SUBSTRATE, naming Tracy Gast as one of the inventors, the disclosure of which is fully incorporated herein by reference.

Barrier/dispense section 500 includes as major components ceiling plate 504, moveable support member 526, dispense assembly 554, and optional but preferred shutter 818. Electric, pneumatic, or other suitable actuators (not shown) can be utilized to effect the desired motion of these components. Ceiling plate 504 forms a barrier that helps to define a first zone 506 above ceiling plate 504 and a second zone 508 below ceiling plate 504. Second zone 508 generally includes headspace 502, which is generally the volume of second zone 508 above annular body 558, and processing chamber 503, which is generally the volume of second zone 508 below annular body 558. The dimensions of headspace 502 and processing chamber 503 correspondingly change with movement of dispense assembly 554 in z-axis 527.

Ceiling plate 504 includes panel 510 having an outer periphery 512 and an inner periphery 514 defining a generally central through aperture 516. This aperture 516 may have any desired shape, but preferably is circular as shown. Outer wall 515 extends upward from panel 510 to essentially form a wall around panel 510. Wall 515 enhances the rigidity of ceiling plate 504, helps to capture leaks from dispensing components, and provides convenient surfaces by which to mount ceiling plate 504 to its framework/housing. Cylindrical center wall 518 extends upward from panel 510 and has top rim 520 and base 522. Base 522 is attached to panel 510 proximal to aperture 516. Thus, cylindrical wall 518 provides a pathway 524 extending from top rim 520 to base 522 that provides egress between first zone 506 and second zone 508. As described further below, this pathway 524 also helps to house a portion of shutter 818 as well as a portion of the moveable support member 526 which is used to raise and lower the dispense assembly 554 to desired positions. In the preferred embodiment shown, moveable support member 526 and shutter 818 are co-axially nested within this pathway 524.

Moveable support member 526 includes inner wall 528 having top rim 530 and bottom rim 532. Outer wall 534 is generally concentric with inner wall 528 and extends from top rim 536 to bottom rim 538. Annular plate 540 couples top rim 530 of inner wall 528 to top rim 536 of outer wall 534, thus forming an annular chamber 542 between walls 528 and 534. Outer annular flange 546 extends outward from generally the bottom rim of outer wall 534, and inner annular flange 548 extends inward generally from bottom rim 532 of inner wall 528. The annular flanges 546 and 548 help to stiffen moveable support member 526. Annular flange 548 also provides a convenient surface for mounting dispense assembly 554 to the lower end of moveable support member 526 via mounting holes 549. Actuating mechanisms (not shown) that cause moveable support member 526 to move through a range of motion in the z-axis 527 may be conveniently coupled to outer annular flange 546.

Inner wall 528 of moveable support member 526 helps to define a conduit 544 that is open from rim 530 to bottom rim 532. This conduit 544 provides a convenient, protected pathway for leading plumbing and other componentry from first zone 506 to the dispense assembly 554 mounted at the lower end of moveable support member 526.

Moveable support member 526 is moveable in a z-axis 527 relative to the workpiece 12. Because dispense assembly 554 is mounted to the lower end of moveable support member 526, movement of moveable support member 526 along the z-axis 527 raises and lowers dispense assembly 554 relative to workpiece 12 as well.

Moveable support member 526 is positioned so that inner wall 528 is housed inside pathway 524. Outer wall 534, on the other hand, is outside of pathway 524 so that wall 518 remains nested inside annular chamber 542. There are small, annular gaps between walls 518, 528, and 534 so that these walls do not touch during z-axis movement of moveable support member 526. These gaps reduce the risk of contamination from debris that might otherwise be generated from contacting surfaces during the course of a treatment. During the course of a treatment, it also may be desirable to maintain the first zone 506 at a slight negative pressure relative to second zone 508. This would help prevent contamination from passing from first zone 506 through the annular gaps between the ceiling plate 504 and the moveable support member 526 down into the processing chamber 503 area of second zone 508. As another feature that helps minimize contamination from first zone 506 from compromising the environment within second zone 508, outer wall 534 of moveable support member 526 also functions in part as a baffle to help block direct access from first zone 506 into the annular gap between inner wall 528 and center wall 518. The manner in which center wall 518 is nested inside annular chambers 542 and 836 also helps to provide a labyrinth seal between center wall 518 and moveable support member 526 and shutter 818 to further protect the integrity of the environment within second zone 508.

Dispense assembly 554 is mounted to the lower end of moveable support member 526 and generally includes one or more independent mechanisms for dispensing treatment materials into the processing chamber 503. For instance, the illustrative embodiment of dispense assembly 554 includes at least one, preferably at least two, and more preferably at least three different kinds of dispensing capabilities. As one capability, these mechanisms include one or more dispensing structures that allow assembly 554 to spray one or more treatment fluids downward toward workpiece 12. In preferred embodiments, this capability is provided by a dispensing structure such as spray nozzle/barrier structure 556 that integrally incorporates independent first and second spray bar functionalities. These independent spraying functionalities allow two independent treatment materials to be sprayed onto workpiece 12 at the same time. Of course, other embodiments may include only a single spray system or three or more spray systems, as desired.

Additionally with respect to this particular embodiment, the generally annular body 558 of the spray nozzle/barrier structure 556 functions in one respect as a lid over processing chamber 503 in order to help provide a protected environment for workpiece treatment. However, the generally annular body 558 preferably does not seal processing chamber 503, but rather comes into close proximity with baffle members 174, 218, and 262 to produce a high restriction to air flow.

When tool 10 is placed into a wafer transfer configuration (described further below), the generally annular body 558 and baffle members 174, 218, and 262 are separated by movement of one or more of these components to allow workpiece 12 to be placed into and taken from processing chamber 503.

In more detail, spray nozzle/barrier structure 556 includes an annular body 558 having a lower surface 560, top surface 562, inner periphery 564 defining a generally central aperture 575, and outer periphery 566. The inner periphery 564 is rounded to help promote smooth gas flow through central aperture 575. Annular lip 568 extends generally radially outward from outer periphery 566 preferably in a manner so that lip 568 is generally aligned with top surface 562. Lip 568 and outer periphery 566 form a annular gap 572. Via z-axis movement of moveable support member 526 to which annular body 558 is mounted, annular body 558 may be positioned so that the ends 182, 226, and/or 270 of one or more of baffle members 174, 218 and/or 262 may fit into annular gap 572. Preferably, a small gap is maintained in annular gap 572 to avoid contact between baffles and annular body 558. This helps to prevent flow of materials from headspace 502 into the process chamber 503. Threaded bores 574 facilitate mounting annular body 558, and hence dispense assembly 554, to the inner annular flange 548 of moveable support member 526 using screws 846, or the like, fitted through mounting holes 549.

Preferably, at least lower surface 560 of annular body 558 is canted downward in a radially outward direction relative to workpiece 12 to establish a tapering flow channel 576 between workpiece 12 and annular body 558. The canted surface 560 can have a variety of geometries. For instance, its geometry can be one or more of conical, parabolic, polynomial, or the like. For purposes of illustration, annular body 558 has a hollow, frustroconical geometry that is truncated at inner periphery 564 so as to provide generally central aperture 575. The resultant tapering flow channel helps to promote radial flow outward from center of workpiece 12 while minimizing recirculation zones. The taper also helps to smoothly converge and increase the velocity of flowing fluids approaching the outer edge of the workpiece 12. This helps to reduce liquid splash effects. The angle of lower surface 560 also helps liquid to drain from or drip off of the outer periphery 566 of annular body 558 rather than drain or drip straight down onto the underlying workpiece 12.

Arm structure 578 of spray nozzle/barrier structure 556 extends generally across central aperture 575 and is coupled to inner periphery 564 of annular body 558 at junctures 580 and 582. Arm structure 578 includes first and second sub-arm portions 584 and 586. Arm structure 578 includes aperture 589 for mounting central dispense nozzle member 754. In the preferred embodiment shown, first sub-arm portion 584 is generally aligned with an adjacent portion 590 of annular body 558, while second sub-arm portion 586 is generally aligned with an adjacent portion 592 of annular body 558. In particular, the bottom surfaces 598 and 608 of sub-arms 584 and 586 are aligned with lower surface 560 of annular body 558. Thus, sub-arms 584 and 586 generally meet at an oblique angle. Arm structure 578 subdivides central aperture 575 into first and second aperture portions 594 and 596. These aperture portions 594 and 596 may function as air intake ports with respect to processing chamber 503 during a treatment. The edges of the adjacent arm structure 578 are desirably rounded to promote smooth, uniform flow through these intake ports.

A first generally triangular groove 600 is formed on the underside of spray nozzle/barrier structure 556. This groove 600 spans at least a portion of a first radius of spray nozzle/ barrier structure 556 that extends along portions of first sub-arm portion 584 and the adjacent portion 590 of annular body 558. This groove 600 includes an apex region 602 extending along the length of groove 600 and adjacent faces 604 and 606. In a similar fashion, a second generally triangular groove 610 is formed on the underside of spray nozzle/barrier structure 556. This groove 610 spans at least a portion of a second radius of spray nozzle/barrier structure 556 that extends along portions of second sub-arm portion 586 and the adjacent portion 592 of annular body 558. Like groove 600, this groove 610 includes an apex region (not shown) extending along the length of groove 610 and adjacent faces (not shown).

The grooves 600 and 610 independently include nozzle features that allow separate streams of treatment materials to be dispensed from one or more respective nozzles or nozzle arrays (described further below) incorporated into the grooves. These nozzles generally dispense treatment material(s) downward toward workpiece 12, with the nozzle(s) associated with each groove providing coverage with respect to a respective radius of the workpiece 12 for excellent cleaning efficiency. In the preferred embodiment as shown, the grooves 600 and 610 span first and second radii of spray nozzle/barrier structure 556 and are generally opposed with respect to each other. Thus, together, the two grooves substantially span the full diameter of the workpiece 12.

Spray nozzle/barrier structure 556 includes several features in order to incorporate a first, independent spray bar capability into sub-arm portion 584 and the adjacent portion 590 of annular body 558. These features generally include fluid inlet member 622 having threaded base 624 and flare coupling 626. A supply tube 854 is fluidly coupled to flare coupling 626 and held in place via flare nut 856 that threadably engages threaded base 624. Conduit 628 extends from inlet port 630 to flow channel 632 extending generally radially outward through sub-arm portion 584 and a portion of the adjacent portion 590 of annular body 558. Branch conduits 636 extend from flow channel 632 outward to an array of respective nozzles 638 distributed along apex region 602. Preferably, the array of nozzles 638 is linear, although other array patterns may be used if desired. It is also preferred that the array of nozzles 638 spans at least a portion and more preferably at least substantially all of a radius of the underlying workpiece 12.

In use, material to be dispensed via nozzles 638 is fed through supply tube 854 into inlet port 630. From inlet port 630, the material flows through conduit 628 and then through flow channel 632. From flow channel 632, the material is distributed among the branch conduits 636 leading to nozzles 638, and then is dispensed from the array of nozzles 638.

Sub-arm portion 584 further incorporates fluid inlet member 642 having threaded base 644 and flare coupling 646. A supply tube 850 is fluidly coupled to flare coupling 646 and held in pace via flare nut 852 that threadably engages threaded base 644. An inlet conduit 648 extends from inlet port 650 to bifurcation 652, where the flow channel then splits into conduits 654 and 656. Conduits 654 and 656 extend from bifurcation 652 to respective flow channels 658 and 660. Each of flow channels 658 and 660 extend generally radially outward through sub-arm portion 584 and the adjacent portion 590 of annular body 558. A plurality of branch conduits (not shown) extend from flow channel 658 outward to an array of respective nozzles 664 distributed along face 604 of groove 600, while branch conduits (not shown) extend from flow channel 660 outward to an array of respective nozzles 665 distributed along face 606 of groove 600. Preferably, each of the arrays of nozzles 664 and 665 is linear and parallel to each other as well as to the array of nozzles 638, although other array patterns may be used if desired. It is also preferred that the arrays of nozzles 664 and 665 span at least a portion and more preferably at least substantially all of a radius of the underlying workpiece 12.

Material to be dispensed via nozzles 664 and 665 is fed through supply tube 850 into inlet port 650. From inlet port 650, the material flows through conduit 648. At bifurcation, the flow is distributed between conduits 654 and 656. The respective flows then flow through channels 658 and 660. From flow channels 658 and 660, the respective flows of material are distributed among the branch conduits (not shown) and are then dispensed from the arrays of nozzles 664 and 665.

Conduit 628, flow channel 632, and branch conduits 636 are conveniently formed using any desired boring techniques. For instance, flow channels 632, 658, and 660 may be conveniently formed by boring corresponding holes in a direction from the outer periphery 566 of annular body 558 radially inward. After boring the holes to provide flow channels 632, 658, and 660, plugs 640 may be inserted to seal the ends of the resultant flow channels 632, 658, and 660.

The nozzles 638, 664, and 665 generally dispense fluid streams in a converging fashion so that the dispensed streams atomizingly collide with each other. Liquids, gases, or combinations of these may be dispensed using spray bar system 620. In one representative mode of operation a liquid material is fed through supply tube 850 and consequently dispensed through nozzles 664 and 665, while a gaseous material is fed through supply tube 854 and consequently dispensed through nozzles 638. The respective feeds can be supplied separately or together. When fed together, the dispensed gas stream will help to more energetically atomize the dispensed liquid streams.

The spacing, dispense trajectory with respect to the surface of workpiece 12, orifice size of the nozzles 638, 664, and 665, and the like may be varied to adjust the spray characteristics of the dispensed streams. For instance, to help create a more uniform spray across the radius of workpiece 12, the spacing of the nozzle orifices and nozzle orifice sizes may be varied.

Additional, independent spray bar functionality may also be incorporated into spray nozzle/barrier structure 556. As shown, this additional spray functionality is generally identical to that of the first spray bar functionality already described, except for being integrated into second sub-arm portion 586 and the adjacent portion 592 of annular body and extending along a second radius of spray nozzle/barrier structure 556. The features providing this second spray bar functionality include first fluid inlet member 668 having threaded base 670 and flare coupling 672, and second fluid inlet member 674 having threaded base 676 and flare coupling 678. A supply tube 862 is fluidly coupled to flare coupling 672 and held in place by flare nut 864 that threadably engages threaded base 670. Materials fed through supply tube 862 are dispensed through an array of nozzles (not shown) along an apex of grove 610 that are similar to the array of nozzles 638 along apex 602. These materials are conveyed through conduits (not shown) that are similar to conduit 628, flow channel 632, and branch conduits 636 of first integrated spray bar system 620. Another supply tube 858 is fluidly coupled to flare coupling 678 and held in place by flare nut 860 that threadably engages threaded base 676. Materials fed through supply tube 858 are dispensed through arrays of nozzles (not shown) on faces of groove 610 that are similar to arrays of nozzles 664 and 665 on faces 604 and 606. These materials are conveyed through conduits (not shown) that are similar to inlet conduit 648, bifurcation 652, conduits 654 and 656, flow channels 658 and 660, and branch conduits (not shown) used in first integrated spray bar system 620.

At least the lower surface 560 of annular body 558 may be hydrophilic or hydrophobic, as desired, depending upon the nature of the treatment(s) that might be carried out using tool 10. More preferably, the entirety of spray nozzle/barrier structure 556 may be formed from one or more materials having the desired hydrophobic or hydrophilic character.

In addition to spraying capabilities, dispense assembly 554 further incorporates dispensing capabilities to dispense one or more treatment fluids generally onto the center of the underlying workpiece 12. The treatment fluids may be dispensed serially, simultaneously, in overlapping fashion, and/or the like. In preferred embodiments, this capability is provided by a dispensing structure such as central dispense member 754. For purposes of illustration, central dispense member 754 as shown includes two independent nozzles allowing two different treatment materials to be dispensed onto workpiece 12 at the same time. Of course, other embodiments may include only a single dispensing nozzle or three or more nozzles, as desired.

In more detail, central dispense member 754 generally includes body 756 having top 758, sidewall 760, and bottom 762. First and second flare couplings 764 and 766 project from top 758. First and second rims 768 and 770 project from bottom 762. A first through conduit 772 extends from first inlet port 774 to first outlet port 776, while a second through conduit 778 extends from second inlet port 780 to second outlet port 782.

A pin 786 having a threaded bore 788 is housed in conduit 790 extending across body 756. Pin 786 is inserted into body 756 so that threaded bore 788 is generally aligned with conduit 791. Mounting screw 793 engages threaded bore 788 and is housed within conduit 791 to help mount central dispense member 754 to dispense assembly 554. A pair of reliefs 792 and 794 are formed in body 756 to prevent sprayed treatment fluids from impinging on central dispense member 754.

Supply tubes 866 and 868 are coupled to flare couplings 764 and 766 using retainer/spacer clamp 796. In use, material to be dispensed from central dispense member 754 is fed through one or both of supply tubes 866 and 868 and into one or both of inlet ports 774 and 780, as the case may be. From inlet ports 774 and/or 780, the material flows through conduits 772 and/or 778. From conduits 772 and/or 778, the material is dispensed from the outlet ports 776 and/or 782 which constitute a pair of nozzles, towards the center of workpiece 12. Outlet ports 776 and/or 782 can also be angled to help provide fuller coverage of the treatment fluids on the center of workpiece 12.

In addition to spraying and central dispense capabilities, dispense assembly 554 further incorporates still yet further dispensing capabilities to dispense one or more treatment fluids showerhead-style generally downward toward workpiece 12. This approach is especially useful for dispensing uniform flows of one or more gases and/or vapors into processing chamber 503. In preferred embodiments, this capability is provided by a dispensing structure such as showerhead dispense member 680. For purposes of illustration, showerhead dispense member 680 is fed by two supply feeds, which may be the same or independent, thus allowing two different treatment materials to be dispensed into processing chamber 503 at the same time. Of course, other embodiments may include only a single supply feed or three or more feeds, as desired.

In more detail, showerhead dispense member 680 generally includes base 682 and cover 734. Base 682 includes generally circular floor 684 and recessed subfloor 686. Walls 688 interconnect floor 684 and subfloor 686. Subfloor 686 includes several aperture features that allow plumbing features to be conveniently and compactly led to spray nozzle/barrier structure 556 and central dispense nozzle member 754. In particular, apertures 690, 696, 702, and 708 fit over fluid inlet members 622, 642, 668, and 674, respectively. Flare nuts 852, 856, 864, and 860, seat against shoulders 700, 694, 706, and 712, respectively, when mounting supply tubes 850, 854, 862, and 858 to their respective flare couplings 646, 626, 672, and 678. Optionally, a jam nut can be used to seat against shoulders 694, 700, 706 and 712 so flare nut does not have to perform dual functions. Similarly, apertures 714 and 716 provide access for coupling supply tubes 866 and 868 to their respective flare couplings 764 and 766 on central dispense nozzle member 754.

Aperture 718 facilitates mounting of central dispense member 754 within aperture 589 and to the underside of subfloor 686 using retainer/spacer clamp 796 and screw 793. Clamp 796 includes body 798 having sidewall 800, top 802, and bottom 804. First and second conduits 806 and 808 house and help maintain the alignment of supply tubes 866 and 868 that are coupled to central dispense member 754. Conduit 810 houses screw 793 used to clamp central dispense member 754 in position. Body 798 is relieved on opposing sides so that clamp 796 nests between flare nuts 856 and 864.

Floor 684 of base 682 includes first region 720 and second region 725 positioned on opposing sides of subfloor 686. First region 720 includes an array of nozzles 722, while second region 725 includes a second array of nozzles 728.

Cover 734 generally includes raised central panel 736 stiffened by annular rim 738 and beams 739. First and second chambers 740 and 741 are formed between cover 734 and base 682. First chamber 740 is generally between cover 734 and nozzles 722, while second chamber 741 is generally between cover 734 and nozzles 728. As illustrated, first and second chambers 740 and 741 are isolated from each other, but have a common supply source. If desired, independent supply sources may be used. Fluid inlet members 742 project upward from central panel 736. Fluid inlet members 742 include threaded bases 744 and flare couplings 746. Supply tubes 747 are fluidly coupled to flare couplings 746 and held in place via flare nuts 748 that threadably engage threaded bases 744. Conduits 749 extend from inlet ports 750 to outlet ports 751, where conduits 749 open into chambers 740 and 741.

Mounting holes 730 on outer periphery 732 of base 682 and mounting holes 752 on cover 734 facilitate mounting showerhead dispense member 680 to annular body 558 using screws 846. Standoffs 844 help to maintain the desired positioning of showerhead dispense member 680. Showerhead dispense member 680 is mounted to spray nozzle/barrier structure 556 in a manner so that nozzles 722 and 728 generally overlie aperture sub-sections 594 and 596.

In use, one or more treatment fluids, especially one or more flows of gas(es), are supplied to showerhead dispense member 680 via one or both of supply tubes 747. The treatment fluids supplied to each tube 747 may be the same or different. The treatment fluids are introduced into chambers 740 and 741 via conduits 749. The pressure of the treatment fluid(s) within chambers 740 and 741 is generally equalized so that the flow through the nozzles 722 and 728 is uniform. Desirably, the pressure differential of the fluid(s) within chambers 740 and 741 upstream from the showerhead nozzles is desirably less than pressure drop through the nozzles 722 and 728 themselves in accordance with conventional practices to promote such uniform flow. When dispensed through the nozzles 722 and 728, the dispensed fluid(s) generally flow towards workpiece 12 through aperture sub-sections 594 and 596. An exhaust may be pulled through one or more of plenums 29, 30, or 31 to facilitate this flow.

Shutter 818 is independently moveable in the z-axis 527 relative to the workpiece 12 through a range of motion that includes the generally fully open position as shown in FIGS. 3 and 6 and the generally fully closed position shown in FIG. 2. Desirably, shutter 818 can be positioned in intermediate locations between these two extremes in which shutter 818 is partially opened/closed. In FIG. 2 in which shutter 818 is in a closed position, moveable support member 526 is lowered into a treatment position at which baffle members 174, 218, and 262 are positioned within annular gap 572 of annular body 558. This helps to protect the integrity of the environment within process chamber 503. In the meantime, shutter 818 is raised so that its top portion is nested within annular chamber 542 with annular plate 832 being positioned adjacent to annular plate 540. A small gap, though, preferably is maintained between annular plates 832 and 540 to prevent contact that might otherwise generate undesired contamination. With the shutter 818 raised and open in this fashion, one or more gases and/or vapors in headspace 502 are free to be drawn into processing chamber 503 through air intake vents formed by aperture sub-sections 594 and 596. In short, FIG. 2 shows one embodiment of an illustrative configuration of tool 10 useful to carry out treatment(s) with respect to workpiece 12.

In FIG. 6, moveable support member 526 (and hence dispense assembly 554) is raised away from baffle members 174, 218, and 262 to allow workpiece 12 to be transferred to and from its position on supporting chuck 94 via resultant gap 874. In short, FIG. 6 shows one embodiment of an illustrative configuration of tool 10 useful to accomplish workpiece transfer to and from tool 10.

FIG. 2 shows an illustrative configuration of tool 10 in which shutter 818 is in a closed position. The tool configuration of FIG. 2 is similar to that of FIG. 3 except that now shutter 818 is lowered relative to moveable support member 526 so that bottom rim 824 is positioned in close proximity to the top surface 562 of annular body 558. Desirably, a small gap is maintained so that bottom rim 824 does not actually contact top surface 562. In this configuration, shutter 818 helps to choke the air intake into processing chamber 503 from the volume of headspace 502 external to shutter 818, while also helping to contain one or more gases and/or vapors introduced to processing chamber 503 via dispense assembly 554. For instance, the closed shutter 818 facilitates containing a "fog" of IPA-enriched gas/vapor mixture that might be dispensed toward workpiece 12 via showerhead dispense member 680. As another example, the closed shutter 818 also could help to contain fluids used to wash the underside of spray nozzle/barrier structure 556. A suitable negative pressure maintained in headspace 502 relative to processing chamber 503 can help to prevent contamination from entering process chamber 503.

In more detail, shutter 818 includes inner wall 820 having top rim 822 and bottom rim 824. Outer wall 826 is generally concentric with inner wall 820 and extends from top rim 828 to bottom rim 830. Annular plate 832 couples top rim 822 of inner wall 820 to top rim 828 of outer wall 826, thus forming an annular chamber 836 between walls 820 and 826. Outer annular flange 838 extends outward from generally the bottom rim 830 of outer wall 826 to help stiffen shutter 818. Annular flange 838 also provides a convenient surface for mounting actuating structures (not shown) that help to move shutter 818 through a range of motion in a z-axis 527 relative to the surface of workpiece 12.

Inner wall 820 of shutter 818 helps to define a conduit 834 that is open from top rim 822 to bottom rim 824. The inner wall 528 of moveable support member 526 is housed inside this conduit 834. A small annular gap separates inner wall 528 from inner wall 820 so that the parts do not contact each other when one or both are moved in the z-axis 527.

Shutter 818 is positioned so that outer wall 826 is outside of pathway 524 so that wall 518 remains nested inside annular chamber 836. In turn, the top part of shutter 818 is nested inside of annular chamber 542 of moveable support member 526. Preferably, there are small, annular gaps between walls 528, 820, 518, 826, and 534 so that these walls do not touch during z-axis movements of moveable support member 526 as any contact between the wall surfaces could generate contamination.

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims.

What is claimed is:

1. An apparatus for processing a microelectronic workpiece, comprising:
   a) a processing chamber including a workpiece support disposed therein, wherein a workpiece having a workpiece surface can be positioned onto the workpiece support during a process;
   b) a barrier plate structure that overlies and covers the workpiece during a process, wherein the barrier plate structure is positioned apart from the workpiece surface such that a process space is present between the barrier plate structure and the workpiece surface and wherein the barrier structure comprises:
      i) at least first and second linear arrays of nozzles integrated within the barrier plate structure in a manner effective to dispense one or more processing materials; and
      ii) one or more processing material supply conduits in the barrier plate structure through which one or more processing materials are supplied to the first and second linear arrays of nozzles; and
   c) one or more sources of pressurized processing materials in fluid communication with the one or more processing material supply conduits,
wherein each nozzle of the first and second linear arrays comprises a nozzle channel and a nozzle outlet integrated within the barrier plate structure and more than one nozzle from the first linear array is configured and directionally positioned in an angled manner relative to a corresponding nozzle from the second linear array so that when a first stream of pressurized processing material is dispensed from the more than one nozzle from the first linear array the first stream of pressurized processing material is directed to intersect in the process space between the barrier plate structure and the workpiece surface and atomizingly collide externally from the barrier plate structure with a second stream of pressurized processing material dispensed from the corresponding nozzle from the second linear array so that the atomized processing material(s) flow downward onto the workpiece surface.

2. The apparatus of claim 1, wherein at least one of the linear arrays of nozzles is fluidly coupled to a common supply of one or more treatment fluids.

3. The apparatus of claim 1, wherein the one or more processing materials are dispensed through the first and second linear arrays and across at least a portion of a radius of the workpiece, and wherein the apparatus further comprises an additional nozzle through which one or more processing materials are dispensed generally onto a center region of the workpiece.

4. An apparatus for processing a microelectronic workpiece, comprising:
   a) a processing chamber including a workpiece support disposed therein, wherein a workpiece having a workpiece surface can be positioned onto the workpiece support during a process;
   b) a barrier plate structure that overlies and covers the workpiece during a process, wherein the barrier plate structure is positioned apart from the workpiece surface such that a process space is present between the barrier plate structure and the workpiece surface and wherein the barrier structure comprises:
      i) at least first and second linear arrays of nozzles integrated within the barrier plate structure in a manner effective to dispense one or more processing materials; and
      ii) one or more processing material supply conduits in the barrier plate structure through which one or more processing materials are supplied to the at least first and second linear arrays of nozzles; and
   c) one or more sources of processing materials in fluid communication with the one or more processing material supply conduits,
wherein each nozzle of the first and second linear arrays comprises a nozzle channel and a nozzle outlet integrated within the barrier plate structure and more than one nozzle from the first linear array is directionally positioned in an angled manner relative to a corresponding nozzle from the second linear array so that a centerline axis of the nozzle channel and nozzle outlet of the more than one nozzle from the first linear array, intersects above the workpiece and in the process space between the barrier plate structure and the workpiece surface with a centerline axis of the nozzle channel and nozzle outlet of the corresponding nozzle from the second linear array.

5. The apparatus of claim 4, wherein the barrier plate structure has a lower surface and the lower surface and the surface of the workpiece define a flow channel between the lower surface of the barrier plate structure and the surface of the workpiece, wherein the flow channel radially converges from a central portion of the workpiece toward an outer periphery of the workpiece so that fluid flows in a radially outward direction relative to the inside surface of the barrier plate structure and the workpiece.

6. The apparatus of claim 4, wherein the barrier plate structure has a lower surface and further comprises a groove on the lower surface that extends along a radius of the underlying workpiece.

7. The apparatus of claim 6, wherein the first and second linear arrays of nozzles are located within the groove.

8. The apparatus of claim 7, wherein the lower surface of the barrier plate structure further comprises a second groove on the lower surface that extends along a radius of the underlying workpiece.

9. The apparatus of claim 8, further comprising a first linear array of nozzles and second linear array of nozzles located within the second groove.

10. The apparatus of claim 4, wherein the barrier plate structure is controllably moveable through a range of motion including a first position in which the processing chamber is sufficiently open to allow workpiece transfer to and from the processing chamber and a second position in which the bather plate structure helps to guide at least one material flowing over said workpiece surface.

11. The apparatus of claim 4, wherein the barrier plate structure is moveable relative to the workpiece.

12. The apparatus of claim 4, wherein the barrier plate structure is moveable in a z-axis relative to the workpiece.

13. The apparatus of claim 4, wherein the barrier plate structure comprises at least one pathway providing egress through the barrier plate structure from a volume above the barrier plate structure to a volume below the barrier plate structure.

14. The apparatus of claim 13, wherein the pathway generally overlies the workpiece.

15. The apparatus of claim 4, further comprising at least one material dispensing nozzle positioned in a manner such that at least one processing material that is caused to contact the workpiece is supplied to the at least one material dispensing nozzle through a conduit of a moveable support to which the at least one material dispensing nozzle is directly or indirectly mounted.

16. The apparatus of claim 15, wherein the at least one material dispensing nozzle is positioned in a manner such that one or more processing materials are dispensed generally onto a center of the workpiece.

17. The apparatus of claim 4, wherein the barrier plate structure is moveable in a range of motion such that the barrier plate structure can be controllably positioned to help guide fluid flow into one or more duct pathways proximal to an outer periphery of the workpiece.

* * * * *

UNITED STATES PATENT AND TRADEMARK OFFICE
CERTIFICATE OF CORRECTION

Page 1 of 1

PATENT NO. : 8,899,248 B2
APPLICATION NO. : 13/219220
DATED : December 2, 2014
INVENTOR(S) : Jimmy D. Collins et al.

It is certified that error appears in the above-identified patent and that said Letters Patent is hereby corrected as shown below:

On the title page, item 73
Assignee: "Tel FSI, Inc., Chaska, MI (US)" should be -- Tel FSI, Inc., Chaska, MN (US) --

In the specification

Column 1
Line 46 "that that can be" should be -- that can be --

Column 10
Line 29 "at, least" should be -- at least --

In the claims

Column 23
Line 35 "array, intersects" should be -- array intersects --

Signed and Sealed this
First Day of December, 2015

Michelle K. Lee
*Director of the United States Patent and Trademark Office*